United States Patent
Piao et al.

(10) Patent No.: US 11,743,467 B2
(45) Date of Patent: Aug. 29, 2023

(54) METHOD AND DEVICE FOR ENTROPY ENCODING COEFFICIENT LEVEL, AND METHOD AND DEVICE FOR ENTROPY DECODING COEFFICIENT LEVEL

(71) Applicant: SAMSUNG ELECTRONICS CO., LTD., Suwon-si (KR)

(72) Inventors: Yinji Piao, Suwon-si (KR); Gahyun Ryu, Suwon-si (KR); Minsoo Park, Suwon-si (KR); Minwoo Park, Suwon-si (KR); Seungsoo Jeong, Suwon-si (KR); Kiho Choi, Suwon-si (KR); Narae Choi, Suwon-si (KR); Woongil Choi, Suwon-si (KR); Anish Tamse, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/293,351

(22) PCT Filed: Nov. 12, 2019

(86) PCT No.: PCT/KR2019/015308
§ 371 (c)(1),
(2) Date: May 12, 2021

(87) PCT Pub. No.: WO2020/101313
PCT Pub. Date: May 22, 2020

(65) Prior Publication Data
US 2022/0014748 A1  Jan. 13, 2022

Related U.S. Application Data

(60) Provisional application No. 62/783,818, filed on Dec. 21, 2018, provisional application No. 62/759,927, filed on Nov. 12, 2018.

(51) Int. Cl.
*H04N 19/13* (2014.01)
*H04N 19/18* (2014.01)
(Continued)

(52) U.S. Cl.
CPC ............. *H04N 19/13* (2014.11); *H04N 19/18* (2014.11); *H04N 19/70* (2014.11); *H04N 19/91* (2014.11); *H03M 7/4075* (2013.01)

(58) Field of Classification Search
CPC ........ H04N 19/13; H04N 19/18; H04N 19/70; H04N 19/91; H04N 19/184; H04N 19/423
See application file for complete search history.

(56) References Cited

U.S. PATENT DOCUMENTS 10,306,230 B2   5/2019   Kim et al.
10,616,604 B2   4/2020   Zhang et al.
(Continued)

FOREIGN PATENT DOCUMENTS

CN   104365099 A   2/2015
CN   104471934 A   3/2015
(Continued)

OTHER PUBLICATIONS

Communication dated Jun. 8, 2021, issued by the Korean Intellectual Property Office in Korean Application No. 10-2021-7012073.
(Continued)

*Primary Examiner* — Joseph Suh
(74) *Attorney, Agent, or Firm* — Sughrue Mion, PLLC

(57) ABSTRACT

Provided is a method of decoding coefficients included in image data, the method including determining a Rice parameter for a current coefficient, based on a base level of the current coefficient; parsing coefficient level information indicating a size of the current coefficient from a bitstream by using the determined Rice parameter; and identifying the
(Continued)

size of the current coefficient by de-binarizing the coefficient level information by using the determined Rice parameter.

2 Claims, 29 Drawing Sheets

(51) Int. Cl.
  *H04N 19/70* (2014.01)
  *H04N 19/91* (2014.01)
  *H03M 7/40* (2006.01)

(56) References Cited

U.S. PATENT DOCUMENTS

| | | | |
|---|---|---|---|
| 2013/0272414 A1* | 10/2013 | Sole Rojals | H04N 19/18 375/240.16 |
| 2013/0301738 A1* | 11/2013 | Kim | H04N 19/156 375/240.18 |
| 2014/0003529 A1* | 1/2014 | Joshi | H04N 19/13 375/240.18 |
| 2014/0307800 A1 | 10/2014 | Sole Rojals et al. | |
| 2015/0016537 A1* | 1/2015 | Karczewicz | H04N 19/91 375/240.18 |
| 2015/0030081 A1 | 1/2015 | Kim et al. | |
| 2015/0063443 A1 | 3/2015 | Matsumura | |
| 2015/0117520 A1* | 4/2015 | Zhou | H04N 19/18 375/240.03 |
| 2015/0117546 A1 | 4/2015 | Kim | |
| 2016/0353113 A1 | 12/2016 | Zhang et al. | |
| 2017/0064336 A1* | 3/2017 | Zhang | H04N 19/70 |
| 2017/0142448 A1 | 5/2017 | Karczewicz et al. | |
| 2021/0120271 A1 | 4/2021 | Nguyen et al. | |
| 2022/0086488 A1 | 3/2022 | Hu et al. | |

FOREIGN PATENT DOCUMENTS

| | | |
|---|---|---|
| CN | 107302368 A | 10/2017 |
| CN | 107925764 A | 4/2018 |
| CN | 108419084 A | 8/2018 |
| JP | 2018-529273 A | 10/2018 |
| KR | 10-2015-0139888 A | 12/2015 |
| KR | 10-2016-0032119 A | 3/2016 |
| WO | 2013/107908 A1 | 7/2013 |

OTHER PUBLICATIONS

Decision to Refuse dated Aug. 23, 2021, issued by the Korean Intellectual Property Office in Korean Application No. 10-2021-7012073.
Communication dated Feb. 19, 2020, issued by the International Searching Authority in counterpart International Application No. PCT/KR2019/015308 (PCT/ISA/220, 210, 237).
Schwarz et al., "CE7: Transform coefficient coding with reduced number of regular-coded bins (tests 7.1.3a, 7.1.3b)," Joint Video Experts Team (JVET) of ITU-T SG 16 WP 3 and ISO/IEC JTC 1/SC 29/WG 11, JVET-L0274v3, Oct. 2018, Total 19 pages.
Chuang et al., "CE7-related: Constraints on context-coded bins for coefficient coding," Joint Video Experts Team (JVET) of ITU-T SG 16 WP 3 and ISO/IEC JTC 1/SC 29/WG 11, JVET-L0145-v4, Oct. 2018, Total 19 pages.
Communication dated Apr. 26, 2022, issued by the National Intellectual Property Administration, PRC in counterpart Chinese Application No. 201980074187.0.
Memom, N., "Adaptive coding of DCT coefficients by Golomb-Rice codes", 1998, IEEE Comput. Soc., vol. 1, 5 pages total, XP10308805A.
Akula et al., "Description of SDR, HDR and 360 video coding technology proposal considering mobile application scenario by Samsung, Huawei, GoPro, and HiSilicon", 2018, buJoint Video Exploration Team (JVET) of ITU-T SG 16 WP 3 and ISO/IEC JTC 1/SC 29/WG 11, Document JVET-J0024_v2, 119 pages total XP30151190A.
Communication dated Sep. 9, 2022 by the National Intellectual Property Administration of the People's Republic of China for Chinese Patent Application No. 201980074187.0.
Communication dated Aug. 16, 2022 by the National Intellectual Property Administration of the People's Republic of China for Chinese Patent Application No. 202210133503.0.
Communication dated Sep. 27, 2022 by the European Patent Office for European Patent Application No. 19883971.4.

\* cited by examiner

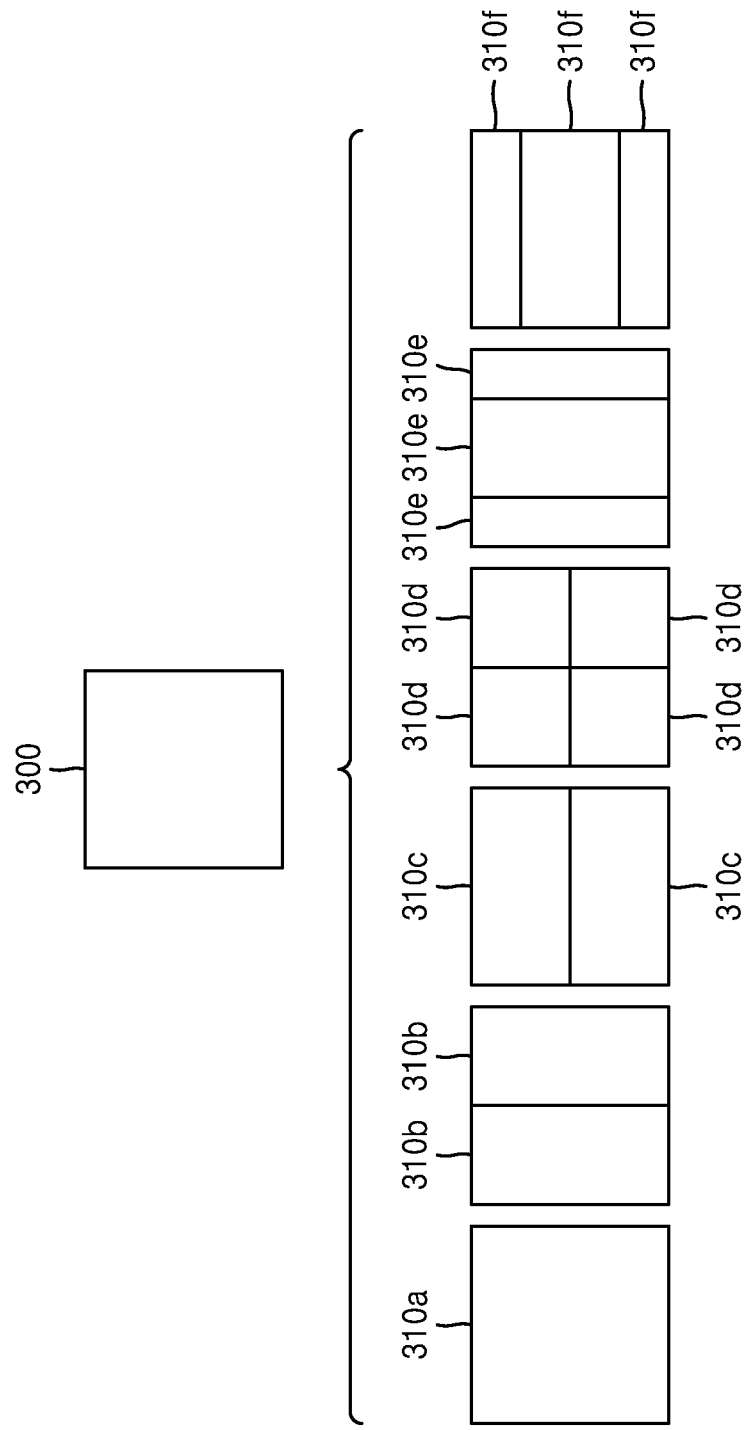

FIG. 4
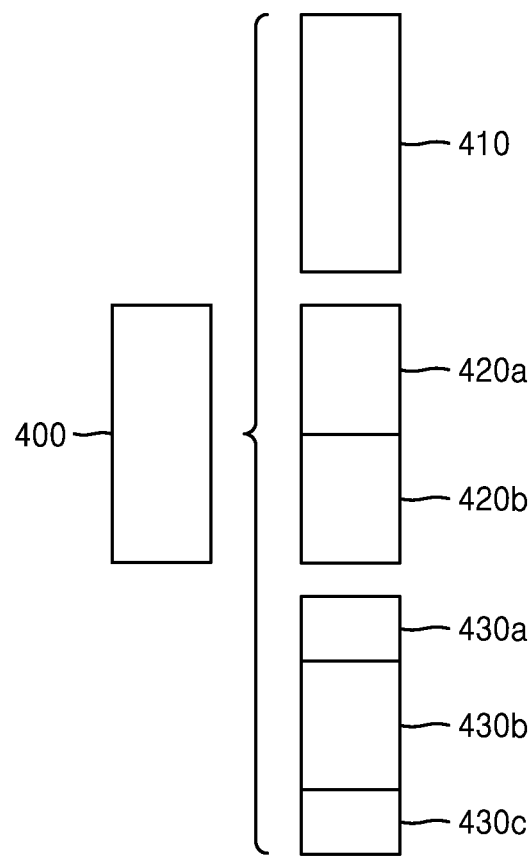
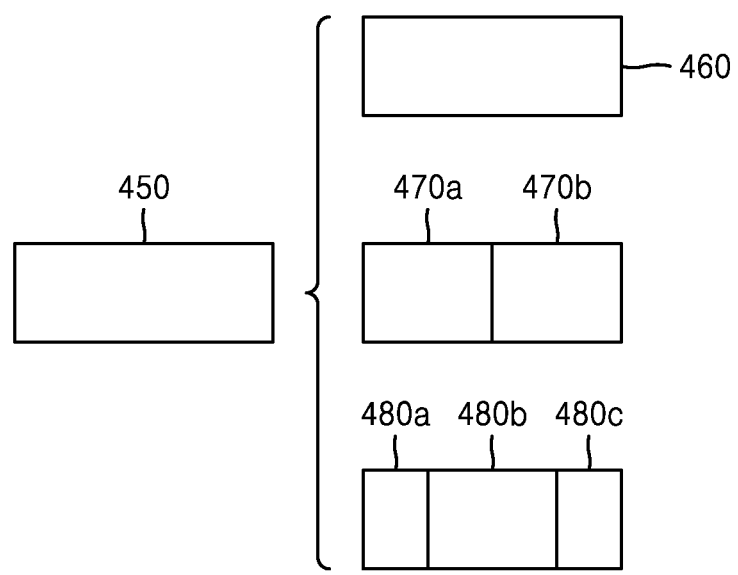

FIG. 13

| BLOCK SHAPE / DEPTH | 0: SQUARE | 1: NS_VER | 2: NS_HOR |
|---|---|---|---|
| DEPTH D | 1300 | 1310 | 1320 |
| DEPTH D+1 | 1302 | 1312 | 1322 |
| DEPTH D+2 | 1304 | 1314 | 1324 |
| ... | ... | ... | ... |

FIG. 20

2000 abs_level

| 11 | 8 | 7 | 5 |
|---|---|---|---|
| 11 | 7 | 6 | 4 |
| 8 | 1 | 15 | 0 |
| 6 | 2 | 3 | 0 |

2010 sig_flag

| 1 | 1 | 1 | 1 |
|---|---|---|---|
| 1 | 1 | 1 | 1 |
| 1 | 1 | 1 | 0 |
| 1 | 1 | 1 | 0 |

2020 gt1_flag

| 1 | 1 | 1 | 1 |
|---|---|---|---|
| 1 | 1 | 1 | 1 |
| 1 | 0 | 1 |   |
| 1 | 1 | 1 |   |

2030 par_flag

| 1 | 0 | 1 | 1 |
|---|---|---|---|
| 1 | 1 | 0 | 0 |
| 0 |   | 0 |   |
| 0 | 0 | 1 |   |

2040 gt3_flag

| 1 | 1 | 1 | 1 |
|---|---|---|---|
| 1 | 1 | 1 | 1 |
|   | 1 |   | 1 |
| 1 | 0 | 0 |   |

2050 abs_remainer

| 3 | 2 | 1 | 1 |
|---|---|---|---|
| 3 | 1 | 1 | 1 |
| 2 |   | 5 |   |
| 1 |   |   |   |

```
for( k ··· )          {                           1st pass
  sig_flag[ k ]
  if( sig_flag[ k ] ) {
    gt1_flag[k]
    if( gt1_flag[ k ] )
      par_flag[ k ]
}}
```
— 2210

```
for( k ··· )          {                           2nd pass
  if( gt1_flag[ k ] )
    gt3_flag[ k ]
}
```
— 2220

```
for( k ···k1 )        {                           3rd pass
  if( gt3_flag[k])
    abs_remainder[ k ] // baseLevel = 4
}
```
— 2230

```
for( k1-1 ··· k2) {                               4th pass
  if(gt1_flag[k])
    abs_remainder[ k ] // baseLevel = 2
}
```
— 2240

```
for( k2-1 ··· 0)  {                               5th pass
  if(gt1_flag[k])
    abs_level[ k ] // baseLevel = 0
}
```
— 2250

FIG. 23

```
for( k ··· )           {                          1st pass
  sig_flag[ k ]
  if( sig_flag[ k ] ) {
    gt1_flag[k]
    if( gt1_flag[ k ] )
      par_flag[ k ]
      gt3_flag[ k ]
}}                                                        ⎯ 2310 for( k ···k1 )        {                          2nd pass
  if( gt3_flag[k])
    abs_remainder[ k ] // baseLevel = 4
}                                                         ⎯ 2320 for( k1-1 ··· 0)      {                          3rd pass
  if(gt1_flag[k])
    abs_level[ k ] // baseLevel = 0
}                                                         ⎯ 2330
```

FIG. 24
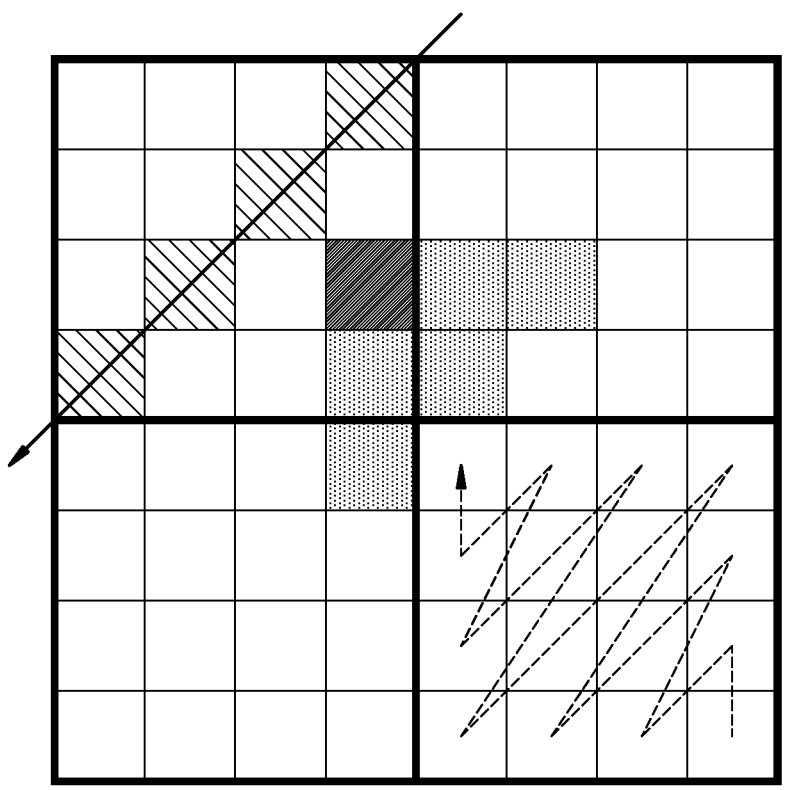
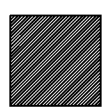 Current position — 2410
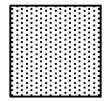 Neighboring positions for sumAbsLevel — 2420
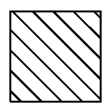 Positions for parallel derivation of rice parameter — 2430

METHOD AND DEVICE FOR ENTROPY ENCODING COEFFICIENT LEVEL, AND METHOD AND DEVICE FOR ENTROPY DECODING COEFFICIENT LEVEL

TECHNICAL FIELD

The disclosure relates to encoding and decoding a video, and more particularly, to a method and device for encoding and decoding level information of coefficients included in image data.

BACKGROUND ART

In H.264, MPEG-4, or the like, a video signal is hierarchically split into sequences, frames, slices, macro-blocks, and blocks, and the blocks are the smallest processing units. In terms of encoding, residual data of a block is obtained through intra-frame or inter-frame prediction. The residual data is compressed through transformation, quantization, scanning, run length coding, and entropy coding. In entropy coding, a syntax element, e.g., a transform coefficient or motion vector information, is entropy coded to output a bitstream. In terms of a decoder, syntax elements are extracted from the bitstream and decoded based on the extracted syntax elements.

DESCRIPTION OF EMBODIMENTS

Technical Problem

The disclosure is directed to providing an improved method and device for determining a Rice parameter to entropy-encode/decode coefficient level information indicating the size of a coefficient.

Solution to Problem

According to an embodiment of the disclosure, a method of decoding coefficients included in image data includes determining a Rice parameter for a current coefficient, based on a base level of the current coefficient; parsing coefficient level information indicating a size of the current coefficient from a bitstream by using the determined Rice parameter; and identifying the size of the current coefficient by de-binarizing the coefficient level information by using the determined Rice parameter.

According to another embodiment of the disclosure, an apparatus for decoding coefficients included in image data includes at least one processor and a memory, wherein the memory stores at least one instruction configured to be executable by the at least one processor, and the at least one instruction is configured to, when executed, cause the at least one processor to: determining a Rice parameter for a current coefficient, based on a base level of the current coefficient; parsing coefficient level information indicating a size of the current coefficient from a bitstream by using the determined Rice parameter; and identifying the size of the current coefficient by de-binarizing the coefficient level information by using the determined Rice parameter.

According to another embodiment of the disclosure, a method of encoding coefficients included in image data includes obtaining coefficient level information indicating a size of a current coefficient; determining a Rice parameter for the current coefficient, based on a base level of the current coefficient; binarizing the coefficient level information by using the determined Rice parameter; and generating a bitstream including the binarized coefficient level information.

According to another embodiment of the disclosure, an apparatus for encoding coefficients included in image data includes at least one processor and a memory, wherein the memory stores at least one instruction configured to be executable by the at least one processor, and the at least one instruction is configured to, when executed, cause the at least one processor to: obtaining coefficient level information indicating a size of a current coefficient; determining a Rice parameter for the current coefficient, based on a base level of the current coefficient; binarizing the coefficient level information by using the determined Rice parameter; and generating a bitstream including the binarized coefficient level information.

BRIEF DESCRIPTION OF THE DRAWINGS

FIG. 3 illustrates a process, performed by an image decoding apparatus, of determining at least one coding unit by splitting a current coding unit, according to an embodiment of the disclosure.

FIG. 4 illustrates a process, performed by an image decoding apparatus, of determining at least one coding unit by splitting a non-square coding unit, according to an embodiment of the disclosure.

FIG. 13 illustrates a process of determining a depth of a coding unit when a shape and size of the coding unit change, when the coding unit is recursively split such that a plurality of coding units are determined, according to an embodiment.

FIG. 20 is a diagram illustrating level information of coefficients included in a transform block according to an embodiment of the disclosure.

FIG. 21 is a diagram illustrating level information of coefficients included in a transform block according to another embodiment of the disclosure.

FIG. 22 illustrates an example of pseudo code for encoding coefficient level information.

FIG. 23 illustrates another example of pseudo code for encoding coefficient level information.

FIG. 24 is a diagram for describing a method of determining a Rice parameter according to an embodiment of the disclosure.

MODE OF DISCLOSURE

Figure 1A:
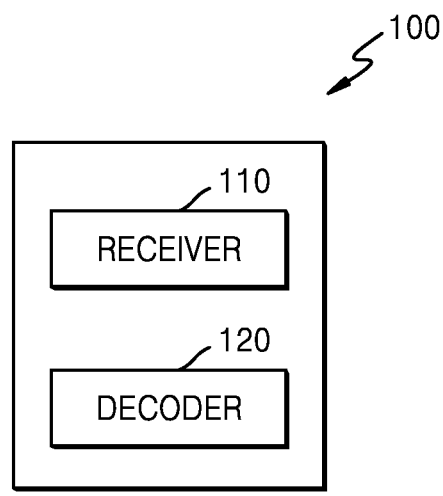
FIG. 1A is a block diagram of an image decoding apparatus according to an embodiment of the disclosure.

Advantages and features of embodiments of the disclosure set forth herein and methods of achieving them will be apparent from the following description of embodiments of the disclosure in conjunction with the accompanying drawings. However, the disclosure is not limited to embodiments of the disclosure set forth herein and may be embodied in many different forms. The embodiments of the disclosure are merely provided so that the disclosure will be thorough and complete and will fully convey the scope of the disclosure to those of ordinary skill in the art.

The terms used herein will be briefly described and then embodiments of the disclosure set forth herein will be described in detail.

In the present specification, general terms that have been widely used nowadays are selected, when possible, in consideration of functions of the disclosure, but non-general terms may be selected according to the intentions of technicians in the this art, precedents, or new technologies, etc. Some terms may be arbitrarily chosen by the present applicant. In this case, the meanings of these terms will be explained in corresponding parts of the disclosure in detail. Thus, the terms used herein should be defined not based on the names thereof but based on the meanings thereof and the whole context of the disclosure.

As used herein, the singular forms "a", "an" and "the" are intended to include the plural forms as well, unless the context clearly indicates otherwise.

It will be understood that when an element is referred to as "including" another element, the element may further include other elements unless mentioned otherwise.

The term "unit" used herein should be understood as software or a hardware component which performs certain functions. However, the term "unit" is not limited to software or hardware. The term "unit" may be configured to be stored in an addressable storage medium or to reproduce one or more processors. Thus, the term "unit" may include, for example, components, such as software components, object-oriented software components, class components, and task components, processes, functions, attributes, procedures, subroutines, segments of program code, drivers, firmware, microcode, a circuit, data, a database, data structures, tables, arrays, and parameters. Functions provided in components and "units" may be combined to a small number of components and "units" or may be divided into sub-components and "sub-units".

According to an embodiment of the disclosure, a "unit" may be implemented with a processor and a memory. The term "processor" should be interpreted broadly to include a general-purpose processor, a central processing unit (CPU), a microprocessor, a digital signal processor (DSP), a controller, a microcontroller, a state machine, and the like. In some circumstances, a "processor" may refer to an application-specific integrated circuit (ASIC), a programmable logic device (PLD), a field programmable gate array (FPGA), and the like. The term "processor" may refer to a combination of processing devices, e.g., a combination of a DSP and a microprocessor, a combination of a plurality of microprocessors, a combination of one or more microprocessors in combination with a DSP core, or a combination of any other configurations.

The term "memory" should be interpreted broadly to include any electronic component capable of storing electronic information. The term "memory" may refer to various types of processor-readable media such as random access memory (RAM), read-only memory (ROM), non-volatile RAM (NVRAM), programmable ROM (PROM), erase-programmable ROM (EPROM), electrical erasable PROM (EEPROM), flash memory, a magnetic or optical data storage device, registers, and the like. When a processor is capable of reading information from and/or writing information to a memory, the memory may be referred to as being in electronic communication with the processor. A memory integrated in a processor is in electronic communication with the processor.

The term "image", when used herein, should be understood to include a static image such as a still image of a video, and a moving picture, i.e., a dynamic image, which is a video.

The term "sample", when used herein, refers to data allocated to a sampling position of an image, i.e., data to be processed. For example, samples may be pixel values in a spatial domain, and transform coefficients in a transform domain. A unit including at least one sample may be defined as a block.

Hereinafter, embodiments of the disclosure will be described in detail with reference to the accompanying drawings, so that the embodiments of the disclosure may be easily implemented by those of ordinary skill in the art. For clarity, parts irrelevant to a description of the present disclosure are omitted in the drawings.

Hereinafter, embodiments of the disclosure will be described in detail with reference to FIGS. 1 to 26.

FIG. 1A is a block diagram of an image decoding apparatus according to an embodiment of the disclosure.

An image decoding apparatus 100 may include a receiver 110 and a decoder 120. The receiver 110 and the decoder 120 may include at least one processor. Also, the receiver 110 and the decoder 120 may include a memory storing instructions to be performed by the at least one processor.

The receiver 110 may receive a bitstream. The bitstream includes information of an image encoded by an image encoding apparatus 2200 described later. Also, the bitstream may be transmitted from an image encoding apparatus 150. The image encoding apparatus 150 and the image decoding apparatus 100 may be connected by wire or wirelessly, and the receiver 110 may receive the bitstream by wire or wirelessly. The receiver 110 may receive the bitstream from a storage medium, such as an optical medium or a hard disk.

The decoder 120 may reconstruct an image based on information obtained from the received bitstream. The decoder 120 may obtain, from the bitstream, a syntax element for reconstructing the image. The decoder 120 may reconstruct the image based on the syntax element.

The decoder 120 may entropy decode the syntax elements, which are encoding information obtained from the bitstream. The encoding information includes information regarding quantized coefficients as a result of encoding residual data of the image. According to an embodiment of the disclosure, the decoder 120 may parse coefficient level information indicating a size of a coefficient from the bitstream by using a Rice parameter. The decoder 120 may identify the size of the coefficient by entropy decoding the coefficient level information by using the Rice parameter.

An operation of the image decoding apparatus 100 will be described in more detail with reference to FIG. 1B.

Figure 1B:
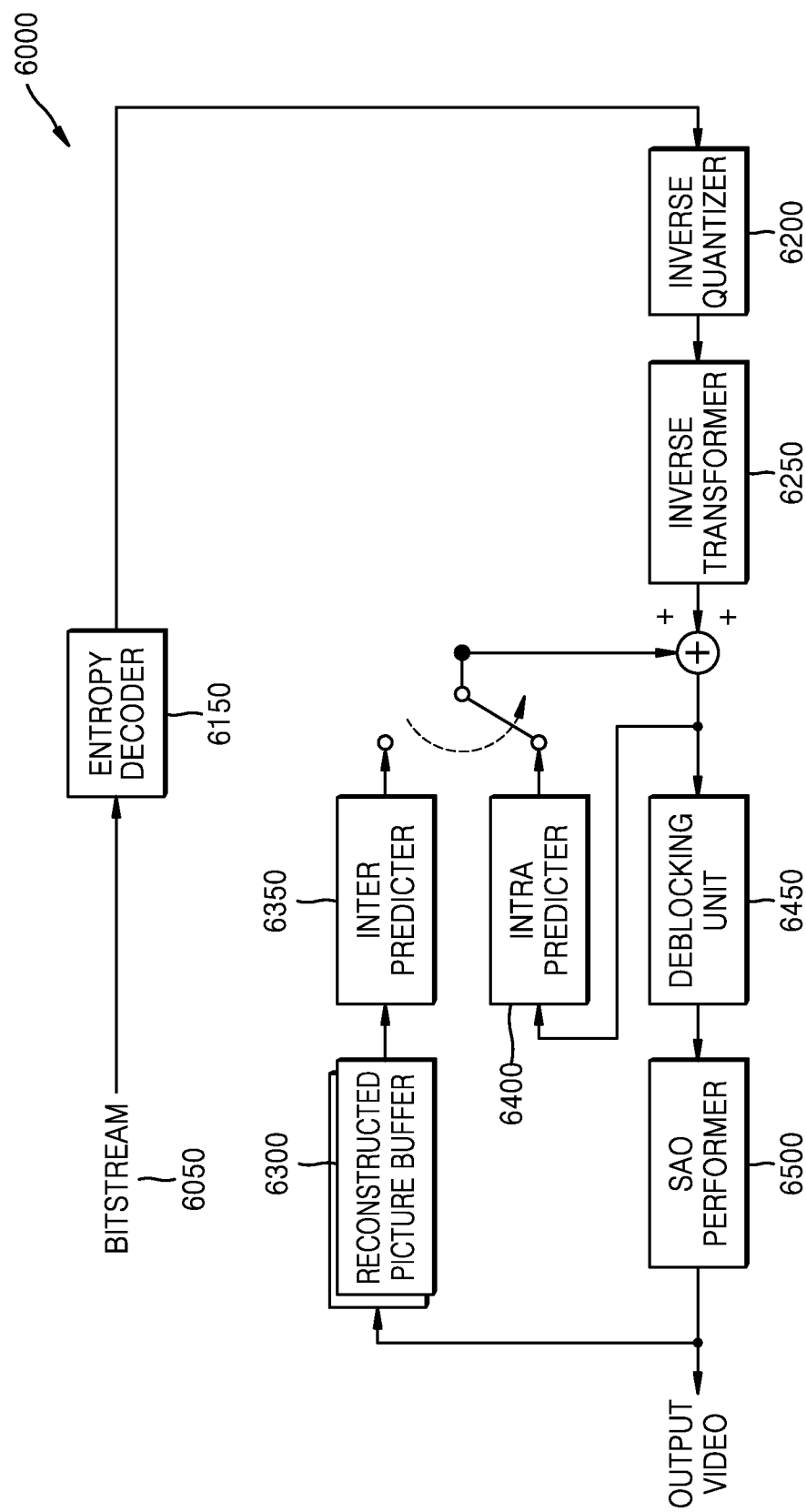
FIG. 1B is a block diagram of an image decoder according to an embodiment of the disclosure.

FIG. 1B is a block diagram of an image decoder 6000 according to an embodiment of the disclosure.

The image decoder 6000 according to an embodiment of the disclosure performs operations necessary for the decoder 120 of the image decoding apparatus 100 to decode image data.

Referring to FIG. 1B, an entropy decoder 6150 parses, from a bitstream 6050, encoded image data to be decoded and encoding information necessary for decoding. The encoded image data is a quantized transform coefficient, and an inverse quantizer 6200 and an inverse transformer 6250 reconstruct residual data from the quantized transform coefficient.

As will be described below, in an embodiment of the disclosure, the entropy decoder 6150 may determine a Rice parameter for a current coefficient, based on a base level of the current coefficient. The entropy decoder 6150 may parse coefficient level information indicating a size of the current coefficient from the bitstream 6050 by using the determined Rice parameter. The entropy decoder 6150 may identify the size of the current coefficient by de-binarizing the parsed coefficient level information by using the determined Rice parameter.

An intra predictor 6400 performs intra prediction for each block. An inter predictor 6350 performs inter prediction for each block by using a reference image obtained by a reconstructed picture buffer 6300. Data of a spatial domain of blocks of a current image may be reconstructed by adding residual data and prediction data of each block generated by the intra predictor 6400 or the inter predictor 6350, and a deblocking unit 6450 and an SAO performer 6500 may perform loop filtering on the reconstructed data of the spatial domain and output a filtered reconstructed image 6600. Reconstructed images stored in the reconstructed picture buffer 6300 may be output as reference images.

The operations may be sequentially performed by the image decoder 6000 for each block according to an embodiment of the disclosure, so that the decoder 120 of the image decoding apparatus 100 may decode the image data.

Figure 1C:
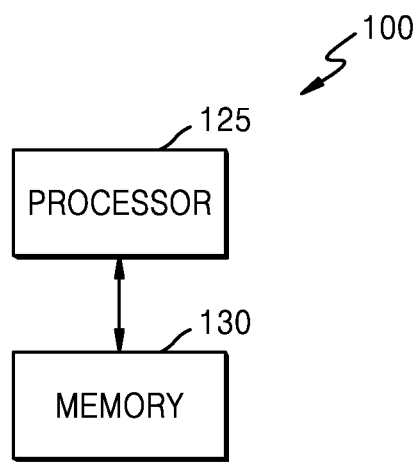
FIG. 1C is a block diagram of an image decoding apparatus according to an embodiment of the disclosure.

FIG. 1C is a block diagram of an image decoding apparatus 100 according to an embodiment of the disclosure.

The image decoding apparatus 100 according to an embodiment of the disclosure may include a memory 130 and at least one processor 125 connected to the memory 130. In an embodiment of the disclosure, operations of the image decoding apparatus 100 may be performed by an individual processor or under control of a central processor. The memory 130 of the image decoding apparatus 100 may store data received from the outside and data generated by the at least one processor 125.

In an embodiment of the disclosure, the memory 130 of the image decoding apparatus 100 may store at least one instruction configured to be executable by the at least one processor 125. The at least one instruction may be configured, when executed, to cause the at least one processor 125 to determine a Rice parameter for a current coefficient, based on a base level of the current coefficient, parse coefficient level information indicating a size of the current coefficient from a bitstream by using the determined Rice parameter, and de-binarize the coefficient level information by using the determined Rice parameter, thereby identifying the size of the current coefficient.

Figure 2A:
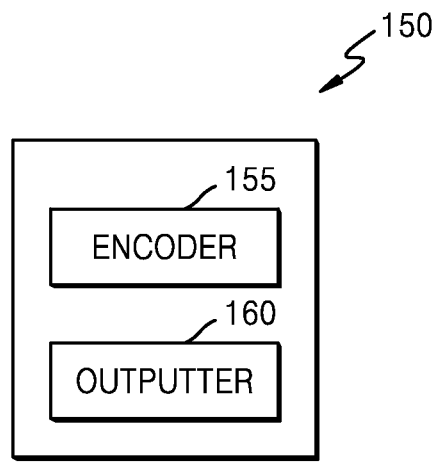
FIG. 2A is a block diagram of an image encoding apparatus according to an embodiment of the disclosure.
Figure 2B:
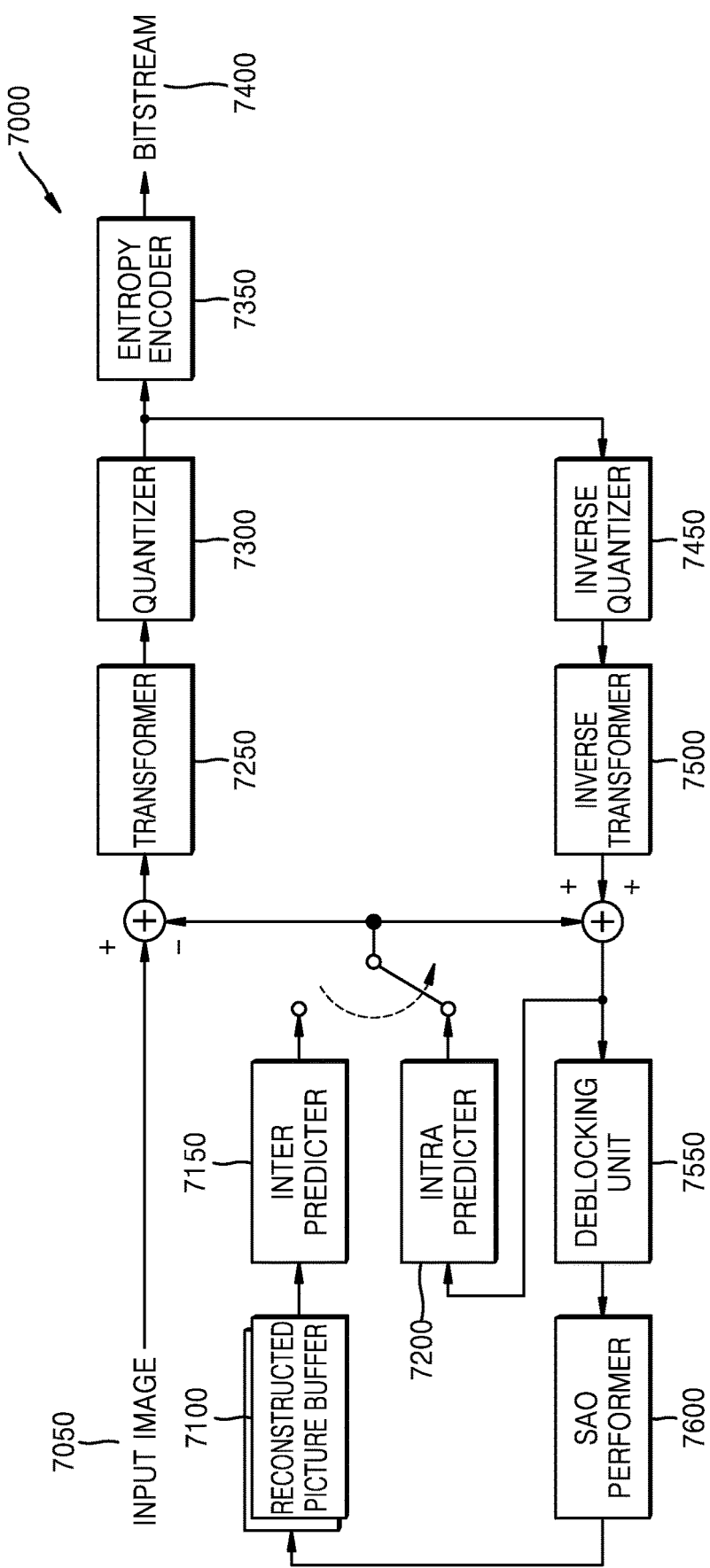
FIG. 2B is a block diagram of an image decoder according to an embodiment of the disclosure.

FIG. 2A is a block diagram of an image encoding apparatus according to an embodiment of the disclosure.

An image encoding apparatus 150 according to an embodiment of the disclosure may include an encoder 155 and an outputter 160.

The encoder 155 and the outputter 160 may include at least one processor. The encoder 155 and the outputter 160 may further include a memory that stores instructions to be executed by the at least one processor. The encoder 155 and the outputter 160 may be embodied as separate hardware components or included in one hardware component.

The encoder 155 may obtain a prediction block of a current block according to a prediction mode of the current block, and transform, quantize and encode a residual, which is a difference value between the current block and the prediction block. The outputter 160 may generate a bitstream including information regarding the prediction mode of the current block and configuration information for determining a data unit of a hierarchical split form, and output the bitstream.

The encoder 155 may entropy-encode syntax elements, which are encoding information generated during an encoding process. In an embodiment of the disclosure, the encoder 155 may obtain coefficient level information indicating a size of a coefficient included in image data. The encoder 155 may entropy-encode the coefficient level information by using a Rice parameter and generate a bitstream including the encoded coefficient level information.

FIG. 2A is a block diagram of an image encoder according to an embodiment of the disclosure.

An image encoder 7000 according to an embodiment of the disclosure performs operations necessary for the encoder 120 of the image encoding apparatus 150 to encode image data.

That is, an intra predictor 7200 performs intra prediction on each block of a current image 7050, and an inter predictor 7150 performs inter prediction on each block by using the current image 7050 and a reference image obtained by a reconstructed picture buffer 7100.

Residual data may be generated by subtracting prediction data of each block output from the intra predictor 7200 or the inter predictor 7150 from data of a block of the current image 7050, which is to be encoded, and a transformer 7250 and a quantizer 7300 may perform transformation and quantization on the residual data and output a quantized transform coefficient for each block.

An inverse quantizer 7450 and an inverse transformer 7500 may reconstruct residual data of a spatial domain by performing inverse quantization and inverse transformation on the quantized transform coefficient. The reconstructed residual data of the spatial domain may be added to the prediction data of each block output from the intra predictor 7200 or the inter predictor 7150 to reconstruct data of the spatial domain of the block of the current image 7050. A deblocking unit 7550 and an SAO performer 7600 perform in-loop filtering on the reconstructed data of the spatial domain to generate a filtered reconstructed image. The generated reconstructed image is stored in the reconstructed picture buffer 7100. Reconstructed pictures stored in the reconstructed picture buffer 7100 may be used as reference images for inter prediction of other images. An entropy encoder 7350 may entropy-encode the quantized transform coefficient and output the entropy-encoded coefficient in a bitstream 7400.

As described below, in an embodiment of the disclosure, the entropy encoder 7350 may obtain coefficient level information indicating a size of a current coefficient. The entropy encoder 7350 may determine a Rice parameter for the current coefficient, based on a base level of the current coefficient. The entropy encoder 7350 may binarize the coefficient level information by using the determined Rice parameter. The entropy encoder 7350 may generate a bitstream including the binarized coefficient level information.

In order to apply the image encoder 7000 according to an embodiment of the disclosure to the image encoding apparatus 150, operations of the image encoder 7000 according to an embodiment of the disclosure may be performed for each block.

Figure 2C:
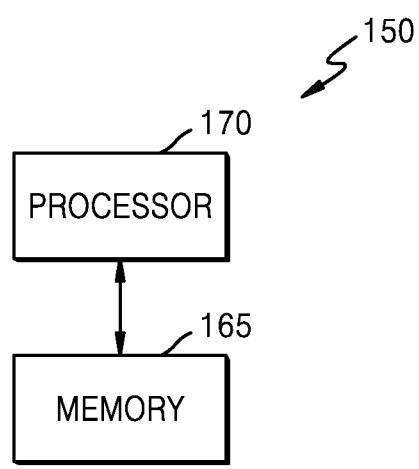
FIG. 2C is a block diagram of an image encoding apparatus according to an embodiment of the disclosure.

FIG. 2C is a block diagram of an image encoding apparatus 150 according to an embodiment of the disclosure.

The image encoding apparatus 150 according to an embodiment of the disclosure may include a memory 165 and at least one processor 170 connected to the memory 165. In an embodiment of the disclosure, operations of the image encoding apparatus 150 may be performed by an individual processor or under control of a central processor. The memory 165 of the image encoding apparatus 150 may store data received from the outside and data generated by the at least one processor 170.

In an embodiment of the disclosure, the memory 165 of the image encoding apparatus 150 may store at least one instruction configured to be executable by the at least one processor 170. The at least one instruction, when executed, causes the at least one processor 170 to obtain coefficient level information indicating a size of a current coefficient, determine a Rice parameter for the current coefficient, based on a base level of the current coefficient, binarize the coefficient level information by using the determined Rice parameter, and generate a bitstream including the binarized coefficient level information.

Hereinafter, splitting of a coding unit will be described in detail according to an embodiment of the present disclosure.

First, one picture may be split into one or more slices or one or more tiles. One slice or one tile may be a sequence of one or more largest coding units (coding tree units (CTUs)). There is a largest coding block (coding tree block (CTB)) conceptually compared to a largest coding unit (CTU).

The largest coding unit (CTB) denotes an N×N block including N×N samples (N is an integer). Each color component may be split into one or more largest coding blocks.

When a picture has three sample arrays (sample arrays for Y, Cr, and Cb components), a largest coding unit (CTU) includes a largest coding block of a luma sample, two corresponding largest coding blocks of chroma samples, and syntax elements used to encode the luma sample and the chroma samples. When a picture is a monochrome picture, a largest coding unit includes a largest coding block of a monochrome sample and syntax elements used to encode the monochrome samples. When a picture is a picture encoded in color planes separated according to color components, a largest coding unit includes syntax elements used to encode the picture and samples of the picture.

One largest coding block (CTB) may be split into M×N coding blocks including M×N samples (M and N are integers).

When a picture has sample arrays for Y, Cr, and Cb components, a coding unit (CU) includes a coding block of a luma sample, two corresponding coding blocks of chroma samples, and syntax elements used to encode the luma sample and the chroma samples. When a picture is a monochrome picture, a coding unit includes a coding block of a monochrome sample and syntax elements used to encode the monochrome samples. When a picture is a picture encoded in color planes separated according to color components, a coding unit includes syntax elements used to encode the picture and samples of the picture.

As described above, a largest coding block and a largest coding unit are conceptually distinguished from each other, and a coding block and a coding unit are conceptually distinguished from each other. That is, a (largest) coding unit refers to a data structure including a (largest) coding block including a corresponding sample and a syntax elements corresponding to the (largest) coding block. However, because it is understood by one of ordinary skill in the art that a (largest) coding unit or a (largest) coding block refers to a block of a certain size including a certain number of samples, a largest coding block and a largest coding unit, or a coding block and a coding unit are mentioned in the following specification without being distinguished unless otherwise described.

An image may be split into largest coding units (CTUs). A size of each largest coding unit may be determined based on information obtained from a bitstream. A shape of each largest coding unit may be a square shape of the same size. However, an embodiment is not limited thereto.

For example, information about a maximum size of a luma coding block may be obtained from a bitstream. For example, the maximum size of the luma coding block indicated by the information about the maximum size of the luma coding block may be one of 16×16, 32×32, 64×64, 128×128, and 256×256.

For example, information about a luma block size difference and a maximum size of a luma coding block that may be split into two may be obtained from a bitstream. The information about the luma block size difference may refer to a size difference between a luma largest coding unit and a largest luma coding block that may be split into two. Accordingly, when the information about the maximum size of the luma coding block that may be split into two and the information about the luma block size difference obtained from the bitstream are combined with each other, a size of the luma largest coding unit may be determined. A size of a chroma largest coding unit may be determined by using the size of the luma largest coding unit. For example, when a Y:Cb:Cr ratio is 4:2:0 according to a color format, a size of a chroma block may be half a size of a luma block, and a size of a chroma largest coding unit may be half a size of a luma largest coding unit.

According to an embodiment, because information about a maximum size of a luma coding block that is binary splittable is obtained from a bitstream, the maximum size of the luma coding block that is binary splittable may be variably determined. In contrast, a maximum size of a luma coding block that is ternary splittable may be fixed. For example, the maximum size of the luma coding block that is ternary splittable in an I-picture may be 32×32, and the maximum size of the luma coding block that is ternary splittable in a P-picture or a B-picture may be 64×64.

Also, a largest coding unit may be hierarchically split into coding units based on split shape mode information obtained from a bitstream. At least one of information indicating whether quad splitting is performed, information indicating whether multi-splitting is performed, split direction information, and split type information may be obtained as the split shape mode information from the bitstream.

For example, the information indicating whether quad splitting is performed may indicate whether a current coding unit is to be quad split (QUAD_SPLIT) or is to not be quad split.

When the current coding unit is not quad split, the information indicating whether multi-splitting is performed may indicate whether the current coding unit is no longer split (NO_SPLIT) or binary/ternary split.

When the current coding unit is binary split or ternary split, the split direction information indicates that the current coding unit is split in one of a horizontal direction and a vertical direction.

When the current coding unit is split in the horizontal direction or the vertical direction, the split type information indicates that the current coding unit is binary split or ternary split.

A split mode of the current coding unit may be determined according to the split direction information and the split type information. A split mode when the current coding unit is binary split in the horizontal direction may be determined to be a binary horizontal split mode (SPLIT_BT_HOR), a split mode when the current coding unit is ternary split in the horizontal direction may be determined to be a ternary horizontal split mode (SPLIT_TT_HOR), a split mode when the current coding unit is binary split in the vertical direction may be determined to be a binary vertical split mode (SPLIT_BT_VER), and a split mode when the current coding unit is ternary split in the vertical direction may be determined to be a ternary vertical split mode (SPLIT_TT_VER).

The image decoding apparatus 100 may obtain, from the bitstream, the split shape mode information from one bin string. A form of the bitstream received by the image decoding apparatus 100 may include fixed length binary code, unary code, truncated unary code, pre-determined binary code, or the like. The bin string is information in a binary number. The bin string may include at least one bit. The image decoding apparatus 100 may obtain the split shape mode information corresponding to the bin string, based on the split rule. The image decoding apparatus 100 may determine whether to quad-split a coding unit, whether to not split a coding unit, a split direction, and a split type, based on one bin string.

The coding unit may be smaller than or same as the largest coding unit. For example, because a largest coding unit is a coding unit having a maximum size, the largest coding unit is one of coding units. When split shape mode information about a largest coding unit indicates that splitting is not performed, a coding unit determined in the largest coding unit has the same size as that of the largest coding unit. When split shape code information about a largest coding unit indicates that splitting is performed, the largest coding unit may be split into coding units. Also, when split shape mode information about a coding unit indicates that splitting is performed, the coding unit may be split into smaller coding units. However, the splitting of the image is not limited thereto, and the largest coding unit and the coding unit may not be distinguished. The splitting of the coding unit will be described in detail with reference to FIGS. 3 through 16.

Also, one or more prediction blocks for prediction may be determined from a coding unit. The prediction block may be equal to or smaller than the coding unit. Also, one or more transform blocks for transform may be determined from a coding unit. The transform block may be equal to or smaller than the coding unit.

The shapes and sizes of the transform block and prediction block may not be related to each other.

In another embodiment, prediction may be performed by using a coding unit as a prediction unit. Also, transformation may be performed by using a coding unit as a transform block.

The splitting of the coding unit will be described in detail with reference to FIGS. 3 through 16. A current block and a neighboring block of the present disclosure may indicate one of the largest coding unit, the coding unit, the prediction block, and the transform block. Also, the current block of the current coding unit is a block that is currently being decoded or encoded or a block that is currently being split. The neighboring block may be a block reconstructed before the current block. The neighboring block may be adjacent to the current block spatially or temporally. The neighboring block may be located at one of the lower left, left, upper left, top, upper right, right, lower right of the current block.

FIG. 3 illustrates a process, performed by the image decoding apparatus 100, of determining at least one coding unit by splitting a current coding unit, according to an embodiment.

A block shape may include 4N×4N, 4N×2N, 2N×4N, 4N×N, N×4N, 32N×N, N×32N, 16N×N, N×16N, 8N×N, or N×8N. Here, N may be a positive integer. Block shape information is information indicating at least one of a shape, direction, a ratio of width and height, and a size of width and height.

The shape of the coding unit may include a square and a non-square. When the lengths of the width and height of the coding unit are the same (i.e., when the block shape of the coding unit is 4N×4N), the image decoding apparatus 100 may determine the block shape information of the coding unit as a square. The image decoding apparatus 100 may determine the shape of the coding unit to be a non-square.

When the width and the height of the coding unit are different from each other (i.e., when the block shape of the coding unit is 4N×2N, 2N×4N, 4N×N, N×4N, 32N×N, N×32N, 16N×N, N×16N, 8N×N, or N×8N), the image decoding apparatus 100 may determine the block shape information of the coding unit as a non-square shape. When the shape of the coding unit is non-square, the image decoding apparatus 100 may determine the ratio of the width and height among the block shape information of the coding unit to be at least one of 1:2, 2:1, 1:4, 4:1, 1:8, 8:1, 1:16, 16:1, 1:32, and 32:1. Also, the image decoding apparatus 100 may determine whether the coding unit is in a horizontal direction or a vertical direction, based on the length of the width and the length of the height of the coding unit. Also, the image decoding apparatus 100 may determine the size of the coding unit, based on at least one of the length of the width, the length of the height, or the area of the coding unit.

According to an embodiment, the image decoding apparatus 100 may determine the shape of the coding unit by using the block shape information, and may determine a splitting method of the coding unit by using the split shape mode information. That is, a coding unit splitting method indicated by the split shape mode information may be determined based on a block shape indicated by the block shape information used by the image decoding apparatus 100.

The image decoding apparatus 100 may obtain the split shape mode information from a bitstream. However, an embodiment is not limited thereto, and the image decoding apparatus 100 and the image encoding apparatus 150 may determine pre-agreed split shape mode information, based on the block shape information. The image decoding apparatus 100 may determine the pre-agreed split shape mode information with respect to a largest coding unit or a smallest coding unit. For example, the image decoding apparatus 100 may determine split shape mode information with respect to the largest coding unit to be a quad split. Also, the image decoding apparatus 100 may determine split shape mode information regarding the smallest coding unit to be "not to perform splitting". In particular, the image decoding apparatus 100 may determine the size of the largest coding unit to be 256×256. The image decoding apparatus 100 may determine the pre-agreed split shape mode information to be a quad split. The quad split is a split shape mode in which the width and the height of the coding unit are both bisected. The image decoding apparatus 100 may obtain a coding unit of a 128×128 size from the largest coding unit of a 256×256 size, based on the split shape mode information. Also, the image decoding apparatus 100 may determine the size of the smallest coding unit to be 4×4. The image decoding apparatus 100 may obtain split shape mode information indicating "not to perform splitting" with respect to the smallest coding unit.

According to an embodiment, the image decoding apparatus 100 may use the block shape information indicating that the current coding unit has a square shape. For example, the image decoding apparatus 100 may determine whether to not split a square coding unit, whether to vertically split the square coding unit, whether to horizontally split the square coding unit, or whether to split the square coding unit into four coding units, based on the split shape mode information. Referring to FIG. 3, when the block shape information of a current coding unit 300 indicates a square shape, the decoder 120 may determine a coding unit 310a having the same size as the current coding unit 300, based on the split shape mode information indicating not to perform splitting, or may determine coding units 310b, 310c, 310d, 310e, or 310f split based on the split shape mode information indicating a certain splitting method.

Referring to FIG. 3, according to an embodiment, the image decoding apparatus 100 may determine two coding units 310b obtained by splitting the current coding unit 300 in a vertical direction, based on the split shape mode information indicating to perform splitting in a vertical direction. The image decoding apparatus 100 may determine two coding units 310c obtained by splitting the current coding unit 300 in a horizontal direction, based on the split shape mode information indicating to perform splitting in a horizontal direction. The image decoding apparatus 100 may determine four coding units 310d obtained by splitting the current coding unit 300 in vertical and horizontal directions, based on the split shape mode information indicating to perform splitting in vertical and horizontal directions. According to an embodiment, the image decoding apparatus 100 may determine three coding units 310e obtained by splitting the current coding unit 300 in a vertical direction, based on the split shape mode information indicating to perform ternary-splitting in a vertical direction. The image decoding apparatus 100 may determine three coding units 310f obtained by splitting the current coding unit 300 in a horizontal direction, based on the split shape mode information indicating to perform ternary-splitting in a horizontal direction. However, splitting methods of the square coding unit are not limited to the above-described methods, and the split shape mode information may indicate various methods. Certain splitting methods of splitting the square coding unit will be described in detail below in relation to various embodiments.

FIG. 4 illustrates a process, performed by the image decoding apparatus 100, of determining at least one coding unit by splitting a non-square coding unit, according to an embodiment.

According to an embodiment, the image decoding apparatus 100 may use block shape information indicating that a current coding unit has a non-square shape. The image decoding apparatus 100 may determine whether not to split the non-square current coding unit or whether to split the non-square current coding unit by using a certain splitting method, based on split shape mode information. Referring to FIG. 4, when the block shape information of a current coding unit 400 or 450 indicates a non-square shape, the image decoding apparatus 100 may determine a coding unit 410 or 460 having the same size as the current coding unit 400 or 450, based on the split shape mode information indicating not to perform splitting, or may determine coding units 420a and 420b, 430a to 430c, 470a and 470b, or 480a to 480c split based on the split shape mode information indicating a certain splitting method. Certain splitting methods of splitting a non-square coding unit will be described in detail below in relation to various embodiments.

According to an embodiment, the image decoding apparatus 100 may determine a splitting method of a coding unit by using the split shape mode information and, in this case, the split shape mode information may indicate the number of one or more coding units generated by splitting a coding unit. Referring to FIG. 4, when the split shape mode information indicates to split the current coding unit 400 or 450 into two coding units, the image decoding apparatus 100 may determine two coding units 420a and 420b, or 470a and 470b included in the current coding unit 400 or 450, by splitting the current coding unit 400 or 450 based on the split shape mode information.

According to an embodiment, when the image decoding apparatus 100 splits the non-square current coding unit 400 or 450 based on the split shape mode information, the image decoding apparatus 100 may consider the location of a long side of the non-square current coding unit 400 or 450 to split a current coding unit. For example, the image decoding apparatus 100 may determine a plurality of coding units by splitting a long side of the current coding unit 400 or 450, in consideration of the shape of the current coding unit 400 or 450.

According to an embodiment, when the split shape mode information indicates to split (ternary-split) a coding unit into an odd number of blocks, the image decoding apparatus 100 may determine an odd number of coding units included in the current coding unit 400 or 450. For example, when the split shape mode information indicates to split the current coding unit 400 or 450 into three coding units, the image decoding apparatus 100 may split the current coding unit 400 or 450 into three coding units 430a, 430b, and 430c, or 480a, 480b, and 480c.

According to an embodiment, a ratio of the width and height of the current coding unit 400 or 450 may be 4:1 or 1:4. When the ratio of the width and height is 4:1, the block shape information may be a horizontal direction because the length of the width is longer than the length of the height. When the ratio of the width and height is 1:4, the block shape information may be a vertical direction because the length of the width is shorter than the length of the height. The image decoding apparatus 100 may determine to split a current coding unit into the odd number of blocks, based on the split shape mode information. Also, the image decoding apparatus 100 may determine a split direction of the current coding unit 400 or 450, based on the block shape information of the current coding unit 400 or 450. For example, when the current coding unit 400 corresponds to a vertical direction because a height of the current coding unit 400 is greater than a width of the current coding unit 400, the image decoding apparatus 100 may determine coding units 430a, 430b, and 430c by splitting the current coding unit 400 in a horizontal direction. Also, when the current coding unit 450 corresponds to a horizontal direction because a width of the current coding unit 450 is greater than a height of the current coding unit 450, the image decoding apparatus 100 may determine coding units 480a, 480b, and 480c by splitting the current coding unit 450 in a vertical direction.

According to an embodiment, the image decoding apparatus 100 may determine the odd number of coding units included in the current coding unit 400 or 450, and not all the determined coding units may have the same size. For example, a certain coding unit 430b or 480b from among the determined odd number of coding units 430a, 430b, and 430c, or 480a, 480b, and 480c may have a size different from the size of the other coding units 430a and 430c, or 480a and 480c. That is, coding units which may be determined by splitting the current coding unit 400 or 450 may have multiple sizes and, in some cases, all of the odd number of coding units 430a, 430b, and 430c, or 480a, 480b, and 480c may have different sizes.

According to an embodiment, when the split shape mode information indicates to split a coding unit into the odd number of blocks, the image decoding apparatus 100 may determine the odd number of coding units included in the current coding unit 400 or 450, and in addition, may put a certain restriction on at least one coding unit from among the odd number of coding units generated by splitting the current coding unit 400 or 450. Referring to FIG. 4, the image decoding apparatus 100 may set a decoding process regarding the coding unit 430b or 480b located at the center among the three coding units 430a, 430b, and 430c or 480a, 480b, and 480c generated as the current coding unit 400 or 450 is split to be different from that of the other coding units 430a and 430c, or 480a or 480c. For example, the image decoding apparatus 100 may restrict the coding unit 430b or 480b at the center location to be no longer split or to be split only a certain number of times, unlike the other coding units 430a and 430c, or 480a and 480c.

Figure 5:
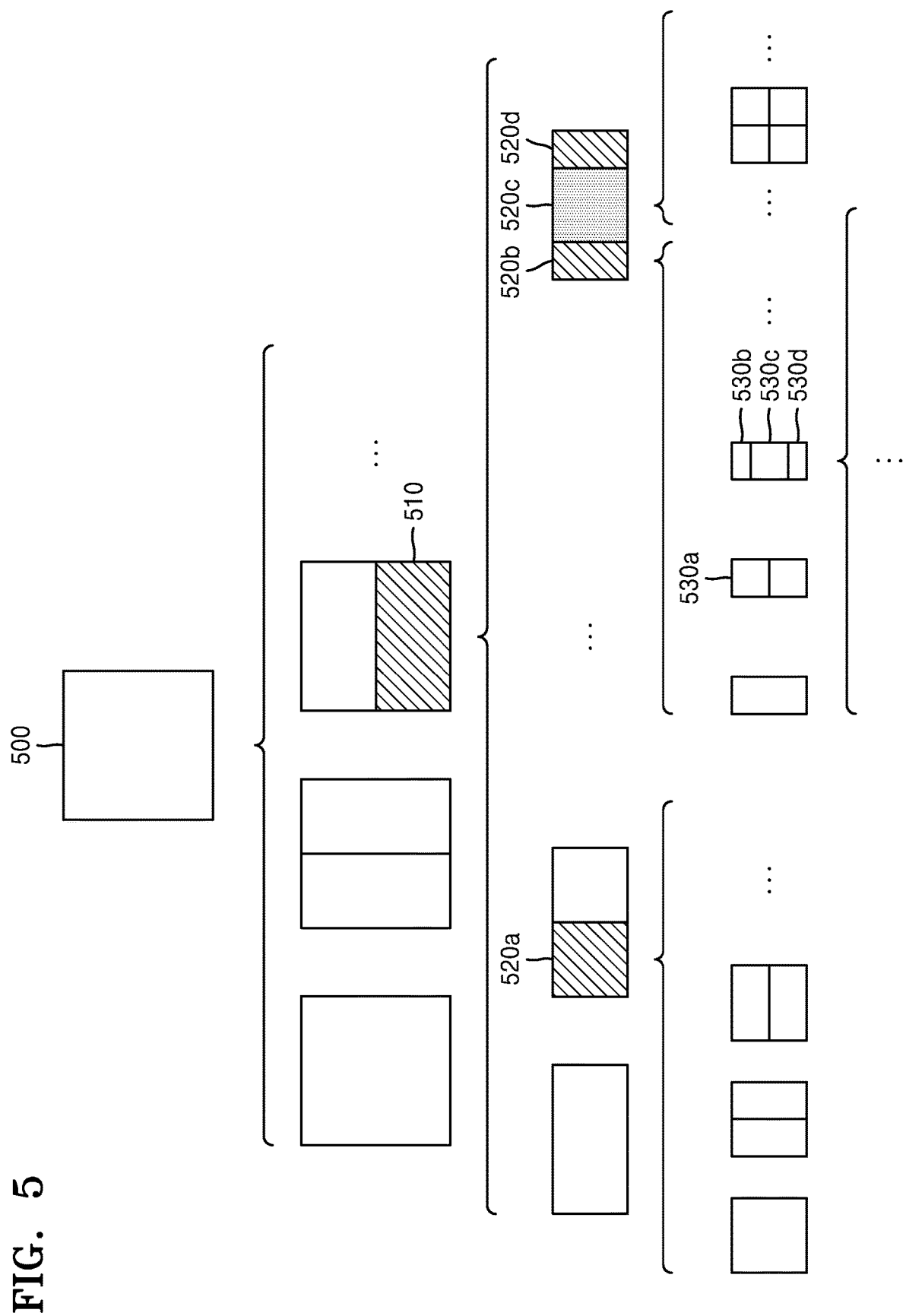
FIG. 5 illustrates a process, performed by an image decoding apparatus, of splitting a coding unit based on at least one of block shape information and split shape mode information, according to an embodiment of the disclosure.

FIG. 5 illustrates a process, performed by the image decoding apparatus 100, of splitting a coding unit based on at least one of block shape information and split shape mode information, according to an embodiment.

According to an embodiment, the image decoding apparatus 100 may determine to split or to not split a square first coding unit 500 into coding units, based on at least one of the block shape information and the split shape mode information. According to an embodiment, when the split shape mode information indicates to split the first coding unit 500 in a horizontal direction, the image decoding apparatus 100 may determine a second coding unit 510 by splitting the first coding unit 500 in a horizontal direction. A first coding unit, a second coding unit, and a third coding unit used according to an embodiment are terms used to understand a relation before and after splitting a coding unit. For example, a second coding unit may be determined by splitting a first coding unit, and a third coding unit may be determined by splitting the second coding unit. It will be understood that the structure of the first coding unit, the second coding unit, and the third coding unit follows the above descriptions.

According to an embodiment, the image decoding apparatus 100 may determine to split or not to split the determined second coding unit 510 into coding units, based on the split shape mode information. Referring to FIG. 5, the image decoding apparatus 100 may or may not split the non-square second coding unit 510, which is determined by splitting the first coding unit 500, into one or more third coding units 520a, or 520b, 520c, and 520d based on the split shape mode information. The image decoding apparatus 100 may obtain the split shape mode information, and may determine a plurality of various-shaped second coding units (e.g., 510) by splitting the first coding unit 500, based on the obtained split shape mode information, and the second coding unit 510 may be split by using a splitting method of the first coding unit 500 based on the split shape mode information. According to an embodiment, when the first coding unit 500 is split into the second coding units 510 based on the split shape mode information of the first coding unit 500, the second coding unit 510 may also be split into the third coding units 520a, or 520b, 520c, and 520d based on the split shape mode information of the second coding unit 510. That is, a coding unit may be recursively split based on the split shape mode information of each coding unit. Therefore, a square coding unit may be determined by splitting a non-square coding unit, and a non-square coding unit may be determined by recursively splitting the square coding unit.

Referring to FIG. 5, a certain coding unit from among the odd number of third coding units 520b, 520c, and 520d determined by splitting the non-square second coding unit 510 (e.g., a coding unit at a center location or a square coding unit) may be recursively split. According to an embodiment, the square third coding unit 520c from among the odd number of third coding units 520b, 520c, and 520d may be split in a horizontal direction into a plurality of fourth coding units. A non-square fourth coding unit 530b or 530d from among a plurality of fourth coding units 530a, 530b, 530c, and 530d may be split into a plurality of coding units again. For example, the non-square fourth coding unit 530b or 530d may be split into the odd number of coding units again. A method that may be used to recursively split a coding unit will be described below in relation to various embodiments.

According to an embodiment, the image decoding apparatus 100 may split each of the third coding units 520a, or 520b, 520c, and 520d into coding units, based on the split shape mode information. Also, the image decoding apparatus 100 may determine to not split the second coding unit 510 based on the split shape mode information. According to an embodiment, the image decoding apparatus 100 may split the non-square second coding unit 510 into the odd number of third coding units 520b, 520c, and 520d. The image decoding apparatus 100 may put a certain restriction on a certain third coding unit from among the odd number of third coding units 520b, 520c, and 520d. For example, the image decoding apparatus 100 may restrict the third coding unit 520c at a center location from among the odd number of third coding units 520b, 520c, and 520d to be no longer split or to be split a settable number of times.

Referring to FIG. 5, the image decoding apparatus 100 may restrict the third coding unit 520c, which is at the center location from among the odd number of third coding units 520b, 520c, and 520d included in the non-square second coding unit 510, to be no longer split, to be split by using a certain splitting method (e.g., split into only four coding units or split by using a splitting method of the second coding unit 510), or to be split only a certain number of times (e.g., split only n times (where n>0)). However, the restrictions on the third coding unit 520c at the center location are not limited to the above-described examples, and may include various restrictions for decoding the third coding unit 520c at the center location differently from the other third coding units 520b and 520d.

According to an embodiment, the image decoding apparatus 100 may obtain the split shape mode information, which is used to split a current coding unit, from a certain location in the current coding unit.

Figure 6:
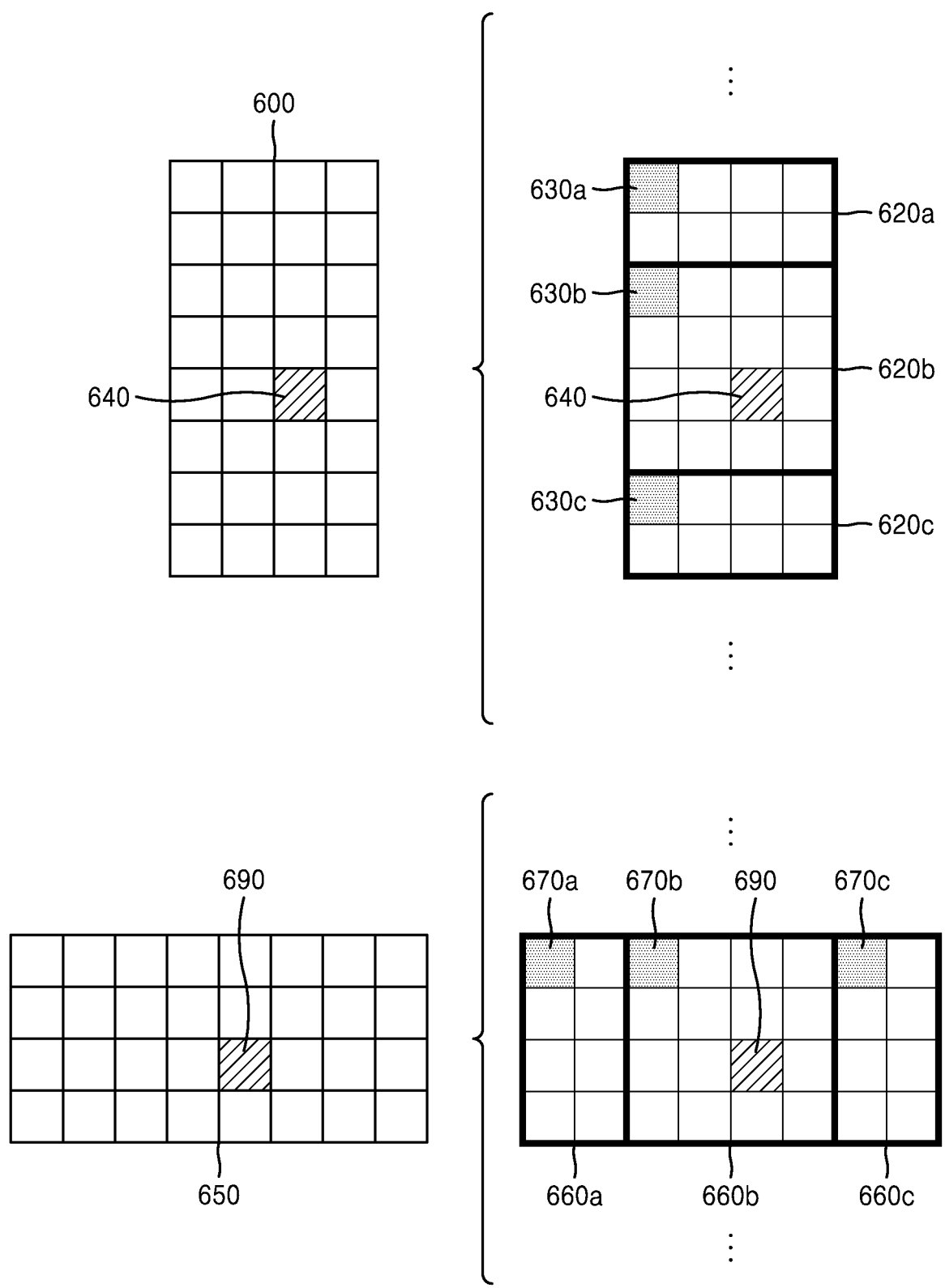
FIG. 6 illustrates a method, performed by an image decoding apparatus, of determining a certain coding unit from among an odd number of coding units, according to an embodiment of the disclosure.

FIG. 6 illustrates a method, performed by the image decoding apparatus 100, of determining a certain coding unit from among an odd number of coding units, according to an embodiment.

Referring to FIG. 6, split shape mode information of a current coding unit 600 or 650 may be obtained from a sample of a certain location (e.g., a sample 640 or 690 of a center location) from among a plurality of samples included in the current coding unit 600 or 650. However, the certain location in the current coding unit 600, from which at least one piece of the split shape mode information may be obtained, is not limited to the center location in FIG. 6, and may include various locations included in the current coding unit 600 (e.g., top, bottom, left, right, upper left, lower left, upper right, and lower right locations). The image decoding apparatus 100 may obtain the split shape mode information from the certain location and may determine to split or to not split the current coding unit into various-shaped and various-sized coding units.

According to an embodiment, when the current coding unit is split into a certain number of coding units, the image decoding apparatus 100 may select one of the coding units. Various methods may be used to select one of a plurality of coding units, as will be described below in relation to various embodiments.

According to an embodiment, the image decoding apparatus 100 may split the current coding unit into a plurality of coding units, and may determine a coding unit at a certain location.

According to an embodiment, image decoding apparatus 100 may use information indicating locations of the odd number of coding units, to determine a coding unit at a center location from among the odd number of coding units. Referring to FIG. 6, the image decoding apparatus 100 may determine the odd number of coding units 620a, 620b, and 620c or the odd number of coding units 660a, 660b, and 660c by splitting the current coding unit 600 or the current coding unit 650. The image decoding apparatus 100 may determine the middle coding unit 620b or the middle coding unit 660b by using information about the locations of the odd number of coding units 620a, 620b, and 620c or the odd number of coding units 660a, 660b, and 660c. For example, the image decoding apparatus 100 may determine the coding unit 620b of the center location by determining the locations of the coding units 620a, 620b, and 620c based on information indicating locations of certain samples included in the coding units 620a, 620b, and 620c. In detail, the image decoding apparatus 100 may determine the coding unit 620b at the center location by determining the locations of the coding units 620a, 620b, and 620c based on information indicating locations of upper left samples 630a, 630b, and 630c of the coding units 620a, 620b, and 620c.

According to an embodiment, the information indicating the locations of the upper left samples 630a, 630b, and 630c, which are included in the coding units 620a, 620b, and 620c, respectively, may include information about locations or coordinates of the coding units 620a, 620b, and 620c in a picture. According to an embodiment, the information indicating the locations of the upper left samples 630a, 630b, and 630c, which are included in the coding units 620a, 620b, and 620c, respectively, may include information indicating widths or heights of the coding units 620a, 620b, and 620c included in the current coding unit 600, and the widths or heights may correspond to information indicating differences between the coordinates of the coding units 620a, 620b, and 620c in the picture. That is, the image decoding apparatus 100 may determine the coding unit 620b at the center location by directly using the information about the locations or coordinates of the coding units 620a, 620b, and 620c in the picture, or by using the information about the widths or heights of the coding units, which correspond to the difference values between the coordinates.

According to an embodiment, information indicating the location of the upper left sample 630a of the upper coding unit 620a may include coordinates (xa, ya), information indicating the location of the upper left sample 630b of the middle coding unit 620b may include coordinates (xb, yb), and information indicating the location of the upper left sample 630c of the lower coding unit 620c may include coordinates (xc, yc). The image decoding apparatus 100 may determine the middle coding unit 620b by using the coordinates of the upper left samples 630a, 630b, and 630c which are included in the coding units 620a, 620b, and 620c, respectively. For example, when the coordinates of the upper left samples 630a, 630b, and 630c are sorted in an ascending or descending order, the coding unit 620b including the coordinates (xb, yb) of the sample 630b at a center location may be determined as a coding unit at a center location from among the coding units 620a, 620b, and 620c determined by splitting the current coding unit 600. However, the coordinates indicating the locations of the upper left samples 630a, 630b, and 630c may include coordinates indicating absolute locations in the picture, or may use coordinates (dxb, dyb) indicating a relative location of the upper left sample 630b of the middle coding unit 620b and coordinates (dxc, dyc) indicating a relative location of the upper left sample 630c of the lower coding unit 620c with reference to the location of the upper left sample 630a of the upper coding unit 620a. A method of determining a coding unit at a certain location by using coordinates of a sample included in the coding unit, as information indicating a location of the sample, is not limited to the above-described method, and may include various arithmetic methods capable of using the coordinates of the sample.

According to an embodiment, the image decoding apparatus 100 may split the current coding unit 600 into a plurality of coding units 620a, 620b, and 620c, and may select one of the coding units 620a, 620b, and 620c based on a certain criterion. For example, the image decoding apparatus 100 may select the coding unit 620b, which has a size different from that of the others, from among the coding units 620a, 620b, and 620c.

According to an embodiment, the image decoding apparatus 100 may determine the width or height of each of the coding units 620a, 620b, and 620c by using the coordinates (xa, ya) that is the information indicating the location of the upper left sample 630a of the upper coding unit 620a, the coordinates (xb, yb) that are the information indicating the location of the upper left sample 630b of the middle coding unit 620b, and the coordinates (xc, yc) that is the information indicating the location of the upper left sample 630c of the lower coding unit 620c. The image decoding apparatus 100 may determine the respective sizes of the coding units 620a, 620b, and 620c by using the coordinates (xa, ya), (xb, yb), and (xc, yc) indicating the locations of the coding units 620a, 620b, and 620c. According to an embodiment, the image decoding apparatus 100 may determine the width of the upper coding unit 620a to be the width of the current coding unit 600. The image decoding apparatus 100 may determine the height of the upper coding unit 620a to be yb-ya. According to an embodiment, the image decoding apparatus 100 may determine the width of the middle coding unit 620b to be the width of the current coding unit 600. The image decoding apparatus 100 may determine the height of the middle coding unit 620b to be yc-yb. According to an embodiment, the image decoding apparatus 100 may determine the width or height of the lower coding unit 620c by using the width or height of the current coding unit 600 or the widths or heights of the upper and middle coding units 620a and 620b. The image decoding apparatus 100 may determine a coding unit, which has a size different from that of the others, based on the determined widths and heights of the coding units 620a, 620b, and 620c. Referring to FIG. 6, the image decoding apparatus 100 may determine the middle coding unit 620b, which has a size different from the size of the upper and lower coding units 620a and 620c, as the coding unit of the certain location. However, the above-described method, performed by the image decoding apparatus 100, of determining a coding unit having a size different from the size of the other coding units merely corresponds to an example of determining a coding unit at a certain location by using the sizes of coding units, which are determined based on coordinates of samples, and thus various methods of determining a coding unit at a certain location by comparing the sizes of coding units, which are determined based on coordinates of certain samples, may be used.

The image decoding apparatus 100 may determine the width or height of each of the coding units 660a, 660b, and 660c by using the coordinates (xd, yd) that are information indicating the location of a upper left sample 670a of the left coding unit 660a, the coordinates (xe, ye) that are information indicating the location of a upper left sample 670b of the middle coding unit 660b, and the coordinates (xf, yf) that are information indicating a location of the upper left sample 670c of the right coding unit 660c. The image decoding apparatus 100 may determine the respective sizes of the coding units 660a, 660b, and 660c by using the coordinates (xd, yd), (xe, ye), and (xf, yf) indicating the locations of the coding units 660a, 660b, and 660c.

According to an embodiment, the image decoding apparatus 100 may determine the width of the left coding unit 660a to be xe-xd. The image decoding apparatus 100 may determine the height of the left coding unit 660a to be the height of the current coding unit 650. According to an embodiment, the image decoding apparatus 100 may determine the width of the middle coding unit 660b to be xf-xe. The image decoding apparatus 100 may determine the height of the middle coding unit 660b to be the height of the current coding unit 650. According to an embodiment, the image decoding apparatus 100 may determine the width or height of the right coding unit 660c by using the width or height of the current coding unit 650 or the widths or heights of the left and middle coding units 660a and 660b. The image decoding apparatus 100 may determine a coding unit, which has a size different from that of the others, based on the determined widths and heights of the coding units 660a, 660b, and 660c. Referring to FIG. 6, the image decoding apparatus 100 may determine the middle coding unit 660b, which has a size different from the sizes of the left and right coding units 660a and 660c, as the coding unit of the certain location. However, the above-described method, performed by the image decoding apparatus 100, of determining a coding unit having a size different from the size of the other coding units merely corresponds to an example of determining a coding unit at a certain location by using the sizes of coding units, which are determined based on coordinates of samples, and thus various methods of determining a coding unit at a certain location by comparing the sizes of coding units, which are determined based on coordinates of certain samples, may be used.

However, locations of samples considered to determine locations of coding units are not limited to the above-described upper left locations, and information about arbitrary locations of samples included in the coding units may be used.

According to an embodiment, the image decoding apparatus 100 may select a coding unit at a certain location from among an odd number of coding units determined by splitting the current coding unit, considering the shape of the current coding unit. For example, when the current coding unit has a non-square shape, a width of which is longer than a height, the image decoding apparatus 100 may determine the coding unit at the certain location in a horizontal direction. That is, the image decoding apparatus 100 may determine one of coding units at different locations in a horizontal direction and put a restriction on the coding unit.

When the current coding unit has a non-square shape, a height of which is longer than a width, the image decoding apparatus 100 may determine the coding unit at the certain location in a vertical direction. That is, the image decoding apparatus 100 may determine one of coding units at different locations in a vertical direction and may put a restriction on the coding unit.

According to an embodiment, the image decoding apparatus 100 may use information indicating respective locations of an even number of coding units, to determine the coding unit at the certain location from among the even number of coding units. The image decoding apparatus 100 may determine an even number of coding units by splitting (binary-splitting) the current coding unit, and may determine the coding unit at the certain location by using the information about the locations of the even number of coding units. An operation related thereto may correspond to the operation of determining a coding unit at a certain location (e.g., a center location) from among an odd number of coding units, which has been described in detail above in relation to FIG. 6, and thus detailed descriptions thereof are not provided here.

According to an embodiment, when a non-square current coding unit is split into a plurality of coding units, certain information about a coding unit at a certain location may be used in a splitting operation to determine the coding unit at the certain location from among the plurality of coding units. For example, the image decoding apparatus 100 may use at least one of block shape information and split shape mode information, which is stored in a sample included in a middle coding unit, in a splitting operation to determine a coding unit at a center location from among the plurality of coding units determined by splitting the current coding unit.

Referring to FIG. 6, the image decoding apparatus 100 may split the current coding unit 600 into the plurality of coding units 620*a*, 620*b*, and 620*c* based on the split shape mode information, and may determine the coding unit 620*b* at a center location from among the plurality of the coding units 620*a*, 620*b*, and 620*c*. Furthermore, the image decoding apparatus 100 may determine the coding unit 620*b* at the center location, in consideration of a location from which the split shape mode information is obtained. That is, the split shape mode information of the current coding unit 600 may be obtained from the sample 640 at a center location of the current coding unit 600 and, when the current coding unit 600 is split into the plurality of coding units 620*a*, 620*b*, and 620*c* based on the split shape mode information, the coding unit 620*b* including the sample 640 may be determined as the coding unit at the center location. However, information used to determine the coding unit at the center location is not limited to the split shape mode information, and various types of information may be used to determine the coding unit at the center location.

According to an embodiment, certain information for identifying the coding unit at the certain location may be obtained from a certain sample included in a coding unit to be determined. Referring to FIG. 6, the image decoding apparatus 100 may use the split shape mode information, which is obtained from a sample at a certain location in the current coding unit 600 (e.g., a sample at a center location of the current coding unit 600) to determine a coding unit at a certain location from among the plurality of the coding units 620*a*, 620*b*, and 620*c* determined by splitting the current coding unit 600 (e.g., a coding unit at a center location from among a plurality of split coding units). That is, the image decoding apparatus 100 may determine the sample at the certain location by considering a block shape of the current coding unit 600, may determine the coding unit 620*b* including a sample, from which certain information (e.g., the split shape mode information) can be obtained, from among the plurality of coding units 620*a*, 620*b*, and 620*c* determined by splitting the current coding unit 600, and may put a certain restriction on the coding unit 620*b*. Referring to FIG. 6, according to an embodiment, the image decoding apparatus 100 may determine the sample 640 at the center location of the current coding unit 600 as the sample from which the certain information may be obtained, and may put a certain restriction on the coding unit 620*b* including the sample 640, in a decoding operation. However, the location of the sample from which the certain information may be obtained is not limited to the above-described location, and may include arbitrary locations of samples included in the coding unit 620*b* to be determined for a restriction.

According to an embodiment, the location of the sample from which the certain information may be obtained may be determined based on the shape of the current coding unit 600. According to an embodiment, the block shape information may indicate whether the current coding unit has a square or non-square shape, and the location of the sample from which the certain information may be obtained may be determined based on the shape. For example, the image decoding apparatus 100 may determine a sample located on a boundary for splitting at least one of a width and height of the current coding unit in half, as the sample from which the certain information may be obtained, by using at least one of information about the width of the current coding unit and information about the height of the current coding unit. As another example, when block shape information related to a current coding unit indicates a non-square shape, the image decoding apparatus 100 may determine one of samples being adjacent to a boundary at which a longer side of the current coding unit is split in half, to be a sample from which certain information can be obtained.

According to an embodiment, when the current coding unit is split into a plurality of coding units, the image decoding apparatus 100 may use the split shape mode information to determine a coding unit at a certain location from among the plurality of coding units. According to an embodiment, the image decoding apparatus 100 may obtain the split shape mode information from a sample at a certain location in a coding unit, and may split the plurality of coding units, which are generated by splitting the current coding unit, by using the split shape mode information, which is obtained from the sample of the certain location in each of the plurality of coding units. That is, a coding unit may be recursively split based on the split shape mode information, which is obtained from the sample at the certain location in each coding unit. An operation of recursively splitting a coding unit has been described above in relation to FIG. 5, and thus detailed descriptions thereof will not be provided here.

According to an embodiment, the image decoding apparatus 100 may determine one or more coding units by splitting the current coding unit, and may determine an order of decoding the one or more coding units, based on a certain block (e.g., the current coding unit).

Figure 7:
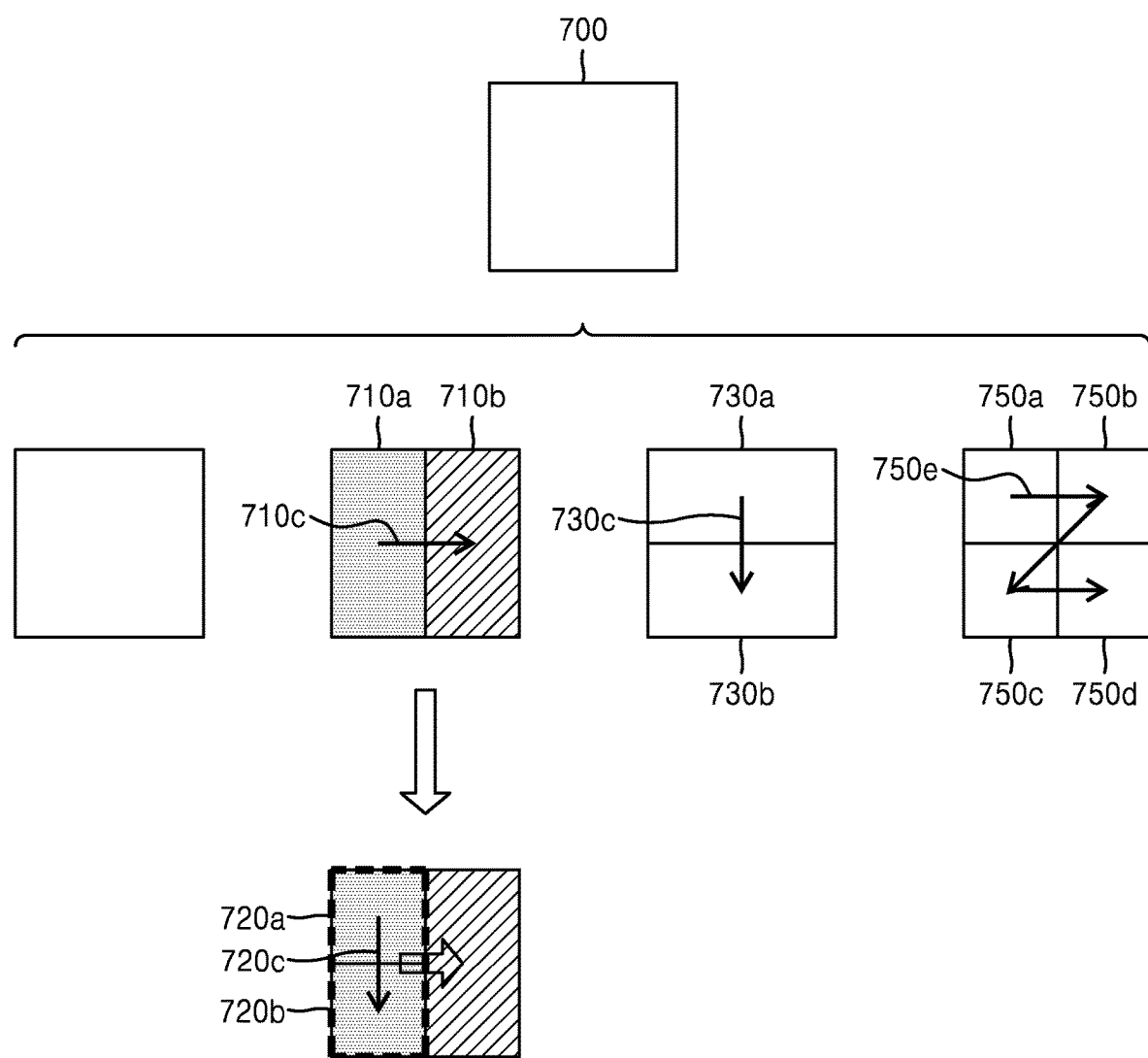
FIG. 7 illustrates an order of processing a plurality of coding units when an image decoding apparatus determines the plurality of coding units by splitting a current coding unit, according to an embodiment of the disclosure.

FIG. 7 illustrates an order of processing a plurality of coding units when the image decoding apparatus 100 determines the plurality of coding units by splitting a current coding unit, according to an embodiment.

According to an embodiment, the image decoding apparatus 100 may determine second coding units 710*a* and 710*b* by splitting a first coding unit 700 in a vertical direction, may determine second coding units 730a and 730b by splitting the first coding unit 700 in a horizontal direction, or may determine second coding units 750a, 750b, 750c, and 750d by splitting the first coding unit 700 in vertical and horizontal directions, based on split shape mode information.

Referring to FIG. 7, the image decoding apparatus 100 may determine to process the second coding units 710a and 710b, which are determined by splitting the first coding unit 700 in a vertical direction, in a horizontal direction order 710c. The image decoding apparatus 100 may determine to process the second coding units 730a and 730b, which are determined by splitting the first coding unit 700 in a horizontal direction, in a vertical direction order 730c. The image decoding apparatus 100 may determine to process the second coding units 750a, 750b, 750c, and 750d, which are determined by splitting the first coding unit 700 in vertical and horizontal directions, in a certain order for processing coding units in a row and then processing coding units in a next row (e.g., in a raster scan order or Z-scan order 750e).

According to an embodiment, the image decoding apparatus 100 may recursively split coding units. Referring to FIG. 7, the image decoding apparatus 100 may determine the plurality of coding units 710a and 710b, 730a and 730b, or 750a, 750b, 750c, and 750d by splitting the first coding unit 700, and may recursively split each of the determined plurality of coding units 710a and 710b, 730a and 730b, or 750a, 750b, 750c, and 750d. A splitting method of the plurality of coding units 710a and 710b, 730a and 730b, or 750a, 750b, 750c, and 750d may correspond to a splitting method of the first coding unit 700. As such, each of the plurality of coding units 710a and 710b, 730a and 730b, or 750a, 750b, 750c, and 750d may be independently split into a plurality of coding units. Referring to FIG. 7, the image decoding apparatus 100 may determine the second coding units 710a and 710b by splitting the first coding unit 700 in a vertical direction, and may determine to independently split or to not split each of the second coding units 710a and 710b.

According to an embodiment, the image decoding apparatus 100 may determine third coding units 720a and 720b by splitting the left second coding unit 710a in a horizontal direction, and may not split the right second coding unit 710b.

According to an embodiment, a processing order of coding units may be determined based on an operation of splitting a coding unit. In other words, a processing order of split coding units may be determined based on a processing order of coding units immediately before being split. The image decoding apparatus 100 may determine a processing order of the third coding units 720a and 720b determined by splitting the left second coding unit 710a, independently of the right second coding unit 710b. Because the third coding units 720a and 720b are determined by splitting the left second coding unit 710a in a horizontal direction, the third coding units 720a and 720b may be processed in a vertical direction order 720c. Because the left and right second coding units 710a and 710b are processed in the horizontal direction order 710c, the right second coding unit 710b may be processed after the third coding units 720a and 720b included in the left second coding unit 710a are processed in the vertical direction order 720c. An operation of determining a processing order of coding units based on a coding unit before being split is not limited to the above-described example, and various methods may be used to independently process coding units, which are split and determined to various shapes, in a certain order.

Figure 8:
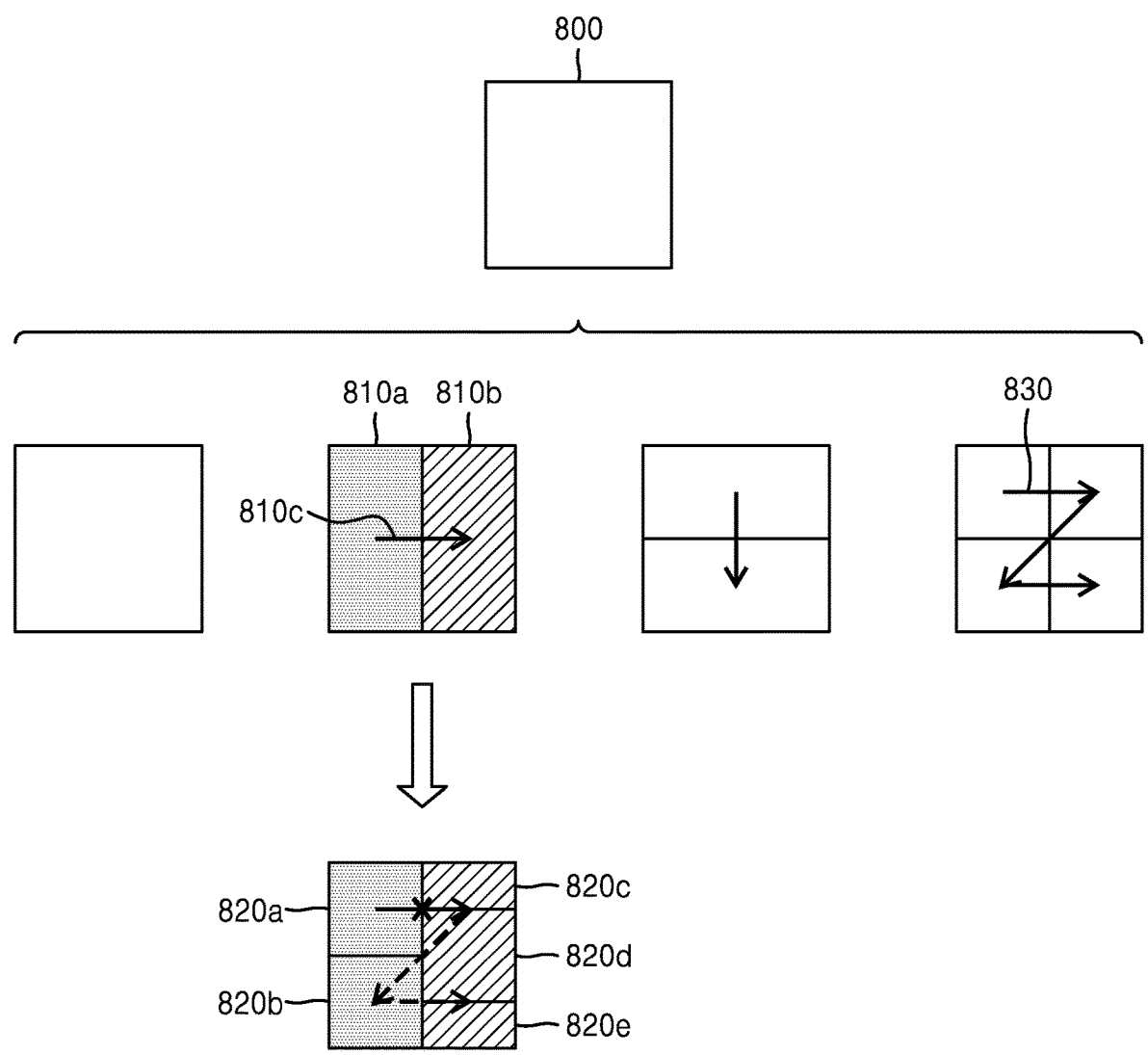
FIG. 8 illustrates a process, performed by an image decoding apparatus, of determining that a current coding unit is to be split into an odd number of coding units, when the coding units are not processable in a certain order, according to an embodiment of the disclosure.

FIG. 8 illustrates a process, performed by the image decoding apparatus 100, of determining that a current coding unit is to be split into an odd number of coding units, when the coding units are not processable in a certain order, according to an embodiment.

According to an embodiment, the image decoding apparatus 100 may determine that the current coding unit is to be split into an odd number of coding units, based on obtained split shape mode information. Referring to FIG. 8, a square first coding unit 800 may be split into non-square second coding units 810a and 810b, and the second coding units 810a and 810b may be independently split into third coding units 820a and 820b, and 820c, 820d, and 820e. According to an embodiment, the image decoding apparatus 100 may determine the plurality of third coding units 820a and 820b by splitting the left second coding unit 810a in a horizontal direction, and may split the right second coding unit 810b into the odd number of third coding units 820c, 820d, and 820e.

According to an embodiment, the image decoding apparatus 100 may determine whether any coding unit is split into an odd number of coding units, by determining whether the third coding units 820a and 820b, and 820c, 820d, and 820e are processable in a certain order. Referring to FIG. 8, the image decoding apparatus 100 may determine the third coding units 820a and 820b, and 820c, 820d, and 820e by recursively splitting the first coding unit 800. The image decoding apparatus 100 may determine whether any of the first coding unit 800, the second coding units 810a and 810b, and the third coding units 820a and 820b, and 820c to 820e are split into an odd number of coding units, based on at least one of the block shape information and the split shape mode information. For example, the right second coding unit 810b among the second coding units 810a and 810b may be split into an odd number of third coding units 820c, 820d, and 820e. A processing order of a plurality of coding units included in the first coding unit 800 may be a certain order (e.g., a Z-scan order 830), and the image decoding apparatus 100 may determine whether the third coding units 820c, 820d, and 820e, which are determined by splitting the right second coding unit 810b into an odd number of coding units, satisfy a condition for processing in the certain order.

According to an embodiment, the image decoding apparatus 100 may determine whether the third coding units 820a and 820b, and 820c to 820e included in the first coding unit 800 satisfy the condition for processing in the certain order, and the condition relates to whether at least one of a width and height of the second coding units 810a and 810b is split in half along a boundary of the third coding units 820a and 820b, and 820c to 820e. For example, the third coding units 820a and 820b determined when the height of the left second coding unit 810a of the non-square shape is split in half may satisfy the condition. It may be determined that the third coding units 820c, 820d, and 820e do not satisfy the condition because the boundaries of the third coding units 820c, 820d, and 820e determined when the right second coding unit 810b is split into three coding units are unable to split the width or height of the right second coding unit 810b in half. When the condition is not satisfied as described above, the image decoding apparatus 100 may determine disconnection of a scan order, and may determine that the right second coding unit 810b is to be split into an odd number of coding units, based on a result of the determination. According to an embodiment, when a coding unit is split into an odd number of coding units, the image decoding apparatus 100 may put a certain restriction on a coding unit at a certain location from among the split coding units. The restriction or the certain location has been described above in relation to various embodiments, and thus detailed descriptions thereof will not be provided herein.

Figure 9:
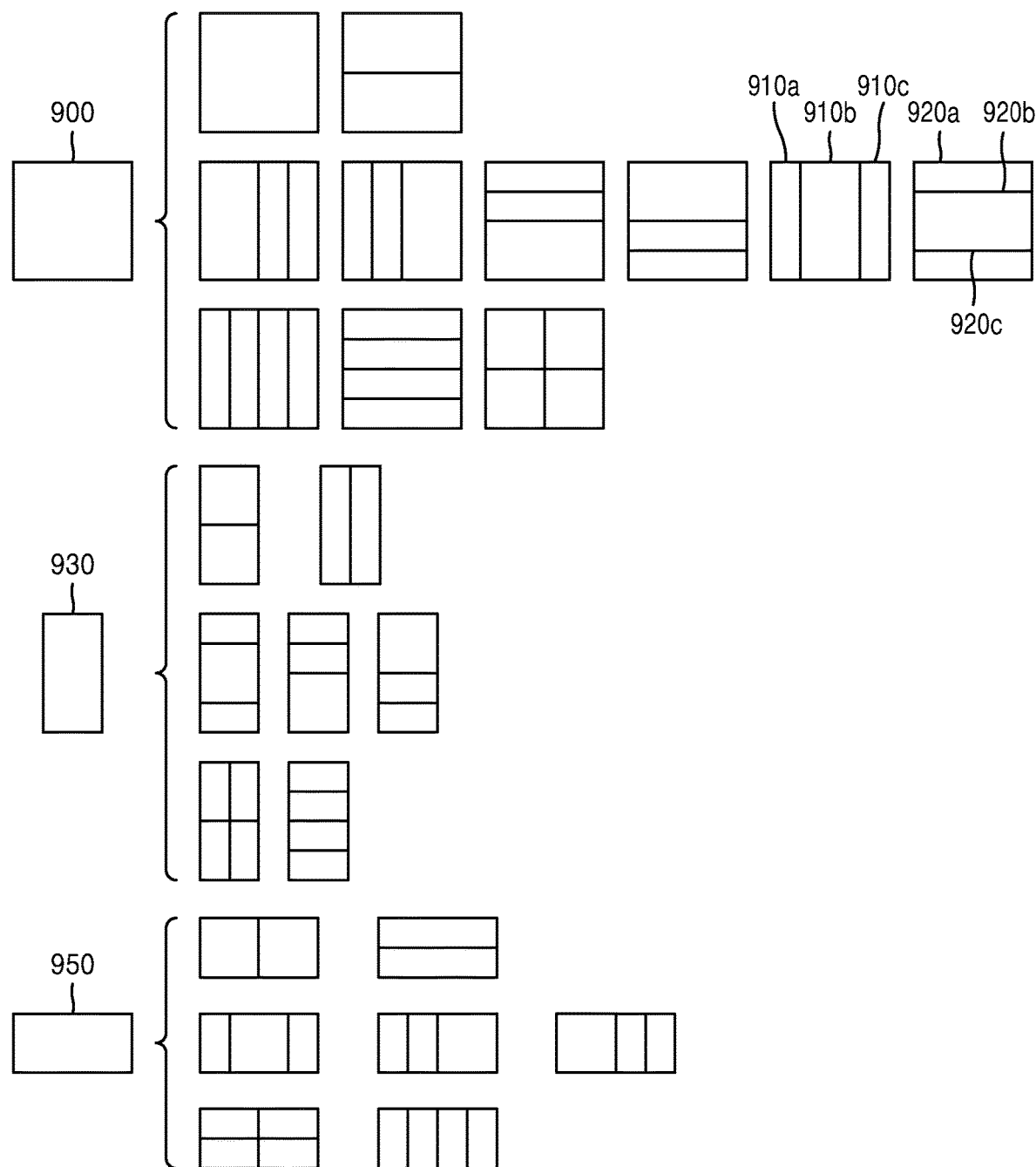
FIG. 9 illustrates a process, performed by an image decoding apparatus, of determining at least one coding unit by splitting a first coding unit, according to an embodiment of the disclosure.

FIG. 9 illustrates a process, performed by the image decoding apparatus 100, of determining at least one coding unit by splitting a first coding unit 900, according to an embodiment.

According to an embodiment, the image decoding apparatus 100 may split the first coding unit 900, based on split shape mode information, which is obtained through a receiver (not shown). The square first coding unit 900 may be split into four square coding units, or may be split into a plurality of non-square coding units. For example, referring to FIG. 9, when the split shape mode information indicates to split the first coding unit 900 into non-square coding units, the image decoding apparatus 100 may split the first coding unit 900 into a plurality of non-square coding units. In detail, when the split shape mode information indicates to determine an odd number of coding units by splitting the first coding unit 900 in a horizontal direction or a vertical direction, the image decoding apparatus 100 may split the square first coding unit 900 into an odd number of coding units, e.g., second coding units 910a, 910b, and 910c determined by splitting the square first coding unit 900 in a vertical direction or second coding units 920a, 920b, and 920c determined by splitting the square first coding unit 900 in a horizontal direction.

According to an embodiment, the image decoding apparatus 100 may determine whether the second coding units 910a, 910b, 910c, 920a, 920b, and 920c included in the first coding unit 900 satisfy a condition for processing in a certain order, and the condition relates to whether at least one of a width and height of the first coding unit 900 is to be split in half along a boundary of the second coding units 910a, 910b, 910c, 920a, 920b, and 920c. Referring to FIG. 9, because boundaries of the second coding units 910a, 910b, and 910c determined by splitting the square first coding unit 900 in a vertical direction do not split the width of the first coding unit 900 in half, it may be determined that the first coding unit 900 does not satisfy the condition for processing in the certain order. In addition, because boundaries of the second coding units 920a, 920b, and 920c determined by splitting the square first coding unit 900 in a horizontal direction do not split the height of the first coding unit 900 in half, it may be determined that the first coding unit 900 does not satisfy the condition for processing in the certain order. When the condition is not satisfied as described above, the image decoding apparatus 100 may decide disconnection of a scan order, and may determine that the first coding unit 900 is split into an odd number of coding units, based on a result of the decision. According to an embodiment, when a coding unit is split into an odd number of coding units, the image decoding apparatus 100 may put a certain restriction on a coding unit at a certain location from among the split coding units. The restriction or the certain location has been described above in relation to various embodiments, and thus detailed descriptions thereof will not be provided herein.

According to an embodiment, the image decoding apparatus 100 may determine various-shaped coding units by splitting a first coding unit.

Referring to FIG. 9, the image decoding apparatus 100 may split the square first coding unit 900 or a non-square first coding unit 930 or 950 into various-shaped coding units.

Figure 10:
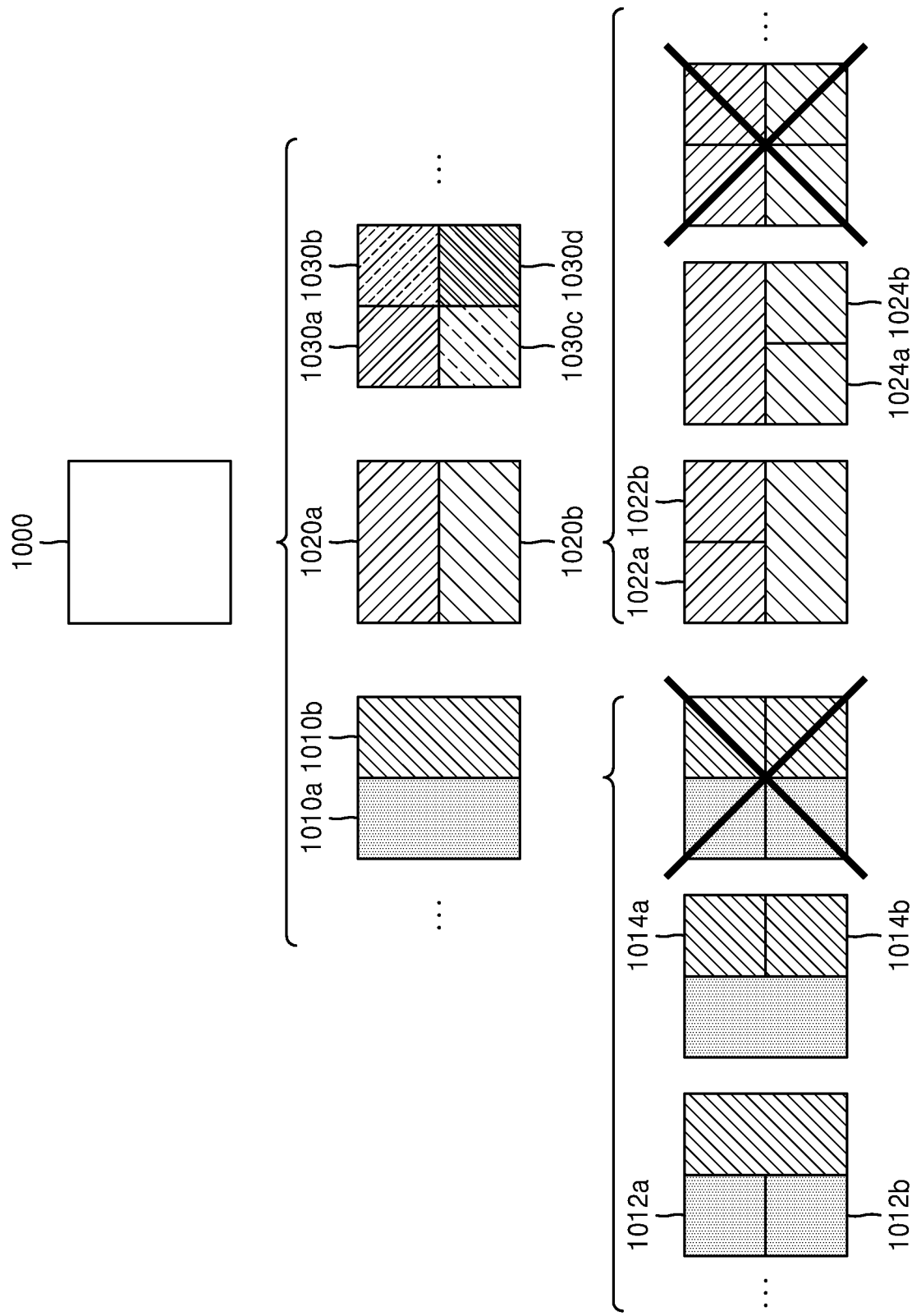
FIG. 10 illustrates that a shape into which a second coding unit is splittable is restricted when the second coding unit having a non-square shape, which is determined when an image decoding apparatus splits a first coding unit, satisfies a certain condition, according to an embodiment of the disclosure.

FIG. 10 illustrates that a shape into which a second coding unit is splittable is restricted when the second coding unit having a non-square shape, which is determined when the image decoding apparatus 100 splits a first coding unit 1000, satisfies a certain condition, according to an embodiment.

According to an embodiment, the image decoding apparatus 100 may determine to split the square first coding unit 1000 into non-square second coding units 1010a, and 1010b or 1020a and 1020b, based on split shape mode information, which is obtained by the receiver (not shown). The second coding units 1010a and 1010b or 1020a and 1020b may be independently split. As such, the image decoding apparatus 100 may determine to split or to not split each of the second coding units 1010a and 1010b or 1020a and 1020b into a plurality of coding units, based on the split shape mode information of each of the second coding units 1010a and 1010b or 1020a and 1020b. According to an embodiment, the image decoding apparatus 100 may determine third coding units 1012a and 1012b by splitting the non-square left second coding unit 1010a, which is determined by splitting the first coding unit 1000 in a vertical direction, in a horizontal direction. However, when the left second coding unit 1010a is split in a horizontal direction, the image decoding apparatus 100 may restrict the right second coding unit 1010b to not be split in a horizontal direction in which the left second coding unit 1010a is split. When third coding units 1014a and 1014b are determined by splitting the right second coding unit 1010b in a same direction, because the left and right second coding units 1010a and 1010b are independently split in a horizontal direction, the third coding units 1012a and 1012b or 1014a and 1014b may be determined. However, this case serves equally as a case in which the image decoding apparatus 100 splits the first coding unit 1000 into four square second coding units 1030a, 1030b, 1030c, and 1030d, based on the split shape mode information, and may be inefficient in terms of image decoding.

According to an embodiment, the image decoding apparatus 100 may determine third coding units 1022a and 1022b or 1024a and 1024b by splitting the non-square second coding unit 1020a or 1020b, which is determined by splitting the first coding unit 1000 in a horizontal direction, in a vertical direction. However, when a second coding unit (e.g., the upper second coding unit 1020a) is split in a vertical direction, for the above-described reason, the image decoding apparatus 100 may restrict the other second coding unit (e.g., the lower second coding unit 1020b) to not be split in a vertical direction in which the upper second coding unit 1020a is split.

Figure 11:
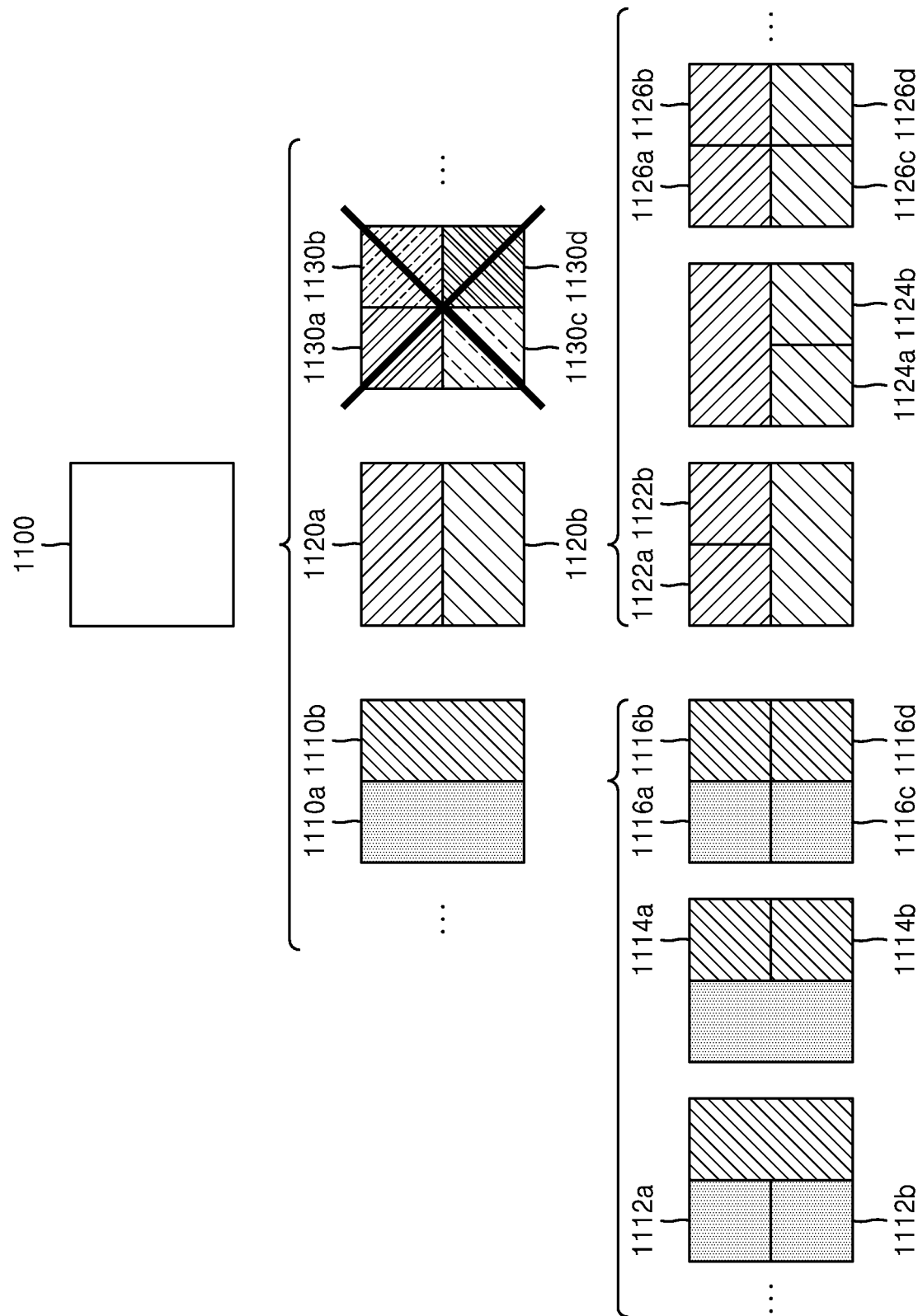
FIG. 11 illustrates a process, performed by an image decoding apparatus, of splitting a square coding unit when split shape mode information is unable to indicate that the square coding unit is split into four square coding units, according to an embodiment of the disclosure.

FIG. 11 illustrates a process, performed by the image decoding apparatus 100, of splitting a square coding unit when split shape mode information is unable to indicate that the square coding unit is split into four square coding units, according to an embodiment.

According to an embodiment, the image decoding apparatus 100 may determine second coding units 1110a and 1110b or 1120a and 1120b, etc. by splitting a first coding unit 1100, based on split shape mode information. The split shape mode information may include information about various methods of splitting a coding unit but, the information about various splitting methods may not include information for splitting a coding unit into four square coding units. According to such split shape mode information, the image decoding apparatus 100 may not split the square first coding unit 1100 into four square second coding units 1130a, 1130b, 1130c, and 1130d. The image decoding apparatus 100 may determine the non-square second coding units 1110a and 1110b or 1120a and 1120b, etc., based on the split shape mode information.

According to an embodiment, the image decoding apparatus 100 may independently split the non-square second coding units 1110a and 1110b or 1120a and 1120b, etc. Each of the second coding units 1110a and 1110b or 1120a and 1120b, etc. may be recursively split in a certain order, and this splitting method may correspond to a method of splitting the first coding unit 1100, based on the split shape mode information.

For example, the image decoding apparatus 100 may determine square third coding units 1112a and 1112b by splitting the left second coding unit 1110a in a horizontal direction, and may determine square third coding units 1114a and 1114b by splitting the right second coding unit 1110b in a horizontal direction. Furthermore, the image decoding apparatus 100 may determine square third coding units 1116a, 1116b, 1116c, and 1116d by splitting both of the left and right second coding units 1110a and 1110b in a horizontal direction. In this case, coding units having the same shape as the four square second coding units 1130a, 1130b, 1130c, and 1130d split from the first coding unit 1100 may be determined.

As another example, the image decoding apparatus 100 may determine square third coding units 1122a and 1122b by splitting the upper second coding unit 1120a in a vertical direction, and may determine square third coding units 1124a and 1124b by splitting the lower second coding unit 1120b in a vertical direction. Furthermore, the image decoding apparatus 100 may determine square third coding units 1126a, 1126b, 1126c, and 1126d by splitting both of the upper and lower second coding units 1120a and 1120b in a vertical direction. In this case, coding units having the same shape as the four square second coding units 1130a, 1130b, 1130c, and 1130d split from the first coding unit 1100 may be determined.

Figure 12:
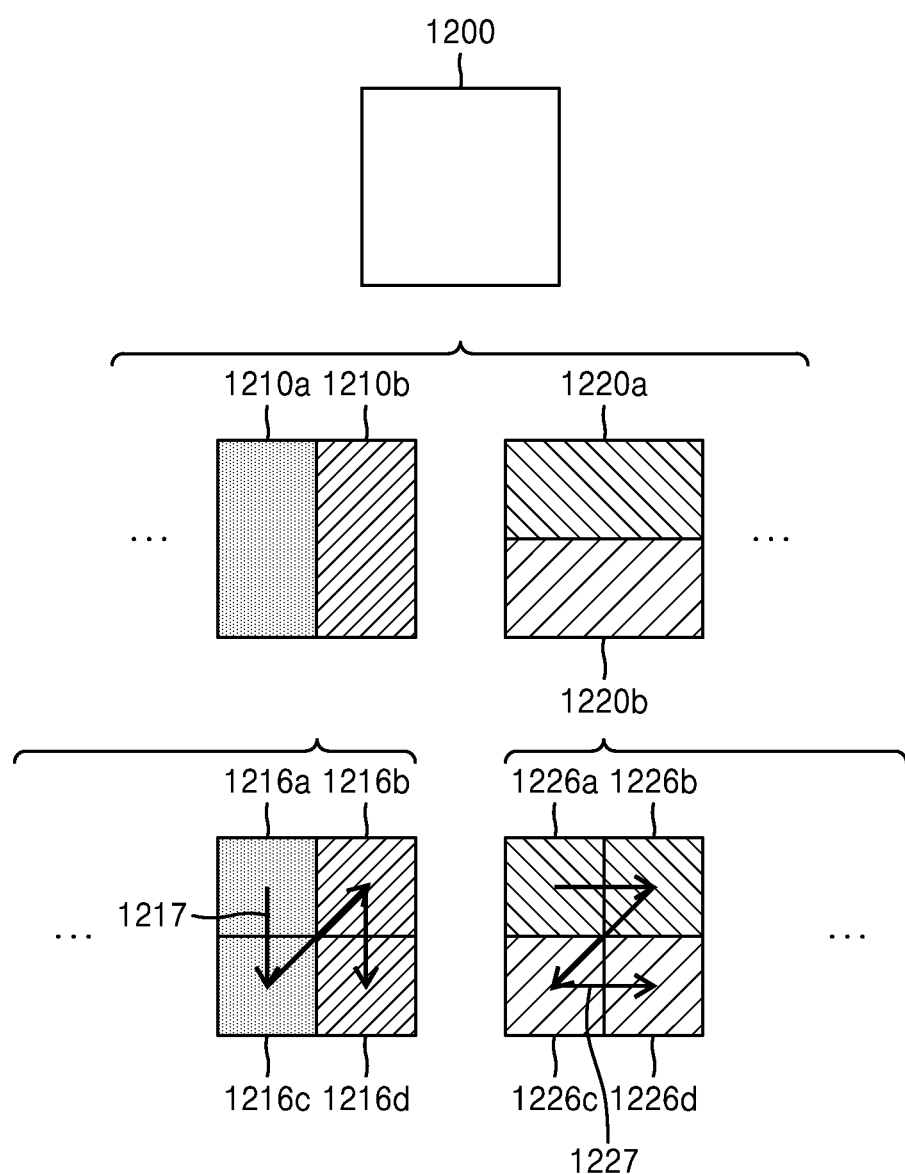
FIG. 12 illustrates that a processing order between a plurality of coding units may be changed depending on a process of splitting a coding unit, according to an embodiment of the disclosure.

FIG. 12 illustrates that a processing order between a plurality of coding units may be changed depending on a process of splitting a coding unit, according to an embodiment.

According to an embodiment, the image decoding apparatus 100 may split a first coding unit 1200, based on split shape mode information. When a block shape indicates a square shape and the split shape mode information indicates to split the first coding unit 1200 in at least one of horizontal and vertical directions, the image decoding apparatus 100 may determine second coding units 1210a and 1210b or 1220a and 1220b, etc. by splitting the first coding unit 1200. Referring to FIG. 12, the non-square second coding units 1210a and 1210b or 1220a and 1220b determined by splitting the first coding unit 1200 in only a horizontal direction or vertical direction may be independently split based on the split shape mode information of each coding unit. For example, the image decoding apparatus 100 may determine third coding units 1216a, 1216b, 1216c, and 1216d by splitting the second coding units 1210a and 1210b, which are generated by splitting the first coding unit 1200 in a vertical direction, in a horizontal direction, and may determine third coding units 1226a, 1226b, 1226c, and 1226d by splitting the second coding units 1220a and 1220b, which are generated by splitting the first coding unit 1200 in a horizontal direction, in a vertical direction. An operation of splitting the second coding units 1210a and 1210b or 1220a and 1220b has been described above in relation to FIG. 11, and thus detailed descriptions thereof will not be provided herein.

According to an embodiment, the image decoding apparatus 100 may process coding units in a certain order. An operation of processing coding units in a certain order has been described above in relation to FIG. 7, and thus detailed descriptions thereof will not be provided herein. Referring to FIG. 12, the image decoding apparatus 100 may determine four square third coding units 1216a, 1216b, 1216c, and 1216d, and 1226a, 1226b, 1226c, and 1226d by splitting the square first coding unit 1200. According to an embodiment, the image decoding apparatus 100 may determine processing orders of the third coding units 1216a, 1216b, 1216c, and 1216d, and 1226a, 1226b, 1226c, and 1226d based on a splitting method of the first coding unit 1200.

According to an embodiment, the image decoding apparatus 100 may determine the third coding units 1216a, 1216b, 1216c, and 1216d by splitting the second coding units 1210a and 1210b generated by splitting the first coding unit 1200 in a vertical direction, in a horizontal direction, and may process the third coding units 1216a, 1216b, 1216c, and 1216d in a processing order 1217 for initially processing the third coding units 1216a and 1216c, which are included in the left second coding unit 1210a, in a vertical direction and then processing the third coding unit 1216b and 1216d, which are included in the right second coding unit 1210b, in a vertical direction.

According to an embodiment, the image decoding apparatus 100 may determine the third coding units 1226a, 1226b, 1226c, and 1226d by splitting the second coding units 1220a and 1220b generated by splitting the first coding unit 1200 in a horizontal direction, in a vertical direction, and may process the third coding units 1226a, 1226b, 1226c, and 1226d in a processing order 1227 for initially processing the third coding units 1226a and 1226b, which are included in the upper second coding unit 1220a, in a horizontal direction and then processing the third coding unit 1226c and 1226d, which are included in the lower second coding unit 1220b, in a horizontal direction.

Referring to FIG. 12, the square third coding units 1216a, 1216b, 1216c, and 1216d, and 1226a, 1226b, 1226c, and 1226d may be determined by splitting the second coding units 1210a and 1210b, and 1220a and 1920b, respectively. Although the second coding units 1210a and 1210b are determined by splitting the first coding unit 1200 in a vertical direction differently from the second coding units 1220a and 1220b which are determined by splitting the first coding unit 1200 in a horizontal direction, the third coding units 1216a, 1216b, 1216c, and 1216d, and 1226a, 1226b, 1226c, and 1226d split therefrom eventually show same-shaped coding units split from the first coding unit 1200. As such, by recursively splitting a coding unit in different manners based on the split shape information, the image decoding apparatus 100 may process a plurality of coding units in different orders even when the coding units are eventually determined to be the same shape.

FIG. 13 illustrates a process of determining a depth of a coding unit when a shape and size of the coding unit change, when the coding unit is recursively split such that a plurality of coding units are determined, according to an embodiment.

According to an embodiment, the image decoding apparatus 100 may determine the depth of the coding unit, based on a certain criterion. For example, the certain criterion may be the length of a long side of the coding unit. When the length of a long side of a coding unit before being split is 2n times (n>0) the length of a long side of a split current coding unit, the image decoding apparatus 100 may determine that a depth of the current coding unit is increased from a depth of the coding unit before being split, by n. In the following description, a coding unit having an increased depth is expressed as a coding unit of a deeper depth.

Referring to FIG. 13, according to an embodiment, the image decoding apparatus 100 may determine a second coding unit 1302 and a third coding unit 1304 of deeper depths by splitting a square first coding unit 1300 based on block shape information indicating a square shape (for example, the block shape information may be expressed as '0: SQUARE'). Assuming that the size of the square first coding unit 1300 is 2N×2N, the second coding unit 1302 determined by splitting a width and height of the first coding unit 1300 in ½ may have a size of N×N. Furthermore, the third coding unit 1304 determined by splitting a width and height of the second coding unit 1302 in ½ may have a size of N/2×N/2. In this case, a width and height of the third coding unit 1304 are ¼ times those of the first coding unit 1300. When a depth of the first coding unit 1300 is D, a depth of the second coding unit 1302, the width and height of which are ½ times those of the first coding unit 1300, may be D+1, and a depth of the third coding unit 1304, the width and height of which are ¼ times those of the first coding unit 1300, may be D+2.

According to an embodiment, the image decoding apparatus 100 may determine a second coding unit 1312 or 1322 and a third coding unit 1314 or 1324 of deeper depths by splitting a non-square first coding unit 1310 or 1320 based on block shape information indicating a non-square shape (for example, the block shape information may be expressed as '1: NS_VER' indicating a non-square shape, a height of which is longer than a width, or as '2: NS_HOR' indicating a non-square shape, a width of which is longer than a height).

The image decoding apparatus 100 may determine a second coding unit 1302, 1312, or 1322 by splitting at least one of a width and height of the first coding unit 1310 having a size of N×2N. That is, the image decoding apparatus 100 may determine the second coding unit 1302 having a size of N×N or the second coding unit 1322 having a size of N×N/2 by splitting the first coding unit 1310 in a horizontal direction, or may determine the second coding unit 1312 having a size of N/2×N by splitting the first coding unit 1310 in horizontal and vertical directions.

According to an embodiment, the image decoding apparatus 100 may determine the second coding unit 1302, 1312, or 1322 by splitting at least one of a width and height of the first coding unit 1320 having a size of 2N×N. That is, the image decoding apparatus 100 may determine the second coding unit 1302 having a size of N×N or the second coding unit 1312 having a size of N/2×N by splitting the first coding unit 1320 in a vertical direction, or may determine the second coding unit 1322 having a size of N×N/2 by splitting the first coding unit 1320 in horizontal and vertical directions.

According to an embodiment, the image decoding apparatus 100 may determine a third coding unit 1304, 1314, or 1324 by splitting at least one of a width and height of the second coding unit 1302 having a size of N×N. That is, the image decoding apparatus 100 may determine the third coding unit 1304 having a size of N/2×N/2, the third coding unit 1314 having a size of N/4×N/2, or the third coding unit 1324 having a size of N/2×N/4 by splitting the second coding unit 1302 in vertical and horizontal directions.

According to an embodiment, the image decoding apparatus 100 may determine the third coding unit 1304, 1314, or 1324 by splitting at least one of a width and height of the second coding unit 1312 having a size of N/2×N. That is, the image decoding apparatus 100 may determine the third coding unit 1304 having a size of N/2×N/2 or the third coding unit 1324 having a size of N/2×N/4 by splitting the second coding unit 1312 in a horizontal direction, or may determine the third coding unit 1314 having a size of N/4×N/2 by splitting the second coding unit 1312 in vertical and horizontal directions.

According to an embodiment, the image decoding apparatus 100 may determine the third coding unit 1304, 1314, or 1324 by splitting at least one of a width and height of the second coding unit 1322 having a size of N×N/2. That is, the image decoding apparatus 100 may determine the third coding unit 1304 having a size of N/2×N/2 or the third coding unit 1314 having a size of N/4×N/2 by splitting the second coding unit 1322 in a vertical direction, or may determine the third coding unit 1324 having a size of N/2×N/4 by splitting the second coding unit 1322 in vertical and horizontal directions.

According to an embodiment, the image decoding apparatus 100 may split the square coding unit 1300, 1302, or 1304 in a horizontal or vertical direction. For example, the image decoding apparatus 100 may determine the first coding unit 1310 having a size of N×2N by splitting the first coding unit 1300 having a size of 2N×2N in a vertical direction, or may determine the first coding unit 1320 having a size of 2N×N by splitting the first coding unit 1300 in a horizontal direction. According to an embodiment, when a depth is determined based on the length of the longest side of a coding unit, a depth of a coding unit determined by splitting the first coding unit 1300 having a size of 2N×2N in a horizontal or vertical direction may be equal to the depth of the first coding unit 1300.

According to an embodiment, a width and height of the third coding unit 1314 or 1324 may be ¼ times those of the first coding unit 1310 or 1320. When a depth of the first coding unit 1310 or 1320 is D, a depth of the second coding unit 1312 or 1322, the width and height of which are ½ times those of the first coding unit 1310 or 1320, may be D+1, and a depth of the third coding unit 1314 or 1324, the width and height of which are ¼ times those of the first coding unit 1310 or 1320, may be D+2.

Figure 14:
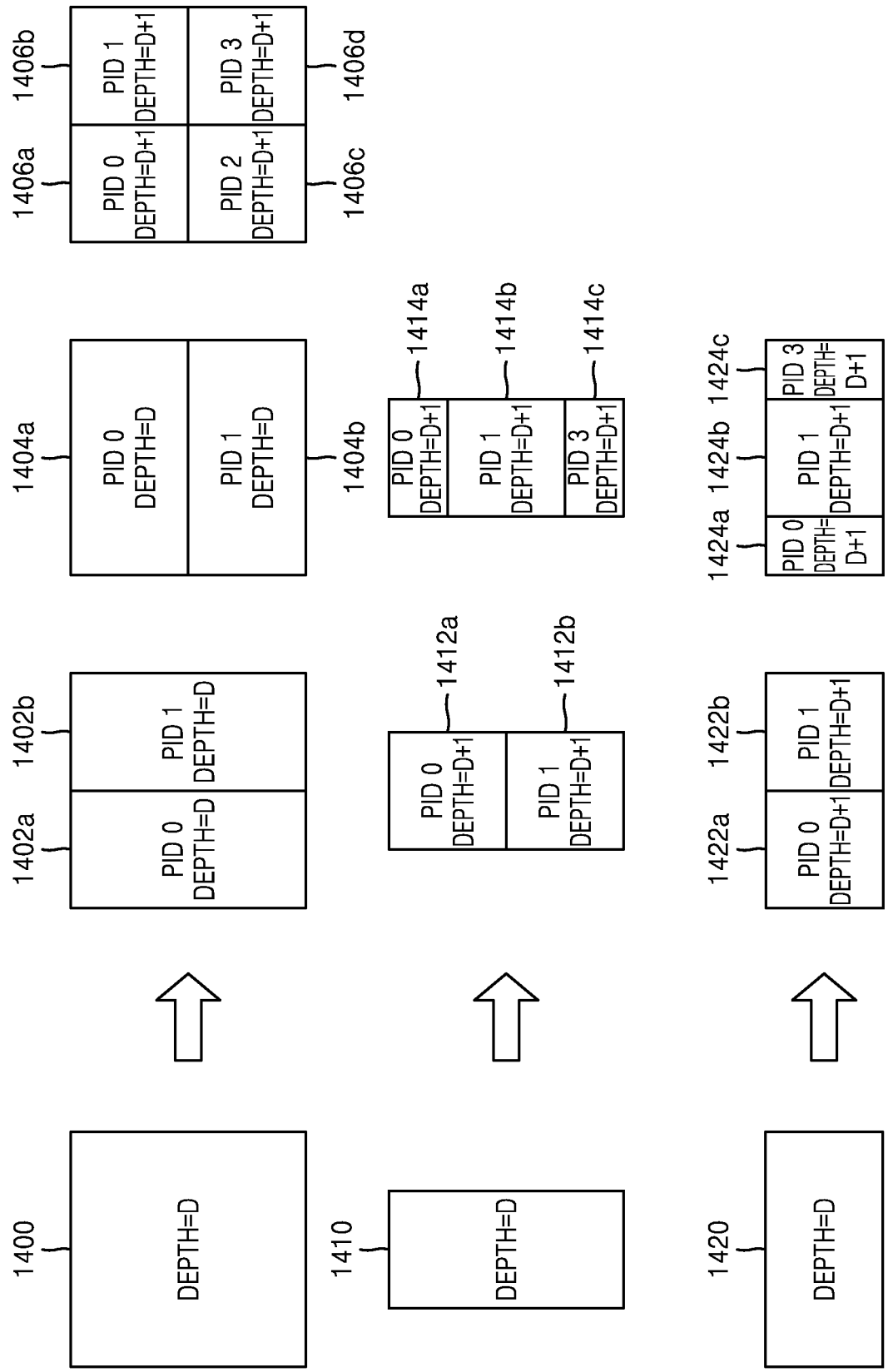
FIG. 14 illustrates depths that are determinable based on shapes and sizes of coding units, and part indexes (PIDs) that are for distinguishing the coding units, according to an embodiment of the disclosure.

FIG. 14 illustrates depths that are determinable based on shapes and sizes of coding units, and part indexes (PIDs) that are for distinguishing the coding units, according to an embodiment.

According to an embodiment, the image decoding apparatus 100 may determine various-shape second coding units by splitting a square first coding unit 1400. Referring to FIG. 14, the image decoding apparatus 100 may determine second coding units 1402a and 1402b, 1404a and 1404b, and 1406a, 1406b, 1406c, and 1406d by splitting the first coding unit 1400 in at least one of vertical and horizontal directions based on split shape mode information. That is, the image decoding apparatus 100 may determine the second coding units 1402a and 1402b, 1404a and 1404b, and 1406a, 1406b, 1406c, and 1406d, based on the split shape mode information of the first coding unit 1400.

According to an embodiment, a depth of the second coding units 1402a and 1402b, 1404a and 1404b, and 1406a, 1406b, 1406c, and 1406d, which are determined based on the split shape mode information of the square first coding unit 1400, may be determined based on the length of a long side thereof. For example, because the length of a side of the square first coding unit 1400 equals the length of a long side of the non-square second coding units 1402a and 1402b, and 1404a and 1404b, the first coding unit 2100 and the non-square second coding units 1402a and 1402b, and 1404a and 1404b may have the same depth, e.g., D. However, when the image decoding apparatus 100 splits the first coding unit 1400 into the four square second coding units 1406a, 1406b, 1406c, and 1406d based on the split shape mode information, because the length of a side of the square second coding units 1406*a*, 1406*b*, 1406*c*, and 1406*d* is ½ times the length of a side of the first coding unit 1400, a depth of the second coding units 1406*a*, 1406*b*, 1406*c*, and 1406*d* may be D+1 which is deeper than the depth D of the first coding unit 1400 by 1.

According to an embodiment, the image decoding apparatus 100 may determine a plurality of second coding units 1412*a* and 1412*b*, and 1414*a*, 1414*b*, and 1414*c* by splitting a first coding unit 1410, a height of which is longer than a width, in a horizontal direction based on the split shape mode information. According to an embodiment, the image decoding apparatus 100 may determine a plurality of second coding units 1422*a* and 1422*b*, and 1424*a*, 1424*b*, and 1424*c* by splitting a first coding unit 1420, a width of which is longer than a height, in a vertical direction based on the split shape mode information.

According to an embodiment, a depth of the second coding units 1412*a* and 1412*b*, and 1414*a*, 1414*b*, and 1414*c*, or 1422*a* and 1422*b*, and 1424*a*, 1424*b*, and 1424*c*, which are determined based on the split shape mode information of the non-square first coding unit 1410 or 1420, may be determined based on the length of a long side thereof. For example, because the length of a side of the square second coding units 1412*a* and 1412*b* is ½ times the length of a long side of the first coding unit 1410 having a non-square shape, a height of which is longer than a width, a depth of the square second coding units 1412*a* and 1412*b* is D+1 which is deeper than the depth D of the non-square first coding unit 1410 by 1.

Furthermore, the image decoding apparatus 100 may split the non-square first coding unit 1410 into an odd number of second coding units 1414*a*, 1414*b*, and 1414*c* based on the split shape mode information. The odd number of second coding units 1414*a*, 1414*b*, and 1414*c* may include the non-square second coding units 1414*a* and 1414*c* and the square second coding unit 1414*b*. In this case, because the length of a long side of the non-square second coding units 1414*a* and 1414*c* and the length of a side of the square second coding unit 1414*b* are ½ times the length of a long side of the first coding unit 1410, a depth of the second coding units 1414*a*, 1414*b*, and 1414*c* may be D+1 which is deeper than the depth D of the non-square first coding unit 1410 by 1. The image decoding apparatus 100 may determine depths of coding units split from the first coding unit 1420 having a non-square shape, a width of which is longer than a height, by using the above-described method of determining depths of coding units split from the first coding unit 1410.

According to an embodiment, the image decoding apparatus 100 may determine PIDs for identifying split coding units, based on a size ratio between the coding units when an odd number of split coding units do not have equal sizes. Referring to FIG. 14, a coding unit 1414*b* of a center location among an odd number of split coding units 1414*a*, 1414*b*, and 1414*c* may have a width equal to that of the other coding units 1414*a* and 1414*c* and a height which is two times that of the other coding units 1414*a* and 1414*c*. That is, in this case, the coding unit 1414*b* at the center location may include two of the other coding unit 1414*a* or 1414*c*. Therefore, when a PID of the coding unit 1414*b* at the center location is 1 based on a scan order, a PID of the coding unit 1414*c* located next to the coding unit 1414*b* may be increased by 2 and thus may be 3. That is, discontinuity in PID values may be present. According to an embodiment, the image decoding apparatus 100 may determine whether an odd number of split coding units do not have equal sizes, based on whether discontinuity is present in PIDs for identifying the split coding units.

According to an embodiment, the image decoding apparatus 100 may determine whether to use a specific splitting method, based on PID values for identifying a plurality of coding units determined by splitting a current coding unit. Referring to FIG. 14, the image decoding apparatus 100 may determine an even number of coding units 1412*a* and 1412*b* or an odd number of coding units 1414*a*, 1414*b*, and 1414*c* by splitting the first coding unit 1410 having a rectangular shape, a height of which is longer than a width. The image decoding apparatus 100 may use PIDs indicating respective coding units so as to identify respective coding units. According to an embodiment, the PID may be obtained from a sample of a certain location of each coding unit (e.g., an upper left sample).

According to an embodiment, the image decoding apparatus 100 may determine a coding unit at a certain location from among the split coding units, by using the PIDs for distinguishing the coding units. According to an embodiment, when the split shape mode information of the first coding unit 1410 having a rectangular shape, a height of which is longer than a width, indicates to split a coding unit into three coding units, the image decoding apparatus 100 may split the first coding unit 1410 into three coding units 1414*a*, 1414*b*, and 1414*c*. The image decoding apparatus 100 may assign a PID to each of the three coding units 1414*a*, 1414*b*, and 1414*c*. The image decoding apparatus 100 may compare PIDs of an odd number of split coding units to determine a coding unit at a center location from among the coding units. The image decoding apparatus 100 may determine the coding unit 1414*b* having a PID corresponding to a middle value among the PIDs of the coding units, as the coding unit at the center location from among the coding units determined by splitting the first coding unit 1410. According to an embodiment, the image decoding apparatus 100 may determine PIDs for distinguishing split coding units, based on a size ratio between the coding units when the split coding units do not have equal sizes. Referring to FIG. 14, the coding unit 1414*b* generated by splitting the first coding unit 1410 may have a width equal to that of the other coding units 1414*a* and 1414*c* and a height which is two times that of the other coding units 1414*a* and 1414*c*. In this case, when the PID of the coding unit 1414*b* at the center location is 1, the PID of the coding unit 1414*c* located next to the coding unit 1414*b* may be increased by 2 and thus may be 3. When the PID is not uniformly increased as described above, the image decoding apparatus 100 may determine that a coding unit is split into a plurality of coding units including a coding unit having a size different from that of the other coding units. According to an embodiment, when the split shape mode information indicates to split a coding unit into an odd number of coding units, the image decoding apparatus 100 may split a current coding unit in such a manner that a coding unit of a certain location among an odd number of coding units (e.g., a coding unit of a center location) has a size different from that of the other coding units. In this case, the image decoding apparatus 100 may determine the coding unit of the center location, which has a different size, by using PIDs of the coding units. However, the PIDs and the size or location of the coding unit of the certain location are not limited to the above-described examples, and various PIDs and various locations and sizes of coding units may be used.

According to an embodiment, the image decoding apparatus 100 may use a certain data unit where a coding unit starts to be recursively split.

Figure 15:
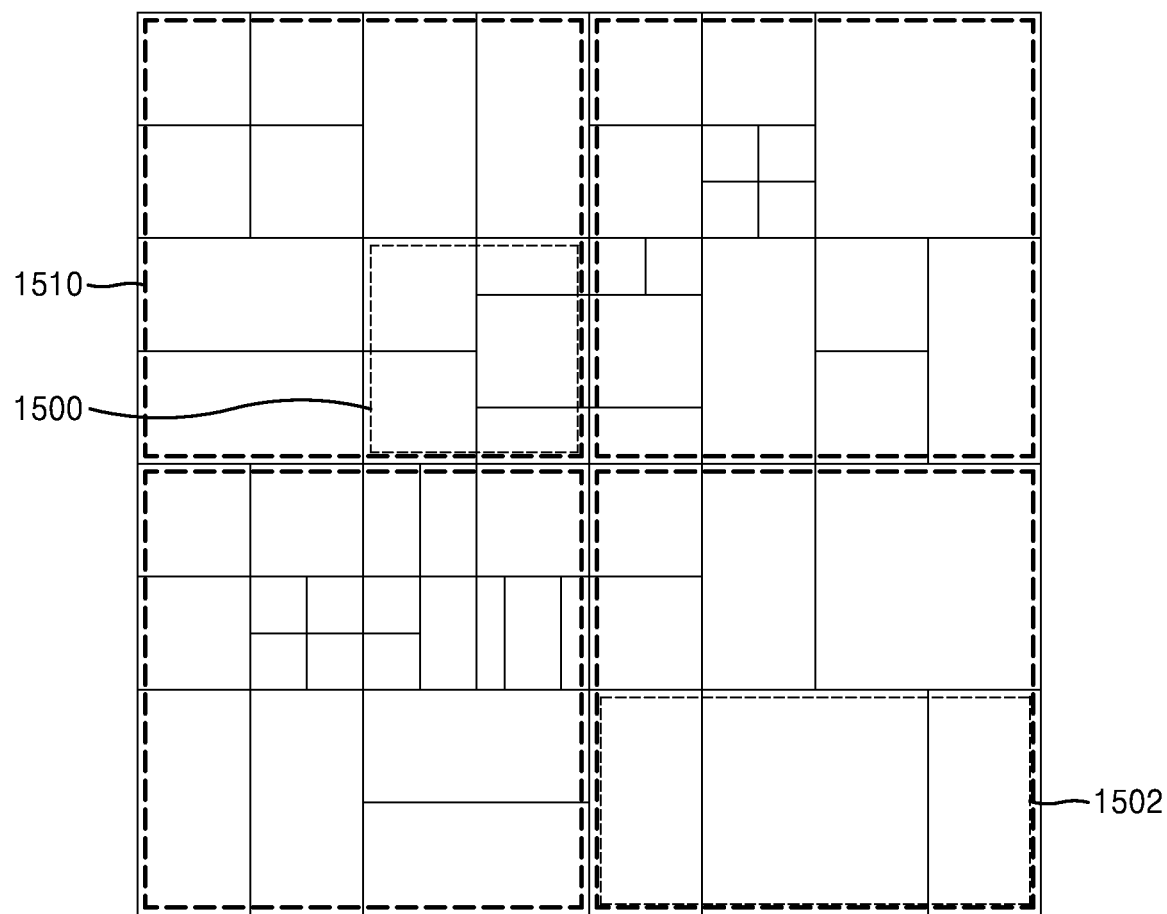
FIG. 15 illustrates that a plurality of coding units are determined based on a plurality of certain data units included in a picture, according to an embodiment of the disclosure.

FIG. 15 illustrates that a plurality of coding units are determined based on a plurality of certain data units included in a picture, according to an embodiment.

According to an embodiment, a certain data unit may be defined as a data unit where a coding unit starts to be recursively split by using split shape mode information. That is, the certain data unit may correspond to a coding unit of an uppermost depth, which is used to determine a plurality of coding units split from a current picture. In the following descriptions, for convenience of explanation, the certain data unit is referred to as a reference data unit.

According to an embodiment, the reference data unit may have a certain size and a certain size shape. According to an embodiment, the reference data unit may include M×N samples. Herein, M and N may be equal to each other, and may be integers expressed as powers of 2. That is, the reference data unit may have a square or non-square shape, and may be split into an integer number of coding units.

According to an embodiment, the image decoding apparatus 100 may split the current picture into a plurality of reference data units. According to an embodiment, the image decoding apparatus 100 may split the plurality of reference data units, which are split from the current picture, by using the split shape mode information of each reference data unit. The operation of splitting the reference data unit may correspond to a splitting operation using a quadtree structure.

According to an embodiment, the image decoding apparatus 100 may previously determine the minimum size allowed for the reference data units included in the current picture. Accordingly, the image decoding apparatus 100 may determine various reference data units having sizes equal to or greater than the minimum size, and may determine one or more coding units by using the split shape mode information with reference to the determined reference data unit.

Referring to FIG. 15, the image decoding apparatus 100 may use a square reference coding unit 1500 or a non-square reference coding unit 1502. According to an embodiment, the shape and size of reference coding units may be determined based on various data units capable of including one or more reference coding units (e.g., sequences, pictures, slices, slice segments, tiles, tile groups, largest coding units, or the like).

According to an embodiment, the receiver (not shown) of the image decoding apparatus 100 may obtain, from a bitstream, at least one of reference coding unit shape information and reference coding unit size information with respect to each of the various data units. An operation of splitting the square reference coding unit 1500 into one or more coding units has been described above in relation to the operation of splitting the current coding unit 300 of FIG. 3, and an operation of splitting the non-square reference coding unit 1502 into one or more coding units has been described above in relation to the operation of splitting the current coding unit 400 or 450 of FIG. 4. Thus, detailed descriptions thereof will not be provided herein.

According to an embodiment, the image decoding apparatus 100 may use a PID for identifying the size and shape of reference coding units, to determine the size and shape of reference coding units according to some data units previously determined based on a certain condition. That is, the receiver (not shown) may obtain, from the bitstream, only the PID for identifying the size and shape of reference coding units with respect to each slice, slice segment, tile, tile group, or largest coding unit which is a data unit satisfying a certain condition (e.g., a data unit having a size equal to or smaller than a slice) among the various data units (e.g., sequences, pictures, slices, slice segments, tiles, tile groups, largest coding units, or the like). The image decoding apparatus 100 may determine the size and shape of reference data units with respect to each data unit, which satisfies the certain condition, by using the PID. When the reference coding unit shape information and the reference coding unit size information are obtained and used from the bitstream according to each data unit having a relatively small size, efficiency of using the bitstream may not be high, and therefore, only the PID may be obtained and used instead of directly obtaining the reference coding unit shape information and the reference coding unit size information. In this case, at least one of the size and shape of reference coding units corresponding to the PID for identifying the size and shape of reference coding units may be previously determined. That is, the image decoding apparatus 100 may determine at least one of the size and shape of reference coding units included in a data unit serving as a unit for obtaining the PID, by selecting the previously determined at least one of the size and shape of reference coding units based on the PID.

According to an embodiment, the image decoding apparatus 100 may use one or more reference coding units included in a largest coding unit. That is, a largest coding unit split from a picture may include one or more reference coding units, and coding units may be determined by recursively splitting each reference coding unit. According to an embodiment, at least one of a width and height of the largest coding unit may be integer times at least one of the width and height of the reference coding units. According to an embodiment, the size of reference coding units may be obtained by splitting the largest coding unit n times based on a quadtree structure. That is, the image decoding apparatus 100 may determine the reference coding units by splitting the largest coding unit n times based on a quadtree structure, and may split the reference coding unit based on at least one of the block shape information and the split shape mode information according to an embodiment.

Figure 16:
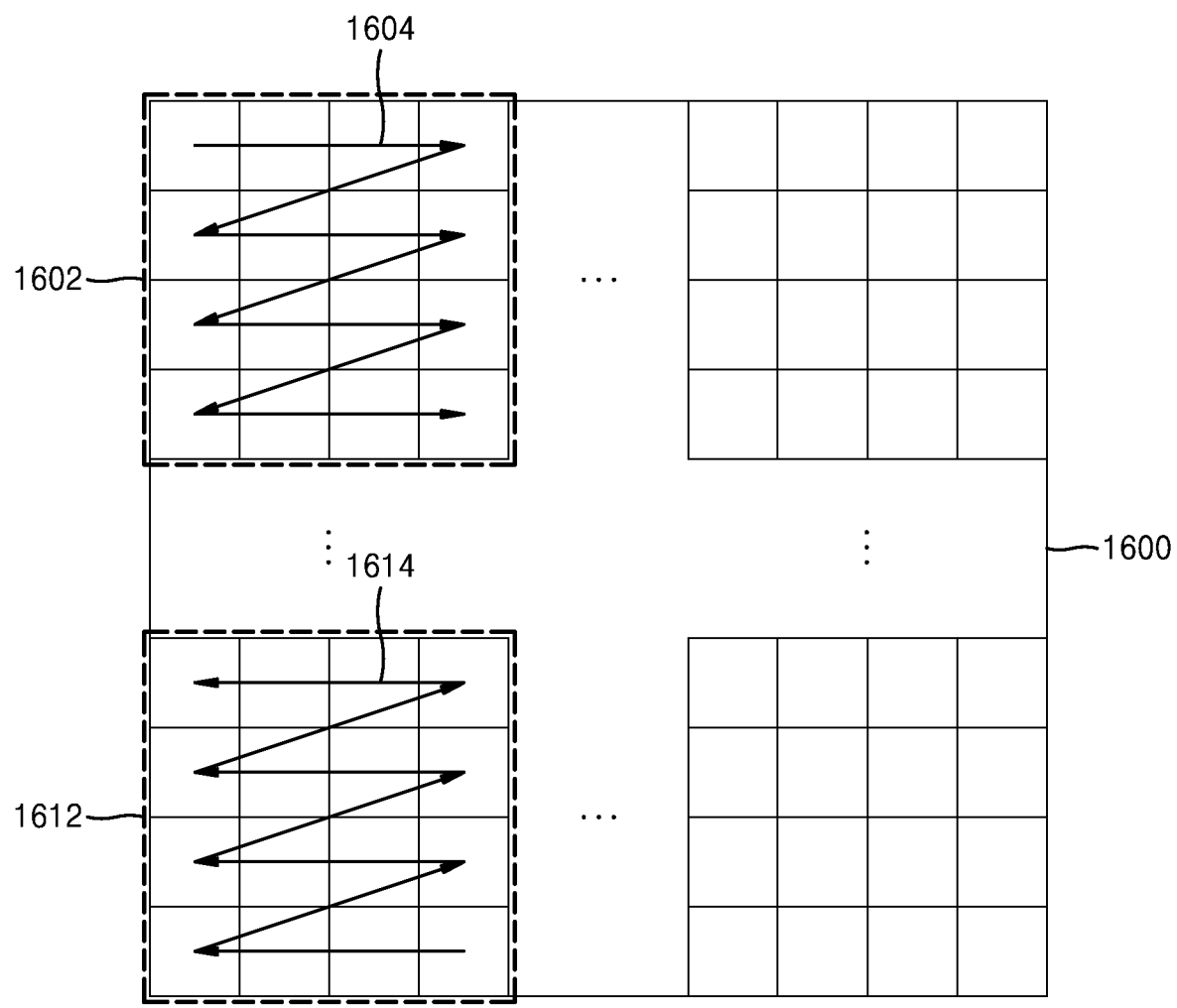
FIG. 16 illustrates a processing block serving as a basis for determining an order of determining reference coding units included in a picture, according to an embodiment of the disclosure.

FIG. 16 illustrates a processing block serving as a unit for determining an order of determining reference coding units included in a picture 1600, according to an embodiment of the disclosure.

According to an embodiment of the disclosure, the image decoding apparatus 100 may determine at least one processing block for splitting a picture. A processing block refers to a data unit including at least one reference coding unit for splitting an image, and the at least one reference coding unit included in the processing block may be determined in a certain order. That is, an order of determining at least one reference coding unit in each processing block may be one of various orders of determining reference coding units, and an order of determining a reference coding unit in each processing block may be different for each processing block. The order of determining a reference coding unit for each processing block may be one of various orders such as a raster scan order, a Z-scan order, an N-scan order, an up-right diagonal scan order, a horizontal scan order, and a vertical scan order but is not limited thereto.

According to an embodiment of the disclosure, the image decoding apparatus 100 may determine a size of at least one processing block included in an image by obtaining processing block size information. The image decoding apparatus 100 may determine the size of the at least one processing block included in the image by obtaining the processing block size information from a bitstream. The size of the at least one processing block may be a size of a data unit indicated by the processing block size information.

According to an embodiment of the disclosure, a receiver (not shown) of the image decoding apparatus 100 may obtain processing block size information in certain data units from the bitstream. For example, the processing block size information may be obtained in data units, such as images, sequences, pictures, slices, slice segments, tiles, and tile groups, from the bitstream. That is, the receiver may obtain processing block size information for each of the data units from the bitstream, and the image decoding apparatus 100 may determine a size of at least one processing block for splitting a picture by using the obtained processing block size information. The size of the at least one processing block may be integer times that of a reference coding unit.

According to an embodiment of the disclosure, the image decoding apparatus 100 may determine a size of processing blocks 1602 and 1612 included in the picture 1600. For example, the image decoding apparatus 100 may determine a size of a processing block, based on the processing block size information obtained from the bitstream. Referring to FIG. 16, according to an embodiment of the disclosure, the image decoding apparatus 100 may determine a width of the processing blocks 1602 and 1612 to be four times a width of a reference coding unit and determine a height of the processing blocks 1602 and 1612 to be four times a height of the reference coding unit. The image decoding apparatus 100 may determine an order of determining at least one reference coding unit in at least one processing block.

According to an embodiment of the disclosure, the image decoding apparatus 100 may determine the processing blocks 1602 and 1612 included in the picture 1600, based on a size of the at least one processing block, and determine an order of determining at least one reference coding unit in the processing blocks 1602 and 1612. According to an embodiment of the disclosure, determining a reference coding unit may include determining a size of a reference coding unit.

According to an embodiment of the disclosure, the image decoding apparatus 100 may obtain information regarding an order of determining at least one reference coding unit included in at least one processing block from a bitstream, and determine an order of determining at least one reference coding unit, based on the obtained information of the order. The information regarding the order may be defined as an order or direction in which reference coding units are determined in a processing block. That is, the order in which the reference coding units are determined may be independently determined for each processing block.

According to an embodiment of the disclosure, the image decoding apparatus 100 may obtain information regarding an order of determining a reference coding unit for each certain data unit from a bitstream. For example, the receiver may obtain the information regarding the order of determining reference coding units for each data unit, such as an image, a sequence, a picture, a slice, a slice segment, or a processing block, from the bitstream. Because the information regarding the order of determining reference coding units indicates an order of determining reference coding units in a processing block, the information regarding the order may be obtained for each certain data unit including an integer number of processing blocks.

According to an embodiment of the disclosure, the image decoding apparatus 100 may determine at least one reference coding unit, based on the order.

According to an embodiment of the disclosure, the receiver may obtain information regarding an order of determining reference coding units as information related to the processing blocks 1602 and 1612 from the bitstream, and the image decoding apparatus 100 may determine an order of determining a reference coding unit included in the processing blocks 1602 and 1612 and determine at least one reference coding unit included in the picture 1600, based on the determination order. Referring to FIG. 16, the image decoding apparatus 100 may determine orders 1604 and 1614 of determining at least one reference coding unit, which are respectively related to the processing blocks 1602 and 1612. For example, when information regarding an order of determining reference coding units is obtained with respect to each processing block, the orders 1604 and 1614 related to the processing blocks 1602 and 1612 may be different with respect to processing blocks. When the order 1604 related to the processing block 1602 is the raster scan order, reference coding units included in the processing block 1602 may be determined according to the raster scan order. When the order 1614 related to the processing block 1612 is reverse to the raster scan order, reference coding units included in the processing block 1612 may be determined according to an order reverse to the raster scan order.

According to an embodiment of the disclosure, the image decoding apparatus 100 may decode at least one determined reference coding unit. The image decoding apparatus 100 may decode an image, based on a reference coding unit determined according to the above-described embodiment. A method of decoding a reference coding unit may include various methods of decoding an image.

According to an embodiment, the image decoding apparatus 100 may obtain, from the bitstream, block shape information indicating the shape of a current coding unit or split shape mode information indicating a splitting method of the current coding unit, and may use the obtained information. The split shape mode information may be included in the bitstream related to various data units. For example, the image decoding apparatus 100 may use the split shape mode information included in a sequence parameter set, a picture parameter set, a video parameter set, a slice header, a slice segment header, a tile header, or a tile group header. Furthermore, the image decoding apparatus 100 may obtain, from the bitstream, a syntax element corresponding to the block shape information or the split shape mode information according to each largest coding unit, each reference coding unit, or each processing block, and may use the obtained syntax element.

Hereinafter, a method of determining a split rule, according to an embodiment of the present disclosure will be described in detail.

The image decoding apparatus 100 may determine a split rule of an image. The split rule may be pre-determined between the image decoding apparatus 100 and the image encoding apparatus 150. The image decoding apparatus 100 may determine the split rule of the image, based on information obtained from a bitstream. The image decoding apparatus 100 may determine the split rule based on the information obtained from at least one of a sequence parameter set, a picture parameter set, a video parameter set, a slice header, a slice segment header, a tile header, and a tile group header. The image decoding apparatus 100 may determine the split rule differently according to frames, slices, temporal layers, largest coding units, or coding units.

The image decoding apparatus 100 may determine the split rule based on a block shape of a coding unit. The block shape may include a size, shape, a ratio of width and height, and a direction of the coding unit. The image encoding apparatus 150 and the image decoding apparatus 100 may determine in advance that the split rule is determined based on the block shape of the coding unit. However, the disclosure is not limited thereto. The image decoding apparatus 100 may determine a split rule based on information obtained from a bitstream received from the image encoding apparatus 150.

The shape of the coding unit may include a square and a non-square. When the lengths of the width and height of the coding unit are equal, the image decoding apparatus 100 may determine the shape of the coding unit to be a square. Also, when the lengths of the width and height of the coding unit are not equal, the image decoding apparatus 100 may determine the shape of the coding unit to be a non-square.

The size of the coding unit may include various sizes, such as 4×4, 8×4, 4×8, 8×8, 16×4, 16×8, and to 256×256. The size of the coding unit may be classified based on the length of a long side of the coding unit, the length of a short side, or the area. The image decoding apparatus 100 may apply the same split rule to coding units classified as the same group. For example, the image decoding apparatus 100 may classify coding units having the same lengths of the long sides as having the same size. Also, the image decoding apparatus 100 may apply the same split rule to coding units having the same lengths of long sides.

The ratio of the width and height of the coding unit may include 1:2, 2:1, 1:4, 4:1, 1:8, 8:1, 1:16, 16:1, or the like. Also, a direction of the coding unit may include a horizontal direction and a vertical direction. The horizontal direction may indicate a case in which the length of the width of the coding unit is longer than the length of the height thereof. The vertical direction may indicate a case in which the length of the width of the coding unit is shorter than the length of the height thereof.

The image decoding apparatus 100 may adaptively determine the split rule based on the size of the coding unit. The image decoding apparatus 100 may differently determine an allowable split shape mode based on the size of the coding unit. For example, the image decoding apparatus 100 may determine whether splitting is allowed based on the size of the coding unit. The image decoding apparatus 100 may determine a split direction according to the size of the coding unit. The image decoding apparatus 100 may determine an allowable split type according to the size of the coding unit.

Determining a split rule based on a size of a coding unit may be a split rule determined in advance between the image encoding apparatus 150 and the image decoding apparatus 100. Also, the image decoding apparatus 100 may determine a split rule based on information obtained from a bitstream.

The image decoding apparatus 100 may adaptively determine the split rule based on a location of the coding unit. The image decoding apparatus 100 may adaptively determine the split rule based on the location of the coding unit in the image.

Also, the image decoding apparatus 100 may determine the split rule such that coding units generated via different splitting paths do not have the same block shape. However, an embodiment is not limited thereto, and the coding units generated via different splitting paths have the same block shape. The coding units generated via the different splitting paths may have different decoding process orders. Because the decoding process orders have been described above with reference to FIG. 12, details thereof are not provided again.

An entropy encoding and decoding process of a coefficient included in image data according to an embodiment of the disclosure will be described in detail with reference to FIGS. 17 to 27 below. The entropy encoding and decoding process according to an embodiment of the disclosure may be performed by the decoder 120 of the image decoding apparatus 100 of FIG. 1A and the encoder 155 of the image encoding apparatus 150 of FIG. 2A or by the processor 125 of the image decoding apparatus 100 of FIG. 1C and the processor 170 of the image encoding apparatus 150 or FIG. 2C. Specifically, the entropy encoding and decoding process according to an embodiment of the disclosure may be performed by the entropy decoder 6150 of the decoder 6000 of FIG. 1B and the entropy encoder 7350 of the encoder 7000 of FIG. 2B.

As described above, the image encoding apparatus 150 according to an embodiment of the disclosure performs encoding using coding units obtained by hierarchically splitting a largest coding unit. A prediction block and a transform block to be used in a prediction process and a transformation process may be determined based on costs independently of other data units. As described above, coding units having a hierarchical structure and included in a largest coding unit, may be recursively encoded to determine an optimal coding unit, so that data units having a tree structure may be configured. That is, coding units having a tree structure, prediction blocks having a tree structure, and transform blocks having a tree structure may be determined for each largest coding unit. For decoding, it is necessary to transmit hierarchical information, which is structural information of data units of a hierarchical structure, and non-hierarchical information for decoding.

Information related to the hierarchical structure is information necessary to determine coding units having a tree structure, prediction blocks having a tree structure, and transform blocks having a tree structure as described above with reference to FIGS. 3 to 16, and includes size information of a largest coding unit, block shape information, split shape mode information, and the like.

Encoding information other than the hierarchical information includes prediction mode information of intra/inter prediction applied to each block, motion vector information, prediction direction information, color component information applied to a corresponding data unit when multiple color components are used, transform coefficient information, and the like. In the following description, hierarchical information and non-hierarchical information may be referred to as syntax elements to be entropy-encoded and decoded.

Residual data in a transform block represents pixel difference values between a prediction block and an original video data block in a pixel domain. The image encoding apparatus 150 may transform the pixel difference values into transform coefficients in a transform domain such as a frequency domain, and quantize the transform coefficients for additional compression. The image encoding apparatus 150 may signal quantized values of the transform coefficients, that is, coefficient levels, as various syntax elements to be described below. In an embodiment of the disclosure, a transformation process may be omitted, and in this case, a coefficient included in a transform block may represent a quantization coefficient obtained by quantizing residual data that has not been transformed.

Embodiments of the disclosure are directed to efficiently entropy-encoding and decoding a level of a coefficient included in a transform block, i.e., size information of the coefficient, among syntax elements. An entropy encoding and decoding process of a coefficient level will be described in detail below.

Figure 17:
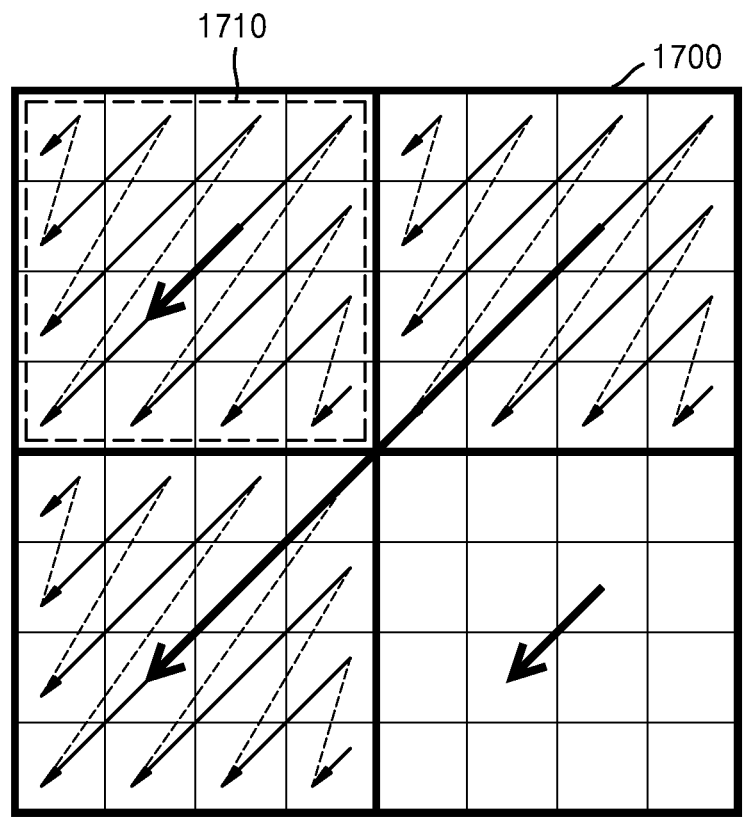
FIG. 17 is a diagram illustrating a transform block to be entropy-coded according to an embodiment of the disclosure.

FIG. 17 is a diagram illustrating a transform block to be entropy-coded according to an embodiment of the disclosure. FIG. 17 illustrates a case in which a transform block 1700 has a size of 8×8, but the size of the transform block 1700 is not limited to 8×8 and the transform block 1700 may have various sizes such as a square shape having a size of 4×4, 16×16, 32×32, 64×64 or 128×128, or a non-square shape having a size of 4×16, 16×4, 8×16, 16×8, 8×32, 32×8, 16×64 or 64×16.

Referring to FIG. 17, coefficients included in the transform block 1700 may be serialized according to a certain scan order and sequentially processed to be entropy encoded and decoded. For example, as illustrated in FIG. 17, the scan order may be a diagonal scan order starting from a leftmost side. Alternatively, the scan order may be a reverse diagonal scan order starting from a lower rightmost side as illustrated in FIG. 17. As another example, the scan order may be a horizontal scan order, a vertical scan order, or a zigzag scan order. Alternatively, the scan order may be set as a direction reverse to the above-described scan orders. However, the scan order is not limited thereto.

For entropy encoding and decoding of coefficients included in the transform block 1700, the transform block 1700 may be split into coefficient groups having smaller sizes. According to an embodiment of the disclosure, as illustrated in FIG. 17, a coefficient group 1710 may correspond to a 4×4 sub-block obtained by splitting the transform block 1700. According to another embodiment of the disclosure, a transform block may be configured with respect to every sixteen consecutive coefficients according to the scan order.

A process of entropy encoding and decoding syntax elements related to levels of the coefficients of the transform block may be processed in units of the coefficient groups. A process of processing coefficient level information will be described below with respect to, for example, a case in which coefficient groups are 4×4 sub-blocks, it will be understood by those of ordinary skill in the art that the disclosure is applicable to other types of coefficient groups.

Figure 18:
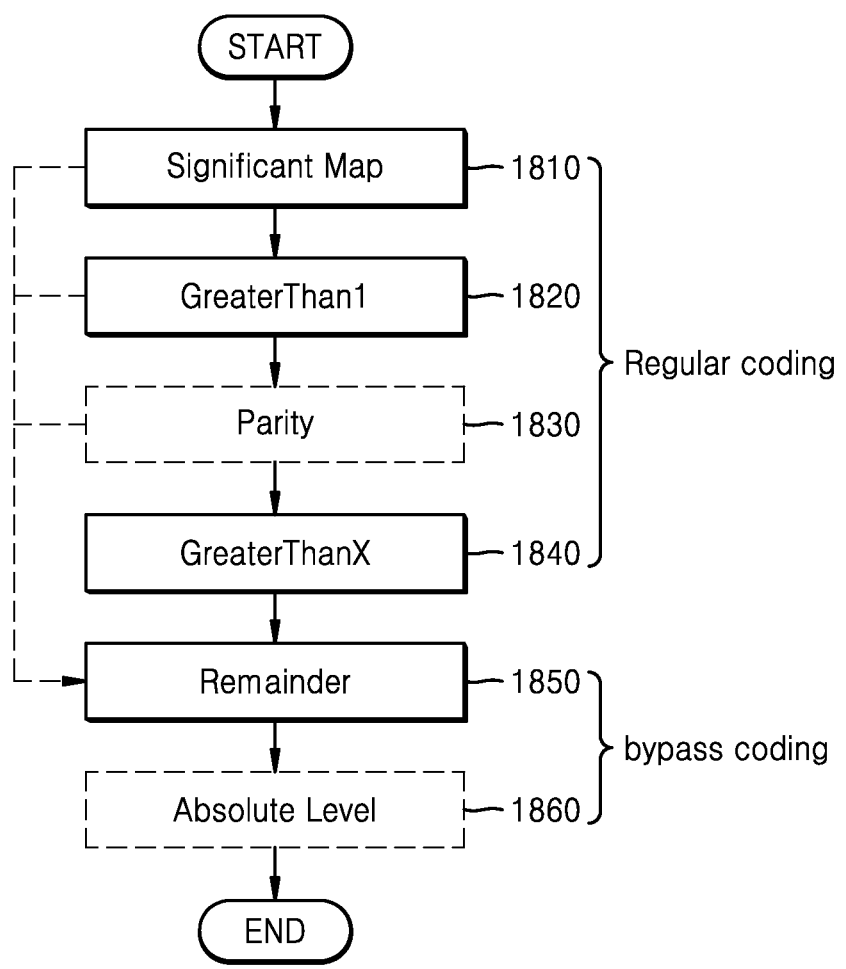
FIG. 18 is a flowchart of a process of entropy-encoding and decoding coefficient level information according to an embodiment of the disclosure.

FIG. 18 is a flowchart of a process of entropy-encoding and decoding coefficient level information according to an embodiment of the disclosure.

Referring to FIG. 18, a size of each coefficient included in a coefficient group may be encoded with at least one piece of level map information indicating whether an absolute value of each coefficient is greater than a certain value and coefficient level information indicating an absolute or relative size value of each coefficient.

Specifically, according to an embodiment of the disclosure, a syntax element sig_flag 1810 indicating whether a coefficient is an effective coefficient, which is a non-zero value, a syntax element gt1_flag 1820 indicating whether an absolute value of the coefficient is greater than 1, a syntax element par_flag 1830 indicating parity of the absolute value of the coefficient, and a syntax element gtX_flag 1840 indicating whether the absolute value of the coefficient is greater than a certain number X may be signaled as level map information. The number X may be determined as a natural number greater than or equal to 3. For example, a syntax element gt3_flag indicating whether the absolute value of the coefficient is greater than 3 may be signaled.

According to another embodiment of the disclosure, the syntax element sig_flag 1810 indicating whether a coefficient is an effective coefficient, which is a non-zero value, the syntax element gt1_flag 1820 indicating whether an absolute value of the coefficient is greater than 1, and the syntax element gtX_flag 1840 indicating whether the absolute value of the coefficient is greater than a certain number X may be signaled as level map information. The number X may be determined as a natural number greater than or equal to 2. For example, a syntax element gt2_flag indicating whether the absolute value of the coefficient is greater than 2 may be signaled.

In addition, a syntax element abs_remainder 1850 indicating a remainder absolute value of the coefficient and a syntax element abs_level 1860 indicating the absolute value of the coefficient may be signaled as coefficient level information. However, embodiments of the disclosure are not limited thereto, and some syntax elements may be omitted or other syntax elements may be added.

In operation 1810, a syntax element sig_flag that is a significant map indicating whether coefficients included in a coefficient group are effective coefficients, which are non-zero values, may be determined. A value of the syntax element sig_flag may be determined to be 1 with respect to coefficients that are non-zero values.

In operation 1820, in the case of an effective coefficient for which the syntax element sig_flag has a value of 1, a syntax element gt1_flag that is a flag indicating whether an absolute value of the coefficient is greater than 1 may be determined. When the syntax element gt1_flag is 1, the absolute value of the coefficient is greater than 1. When the syntax element gt1_flag is 0, the absolute value of the coefficient is 1. When, in operation 1810, the syntax element sig_flag has a value of 0, the syntax element gt1_flag for a corresponding coefficient is not signaled and is regarded as 0.

In operation 1830, in the case of an effective coefficient for which the syntax element gt1_flag has a value of 1, a syntax element par_flag that is a flag indicating parity of the coefficient may be set. When the syntax element par_flag is 1, the absolute value of the coefficient is an odd number. When the syntax element par_flag is 0, the absolute value of the coefficient is an even number. When, in operation 1820, the syntax element gt1_flag has a value of 0, the syntax element par_flag for a corresponding coefficient is not signaled and is regarded as 0. In an embodiment of the disclosure, operation 1830 may be omitted.

In operation 1840, in the case of an effective coefficient for which the syntax element gt1_flag has a value of 1, a syntax element gtX_flag that is a flag indicating whether an absolute value of the coefficient is greater than a certain value X may be set.

In an embodiment of the disclosure, when the syntax element par_flag is signaled, the number X may be a natural number greater than or equal to 3. For example, when the syntax element par_flag is signaled, the syntax element gt3_flag indicating whether the absolute value of the coefficient is greater than 3 may be signaled. When the syntax element gt3_flag is 1, the absolute value of the coefficient is greater than 4 when the syntax element par_flag is 1, and is 4 when the syntax element par_flag is 0. When the syntax element gt3_flag is 0, the absolute value of the coefficient is 3 when the syntax element par_flag is 1, and is 2 when the syntax element par_flag is 0.

In another embodiment of the disclosure, when the syntax element par_flag is not signaled, the number X may be a natural number greater than or equal to 2. For example, when the syntax element par_flag is not signaled, the syntax element gt2_flag indicating whether the absolute value of the coefficient is greater than 2 may be signaled. When the syntax element gt2_flag is 1, the absolute value of the coefficient is greater than 2. When the syntax element gt2_flag is 0, the absolute value of the coefficient is 2.

When, in operation 1820, the syntax element gt1_flag has a value of 0, the syntax element gtX_flag for a corresponding coefficient is not signaled and is regarded as 0.

In an embodiment, after operation 1840 and before operation 1850, one or more flags not shown in FIG. 18, e.g., a syntax element gtn_flag indicating whether an absolute value of a coefficient is greater than n (n is a natural number greater than X), may be further signaled. For example, when the syntax element par_flag is signaled, syntax elements gt5_flag, gt7_flag, and gt9_flag indicating whether absolute values of coefficients are greater than 5, 7, and 9 may be further signaled, in addition to the syntax element gt3_flag signaled in operation 1840. As another example, when the syntax element par_flag is not signaled, syntax elements gt3_flag, gt4_flag, and gt5_flag indicating whether absolute values of coefficients are greater than 3, 4, and 5 may be further signaled, in addition to the syntax element gt2_flag signaled in operation 1840.

In an embodiment of the disclosure, the number of syntax elements to be signaled in operations 1810 to 1840 may be limited. In this case, when the number of signaled syntax elements exceeds a limit value, the performance of operations 1810 to 1840 may be stopped or omitted and operation 1850 may be proceeded to.

In operation 1850, a syntax element abs_remainder indicating a remainder absolute value of the coefficient may be set for coefficients that have not been encoded in previous operations. The syntax element abs_remainder has a difference value between an absolute value of a coefficient and a base level. The base level refers to a value that has already been encoded with the syntax elements in operations 1810 to 1840, that is, a minimum absolute value that a corresponding coefficient may have.

In an embodiment of the disclosure, the base level may be determined based on the syntax elements determined in operations 1810 to 1840, that is, the level map information indicating whether an absolute value of a coefficient is greater than a certain value. In an embodiment of the disclosure, the base level may be determined based on whether the syntax elements in operations 1810 to 1840 are signaled.

In operation 1860, a syntax element abs_level indicating an absolute value of a coefficient may be set for coefficients that have not been encoded in previous operations. For example, when all of the syntax elements sig_flag, gtX_flag, par_flag, and gtX_flag are not signaled due to a limit on the number of syntax elements to be signaled, all of the absolute values of the coefficients may be signaled as the syntax element abs_level. In an embodiment of the disclosure, operation 1860 may be omitted.

Figure 19:
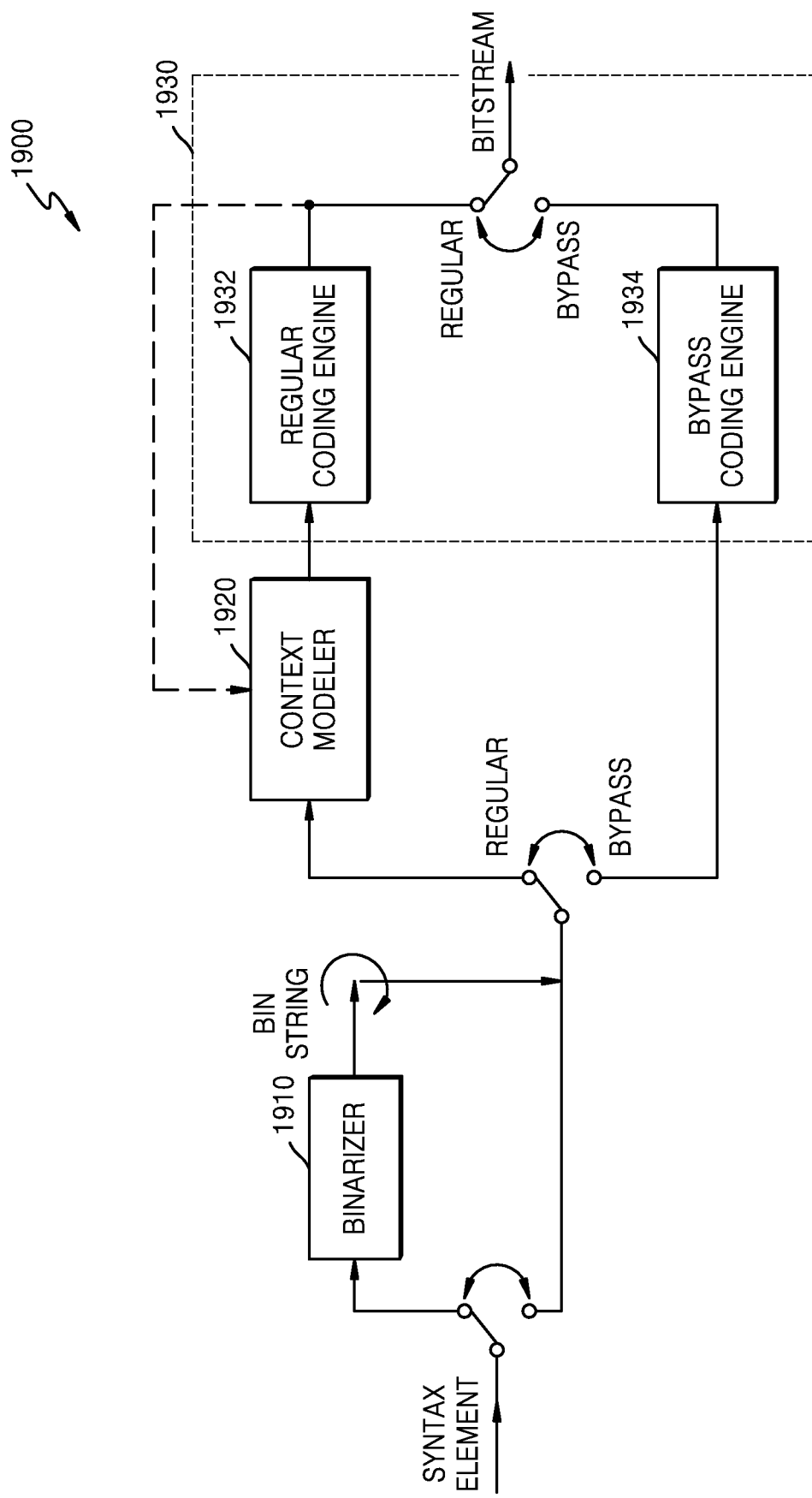
FIG. 19 is a block diagram illustrating a configuration of an entropy-encoding apparatus according to an embodiment of the disclosure.

FIG. 19 is a block diagram illustrating a configuration of an entropy-encoding apparatus according to an embodiment of the disclosure. An entropy encoding apparatus 1900 of FIG. 19 corresponds to the entropy encoder 7350 of the image encoder 7000 of FIG. 2B.

Referring to FIG. 19, the entropy encoding apparatus 1900 according to an embodiment of the disclosure includes a binarizer 1910, a context modeler 1920, and a binary arithmetic coder 1930. The binary arithmetic coder 1930 includes a regular coding engine 1932 and a bypass coding engine 1934.

Because syntax elements input to the entropy encoding apparatus 1900 may not be binary values, the binarizer 1910 binarizes the syntax elements and outputs a bin string consisting of binary values of 0 or 1, when the syntax elements are not binary values. A bin represents each bit of a stream consisting of 0 or 1, and a set of bins may be referred to as a bin string. The binarizer 1910 maps values of syntax elements to bins of 0 and 1 by applying one of fixed length binarization, truncated Rice binarization, k-order exp-Golomb binarization, and Golomb binarization, and Golomb-Rice binarization according to the types of the syntax elements, and outputs the syntax elements.

The binarizer 1910 according to an embodiment of the disclosure may determine a Rice parameter for Golomb-Rice binarizing syntax elements abs_remainder and abs_level that represent absolute or relative values of coefficients. A method of determining the Rice parameter will be described in detail below.

A process of Golomb-Rice binarizing a syntax element, e.g., the syntax element abs_remainder, by the binarizer 1910 when the Rice parameter is determined will be described below. The binarizer 1910 obtains a parameter cTrMax according to an equation: cTrMax=4<<cRiceParam by using a determined Rice parameter cRiceParam. The parameter cTrMax is used as a criterion for dividing the syntax element abs_remainder into a prefix and a suffix.

The binarizer 1910 obtains a prefix having a value not exceeding the parameter cTrMax and a suffix indicating a portion exceeding the parameter cTrMax by dividing the value of the syntax element abs_remainder, based on the parameter cTrMax. The binarizer 1910 determines the prefix to be in a range not exceeding cTrMax according to an equation: Prefix=Min (cTrMax, abs_remainder). The suffix exists only when the current syntax element abs_remainder has a value greater than cTrMax. The suffix is a value corresponding to (abs_remainder-cTrMax). Only the prefix exists when the value of the syntax element abs_remainder does not exceed cTrMax. For example, when the value of the syntax element abs_remainder is 10 and the parameter cTrMax is 7, the syntax element abs_remainder is divided into a prefix having a value of 7 and a suffix having a value of 3. As another example, when the value of the syntax element abs_remainder is 6 and the parameter cTrMax is 7, the syntax element abs_remainder is classified as a prefix having a value of 6 and does not include a suffix.

When the prefix and the suffix are determined by dividing the value of the syntax element abs_remainder, based on the parameter cTrMax, the binarizer 1910 binarizes the prefix and the suffix according to a predetermined binarization method and outputs a bit string corresponding to the prefix and a bit string corresponding to the suffix. For example, the binarizer 1910 may binarize a prefix having a value corresponding to Min(cTrMax, abs_remainder) according to a truncated unary binarization method and output a bit string, and may binarize a suffix having a value corresponding to (abs_remainder-cTrMax) according to a $k^{th}$ exponential Golomb binarization method and output a bit string. A value of k may be determined using a determined Rice parameter cRiceParam. For example, the value of k may be cRiceParam+1.

The binarizer 1910 may generate a bit string corresponding to a prefix and a bit string corresponding to a suffix, based on a table set in advance according to the Rice parameter cRiceParam (look-up table method). When the look-up table method is used, the table may be set in advance such that as a value of the parameter cRiceParam increases, a length of a bit string corresponding to a larger value decreases.

Bins output from the binarizer 1910 are arithmetic-coded by the regular coding engine 1932 or the bypass coding engine 1934. When the bins obtained by binarizing the syntax elements are uniformly distributed, that is, when the bins are data in which the frequencies of 0 and 1 are the same, the bins are output to and encoded by the bypass coding engine 1934 that does not use a probability value. Whether a current bin is to be arithmetically coded by the regular coding engine 1932 or the bypass coding engine 1934 may be determined in advance according to the type of a syntax element.

The context modeler 1920 provides the regular coding engine 1932 with a probability model for coding a bit string corresponding to the syntax element. Specifically, the context modeler 1920 adaptively predicts a probability of occurrence of a binary value for coding each binary value of a bit string of a current syntax element based on the context, and outputs information regarding the predicted probability of occurrence to the regular coding engine 1932.

A context model is a probability model with respect to a bin, and includes information indicating whether 0 or 1 corresponds to a Most Probable Symbol (MPS) or a Least Probable Symbol (LPS) and a probability of MPS or LPS.

The regular coding engine 1932 performs binary arithmetic coding on the bit string corresponding to the current syntax element, based on information regarding the MPS and the LPS and information regarding the probability of MPS or LPS, which are provided from the context modeler 1920.

In an embodiment of the disclosure, among syntax elements related to coefficient levels, context-adaptive binary arithmetic coding (CABAC) may be performed on flags having only a value of 0 or 1, that is, syntax elements sig_flag, gt1_flag, par_flag, and gtX_flag, through regular coding. In an embodiment of the disclosure, among the syntax elements related to coefficient levels, syntax elements abs_remainder and abs_level and the like, which may have values other than 0 and 1, may be binarized and bypass coded.

A process of entropy encoding level information of coefficients included in a transform block according to an embodiment of the disclosure will be described in detail with reference to FIGS. 20 to 24 below.

FIG. 20 is a diagram illustrating level information of coefficients included in a transform block according to an embodiment of the disclosure.

Referring to FIG. 20, it is assumed that coefficients included in a coefficient group in the form of a 4×4 sub-block have an absolute value abs_level 2000. The absolute value abs_level 2000 may be an absolute value obtained by transforming residual data into a transform coefficient and quantizing the transform coefficient. Alternatively, the absolute value abs_level 2000 may be an absolute value obtained by quantizing residual data that has not been transformed. The coefficients included in the coefficient group may be sequentially processed according to a certain scan order as illustrated in FIG. 20.

According to an embodiment of the disclosure, as described above, a size of each coefficient included in the coefficient group may be represented using a syntax element sig_flag 2010 indicating whether the coefficient is an effective coefficient other than 0, a syntax element gt1_flag 2020 indicating whether an absolute value of the coefficient is greater than 1, a syntax element par_flag 2030 indicating parity of the absolute value of the coefficient, a syntax element gt3_flag 2040 indicating whether the absolute value of the coefficient is greater than 3, a syntax element abs_remainder 2050 indicating a remainder absolute value of the coefficient, and the syntax element abs_level 2000 indicating the absolute value of the coefficient.

For effective coefficients other than 0 among the coefficients included in the coefficient group, a value of the syntax element sig_flag 2010 is set to 1. When the coefficient is not an effective coefficient, that is, when the coefficient is 0, the syntax element sig_flag 2010 is signaled as 0.

For an effective coefficient for which the syntax sig_flag 2010 has a value of 1 among the coefficients included in the coefficient group, the value of the syntax element gt1_flag 2020 may be set to 1 when the coefficient has an absolute value greater than 1. That is, the syntax element gt1_flag 2020 for a coefficient having an absolute value of 1 is signaled as 0. For a coefficient for which the syntax element sig_flag 2010 is 0, the syntax element gt1_flag 2020 is not signaled.

A value of the syntax element par_flag 2030 indicating parity of the absolute value of the coefficient may be set for a coefficient for which the syntax element gt1_flag 2020 has a value of 1 among the coefficients included in the coefficient group. The syntax element par_flag 2030 is set to 1 when the absolute value of the coefficient is an odd number, and is set to 0 when the absolute value of the coefficient is an even number. For a coefficient for which the syntax element gt1_flag 2020 is 0, the syntax element par_flag 2030 is not signaled.

A value of the syntax element gt3_flag 2040 may be set for a coefficient for which the syntax element gt1_flag 2020 has a value of 1 among the coefficients included in the coefficient group. When the syntax element par_flag 2030 is signaled, the syntax element gt3_flag 2040 may indicate that the absolute value of the coefficient is greater than 3 or 4 according to the value of the syntax element par_flag 2030. When the coefficient is 2 or 3, the syntax element gt3_flag 2040 is signaled as 0, when the coefficient is 2, the syntax element par_flag 2030 is signaled as 0, and when the coefficient is 3, the syntax element par_flag 2030 is signaled as 1. When the coefficient is greater than 3, the syntax element gt3_flag 2040 is signaled as 1, and the syntax element par_flag 2030 is signaled as 0 or 1 according to the parity of the coefficient. For a coefficient for which the syntax element gt1_flag 2020 is 0, the syntax element gt3_flag 2040 is not signaled.

For a coefficient for which the syntax element gt3_flag 2040 has a value of 1 among the coefficients included in the coefficient group, a remainder absolute value of the coefficient may be set as the syntax element abs_remainder 2050. When the syntax element gt3_flag 2040 has a value of 1, a minimum absolute value of the coefficient is 4 and thus a base level may be determined to be 4. Therefore, the remainder absolute value of the coefficient is a value obtained by subtracting 4 from a level of the coefficient. However, because the syntax element par_flag 2030 represents the parity of the absolute value, it is sufficient to signal a value obtained by dividing the remainder absolute value of the coefficient in half. In this case, the value of the syntax element abs_remainder 2050 may be determined by an equation: abs_remainder=(abs_level−4)>>1. For a coefficient for which the syntax element gt3_flag 2040 is 0, the syntax element abs_remainder 2050 is not signaled.

Through the above-described process, syntax elements representing coefficient levels are determined and encoded by the entropy encoder 7350, and are transmitted in a bitstream. The entropy decoder 6150 may parse the values of the syntax elements from the bitstream and decode the parsed values to reconstruct a coefficient level abs_level according to an equation: abs_level=sig_flag+gt1_flag+par_flag+2*gt3_flag+2*abs_remainder.

In an embodiment of the disclosure, all the absolute values of the coefficient may be signaled as the syntax element abs_level 2000 with respect to a coefficient for which all or some of the above-described syntax elements sig_flag, gt1_flag, par_flag, gt3_flag, and abs_remainder among the coefficients included in the coefficient group are not signaled.

Figure 21:
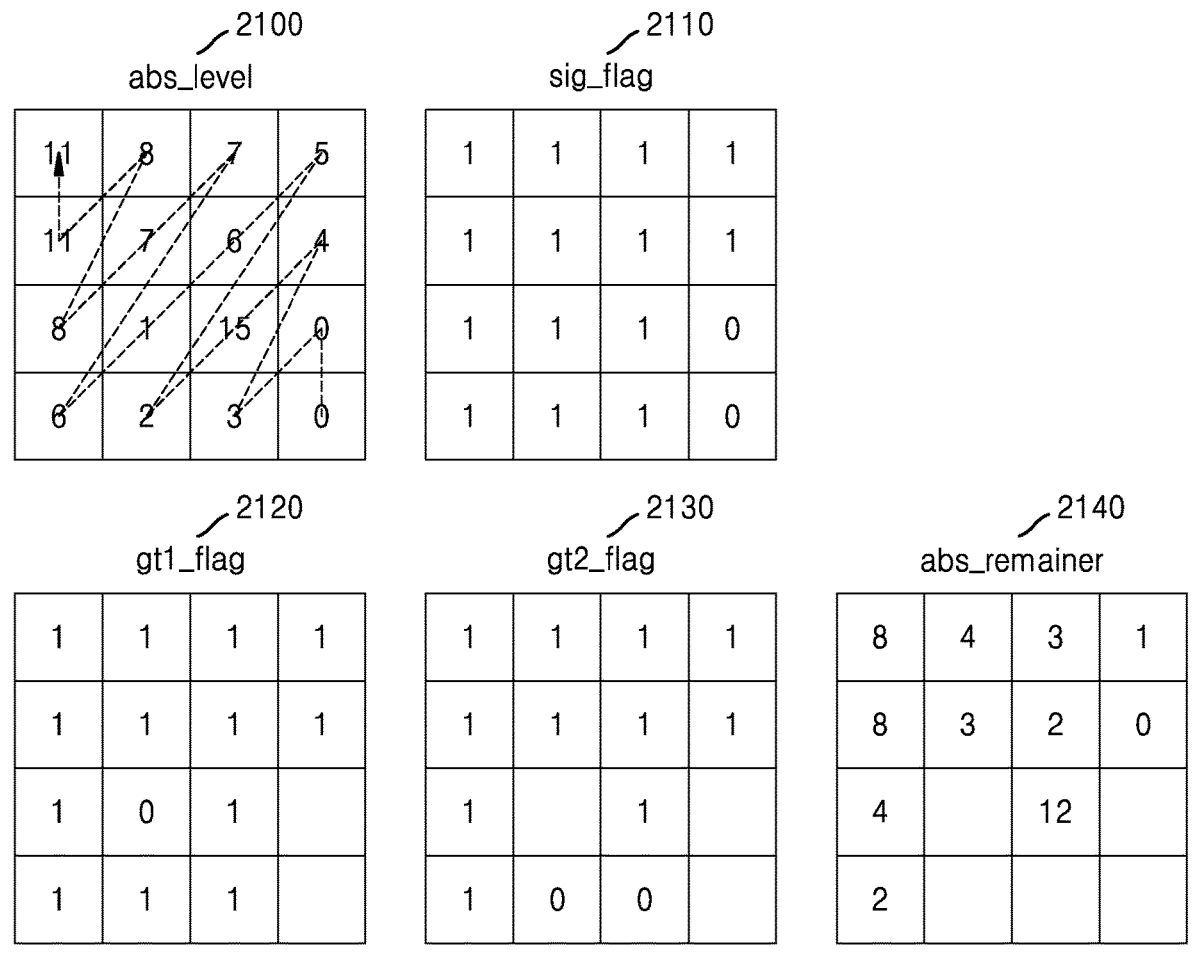

FIG. 21 is a diagram illustrating level information of coefficients included in a transform block according to another embodiment of the disclosure.

Unlike that shown in FIG. 20, in examples shown in FIG. 21, the syntax element par_flag indicating the parity of the absolute value of the coefficient is not used. That is, according to an embodiment of the disclosure, a size of each coefficient included in a coefficient group may be represented using a syntax element sig_flag 2110 indicating whether each coefficient is an effective coefficient other than 0, a syntax element gt1_flag 2120 indicating whether an absolute value of each coefficient is greater than 1, a syntax element gt2_flag 2130 indicating whether the absolute value of each coefficient is greater than 2, a syntax element abs_remainder 2140 indicating a remainder absolute value of each coefficient, and a syntax element abs_level 2100 indicating the absolute value of each coefficient.

The syntax elements sig_flag 2110 and gt1_flag 2120 of FIG. 21 correspond to the syntax elements sig_flag 2010 and gt1_flag 2020 of FIG. 20 and thus, a redundant description thereof is omitted here.

For a coefficient for which the syntax element gt1_flag 2120 has a value of 1 among coefficients included in the coefficient group, a value of the syntax element gt2_flag 2130 may be set when the coefficient has an absolute value greater than 1. That is, the syntax element gt2_flag 2130 for the coefficient having the absolute value of 2 is signaled as 0. For a coefficient for which the syntax element gt1_flag 2120 is 0, the syntax element gt2_flag 2130 is not signaled.

For a coefficient for which the syntax element gt2_flag 2130 has a value of 1 among the coefficients included in the coefficient group, a remainder absolute value of the coefficient may be set as the syntax element abs_remainder 2140. When the syntax element gt2_flag 2130 has a value of 1, a minimum absolute value of the coefficient is 3 and thus a base level may be determined to be 3. Accordingly, the syntax element abs_remainder 2140 may be determined to be a value obtained by subtracting 3 from a level of the coefficient. That is, a value of the syntax element abs_remainder 2140 may be determined by an equation: abs_remainder=abs_level-3. For a coefficient for which the syntax element gt2_flag 2130 is 0, the syntax element abs_remainder 2140 is not signaled.

Through the above-described process, syntax elements representing coefficient levels are determined and encoded by the entropy encoder 7350, and are transmitted in a bitstream. The entropy decoder 6150 may parse the values of the syntax elements from the bitstream and decode the parsed values to reconstruct a coefficient level abs_level according to an equation: abs_level=sig_flag+gt1_flag+gt2_flag+abs_remainder.

In an embodiment of the disclosure, all the absolute values of the coefficient may be signaled as the syntax element abs_level 2100 with respect to a coefficient for which all or some of the above-described syntax elements sig_flag, gt1_flag, gt2_flag, and abs_remainder among the coefficients included in the coefficient group are not signaled.

FIG. 22 illustrates an example of pseudo code for encoding coefficient level information.

The entropy encoder 7350 may perform one or more coding passes for determining and encoding a value of a syntax element for each coefficient included in a coefficient group according to a certain scan order.

Referring to FIG. 22, in a first pass 2210, the entropy encoder 7350 may encode syntax elements sig_flag, gt1_flag, and par_flag for each coefficient included in the coefficient group according to the scan order. The entropy encoder 7350 may determine a syntax element sig_flag of a current coefficient, and determine a syntax element gt1_flag when the syntax element sig_flag is 1 and determine a syntax element par_flag when the syntax element gt1_flag is 1. The determined syntax elements sig_flag, gt1_flag, and par_flag may be CABAC encoded using a preset context model.

In an embodiment of the disclosure, the number of bins to be signaled in the first pass 2210 may be limited. For example, a total number of syntax elements sig_flag, gt1_flag, and par_flag to be signaled with respect to one coefficient group may be limited to a first threshold or less. When the total number of signaled syntax elements sig_flag, gt1_flag, and par_flag reaches the first threshold value, the entropy encoder 7350 may stop performing the first pass 2210 and perform a second pass 2220.

The entropy encoder 7350 may return to the start of the coefficient group in the scan order, and perform the second pass 2220. In the second pass 2220, the entropy encoder 7350 may encode the syntax element gt3_flag for each coefficient included in the coefficient group according to the scan order. When the syntax element gt1_flag is 1, the entropy encoder 7350 may determine the syntax element gt3_flag and CABAC-encode the determined syntax element gt3_flag by using a preset context model.

In an embodiment of the disclosure, the number of bins to be signaled in the second pass 2220 may be limited. For example, the number of syntax elements gt3_flag to be signaled in one coefficient group may be limited to the second threshold or less. When the number of signaled syntax elements gt3_flag reaches the second threshold, the entropy encoder 7350 may stop performing the second pass 2220 and perform a third pass 2230.

The entropy encoder 7350 may return to the first of the coefficient group in the scan order, and perform the third pass 2230. In the third pass 2230, the entropy encoder 7350 may determine a syntax element abs_remainder for a coefficient, for which both the first pass 2210 and the second pass 2220 are performed, according to the scan order. When both the first pass 2210 and the second pass 2220 are performed, a minimum absolute value of the coefficient is 4 and thus a base level may be determined to be 4 in the third pass 2230. Accordingly, the syntax element abs_remainder may be determined, based on a value obtained by subtracting 4 from the absolute value of the coefficient. The determined syntax element abs_remainder may be Golomb-Rice binarized using a Rice parameter determined by a method to be described below.

The entropy encoder 7350 may start a fourth pass 2230, starting from a coefficient immediately after the end of the third pass 2230. In the fourth pass 2240, the entropy encoder 7350 may determine the syntax element abs_remainder for a coefficient, for which only the first pass 2210 is performed and the second pass 2220 is not performed, according to the scan order. When only the first pass 2210 is performed and the second pass 2220 is not performed, a minimum absolute value of the coefficient is 2 and thus a base level may be determined to be 2 in the fourth pass 2240. Accordingly, the syntax element abs_remainder may be determined, based on a value obtained by subtracting 2 from the absolute value of the coefficient. The determined syntax element abs_remainder may be Golomb-Rice binarized using a Rice parameter determined by a method to be described below.

The entropy encoder 7350 may start a fifth pass 2250, starting from a coefficient immediately after the end of the fourth pass 2240. In the fifth pass 2250, the entropy encoder 7350 may determine a syntax element abs_level indicating an absolute value of a coefficient for a coefficient, for which neither the first pass 2210 nor the second pass 2220 is performed, according to the scan order. When neither the first pass 2210 nor the second pass 2220 is performed, a minimum absolute value of the coefficient is 2 and thus a base level may be determined to be 0 in the fifth pass 2250. The determined syntax element abs_level may be Golomb-Rice binarized using a Rice parameter determined by a method to be described below.

In an embodiment of the disclosure, the entropy encoder 7350 may determine whether the number of coefficients to be encoded in the fifth pass 2250 is greater than a certain threshold. That is, the entropy encoder 7350 may determine whether the number of syntax elements abs_level is greater than the threshold. When it is determined that the number of coefficients to be encoded in the fifth pass 2250 is greater than the threshold, the entropy encoder 7350 may further signal a flag indicating whether all coefficients to be encoded in the fifth pass 2250 are greater than a certain value, e.g., 1.

In an embodiment of the disclosure, the entropy encoder 7350 may determine whether a level of a coefficient of the coefficient group, which is lastly encoded before the fifth pass 2250, is greater than a certain threshold. That is, the entropy encoder 7350 may determine whether a size of a lastly context-based encoded coefficient is greater than the threshold. When it is determined that the level of the coefficient of the coefficient group, which is lastly encoded before the fifth pass 2250, is greater than the threshold, the entropy encoder 7350 may further signal a flag indicating whether all the coefficients to be encoded in the fifth pass 2250 are greater a certain value, e.g., 1.

FIG. 23 illustrates another example of pseudo code for encoding coefficient level information. Unlike that shown in FIG. 22, in an example shown in FIG. 23, a syntax element gt3_flag may be encoded in a first pass 2310, together with syntax elements sig_flag, gt1_flag, and par_flag and may not be processed in different passes.

Referring to FIG. 23, in the first pass 2210, the entropy encoder 7350 may encode the syntax elements sig_flag, gt1_flag, and par_flag for each coefficient included in a coefficient group according to a scan order. The entropy encoder 7350 may determine a syntax element sig_flag of a current coefficient, and determine a syntax element gt1_flag when the syntax element sig_flag is 1 and determine syntax elements par_flag and gt3_flag when the syntax element gt1_flag is 1. The determined syntax elements sig_flag, gt1_flag, par_flag, and gt3_flag may be CABAC encoded using a preset context model.

In an embodiment of the disclosure, the number of bins to be signaled in the first pass 2310 may be limited. For example, a total number of syntax elements sig_flag, gt1_flag, par_flag, and gt3_flag to be signaled with respect to one coefficient group may be limited to a third threshold or less. When the total number of signaled syntax elements sig_flag, gt1_flag, par_flag, and gt3_flag reaches the third threshold value, the entropy encoder 7350 may stop performing the first pass 2310 and perform a second pass 2320.

The entropy encoder 7350 may return to the start of the coefficient group in the scan order, and perform the second pass 2220. In the second pass 2320, the entropy encoder 7350 may determine a syntax element abs_remainder, for a coefficient for which the first pass 2310 is performed, according to the scan order. When the first pass 2310 is performed, a minimum absolute value of the coefficient is 4 and thus a base level may be determined to be 4 in the second pass 2320. Accordingly, the syntax element abs_remainder may be determined, based on a value obtained by subtracting 4 from the absolute value of the coefficient. The determined syntax element abs_remainder may be Golomb-Rice binarized using a Rice parameter determined by a method to be described below.

The entropy encoder 7350 may start a third pass 2330, starting from a coefficient immediately after the end of the second pass 2320. In the third pass 2330, the entropy encoder 7350 may determine a syntax element abs_remainder indicating an absolute value of a coefficient with respect to a coefficient, for which the first pass 2310 is not performed, according to the scan order. When the first pass 2310 is not performed, a minimum absolute value of the coefficient is 0 and thus a base level may be determined to be 0 in the third pass 2330. The determined syntax element abs_level may be Golomb-Rice binarized using a Rice parameter determined by a method to be described below.

A method of determining a Rice parameter for Golomb-Rice binarization of the syntax elements abs_remainder and abs_level indicating coefficient levels will be described in detail below.

A Rice parameter may be initialized at the start of each coefficient group. In MPEG-4 (HEVC), etc., the Rice parameter is initialized to zero at the start of each coefficient group. In an embodiment of the disclosure, a Rice parameter of a current coefficient group may be initialized with reference to a coefficient level of a previously encoded or decoded coefficient group. The referenced coefficient level may be a last coefficient level or an average coefficient level of previously encoded or decoded coefficient group.

In an embodiment of the disclosure, the Rice parameter of the current coefficient group may be initialized with reference to a Rice parameter of the previously encoded or decoded coefficient group. In an embodiment of the disclosure, the Rice parameter of the current coefficient group may be initialized by reference to a Rice parameter of a coefficient group neighboring to the current coefficient group. For example, a starting Rice parameter of the current coefficient group may be determined based on a Rice parameter of a coefficient group at a right side of the current coefficient group and a Rice parameter of a coefficient group below the current coefficient group. The Rice parameter of the referenced coefficient group may be a first Rice parameter, a last Rice parameter, or an average Rice parameter of the referenced coefficient group.

In MPEG-4 (HEVC) or the like, a Rice parameter is conditionally updated, based on a current coefficient level and a value of the Rice parameter. Specifically, when a size of a previous coefficient is cLastAbsCoeff and a previous Rice parameter is cLastRiceParam, a Rice parameter cRiceParam to be used for binarization of a current coefficient is determined based on the following algorithm:

If $cLastAbsCoeff > 3*(1 << cLastRiceParam)$ $cRiceParam = Min(cLastRiceParam+1, 4)$ As described in the above algorithm, the binarizer 1910 compares the size cLastAbsCoeff of the previous coefficient with a threshold obtained based on the previous Rice parameter cLastRiceParam, and updates the Rice parameter cRiceParam when a result of the comparison reveals that the size cLastAbsCoeff of the previous coefficient is greater than the threshold. When the Rice parameter cRiceParam is updated, the Rice parameter cRiceParam is gradually increased by +1, compared to the previous Rice parameter cLastRiceParam.

However, when a syntax element to be currently binarized is not an absolute value abs_level of a coefficient but a remainder absolute value abs_remainder of the coefficient, a level relative to a base level rather than all the absolute values of the coefficient is actually Golomb-Rice coded. In this case, optimal coding efficiency may not be achieved when a Rice parameter is set based on all absolute values of a previous coefficient without considering a base level as in the above algorithm. In various embodiments of the disclosure, a Rice parameter is determined based on a base level, thereby providing improved coding performance.

In an embodiment of the disclosure, the base level may be determined based on a syntax element sig_flag, gtX_flag, par_flag, or gtX_flag indicating whether an absolute value of a current coefficient is greater than a certain value. In an embodiment of the disclosure, when a base level is baseLevel, the base level baseLevel may be determined by an equation: baseLevel=sig_flag+gt1_flag+2*gt3_flag when par_flag is signaled. In an embodiment of the disclosure, when par_flag is not signaled, the base level baseLevel may be determined by an equation: baseLevel=sig_flag+gt1_flag+gt2_flag.

In an embodiment of the disclosure, the base level may be determined based on whether syntax elements, for example, the syntax elements sig_flag, gt1_flag, par_flag, and gtX_flag, are signaled. In an embodiment of the disclosure, when all of the syntax elements sig_flag, gt1_flag, par_flag, and gt3_flag are signaled, the base level may be determined to be 4. In an embodiment of the disclosure, when the syntax element gt3_flag is not signaled and only the syntax elements sig_flag, gtX_flag, and par_flag are signaled due to the restriction on the number of syntax elements to be signaled, the base level may be determined to be 2. In an embodiment of the disclosure, when all of the syntax elements sig_flag, gt1_flag, par_flag, and gt3_flag are not signaled due to the restriction on the number of syntax elements to be signaled, the base level may be determined to be 0.

In an embodiment of the disclosure, when all of the syntax elements sig_flag, gt1_flag, and gt2_flag are signaled, the base level may be determined to be 3. In an embodiment of the disclosure, when the syntax element gt2_flag is not signaled and only the syntax elements sig_flag and gt1_flag are signaled due to the restriction on the number of syntax elements to be signaled, the base level may be determined to be 2.

In an embodiment of the disclosure, the base level may be determined according to coefficient level information to be encoded. For example, when the syntax element abs_remainder is encoded, the base level may be determined to be 2, 3, or 4. For example, when the syntax element abs_level is encoded, the base level may be determined to be 0.

According to various embodiments of the disclosure described above, when a base level is considered in determining a Rice parameter, a single Rice parameter determination method may be applied to coefficient level information having different base levels. That is, a Rice parameter may be determined by a common method in various coding passes for encoding different syntax elements abs_remainder and abs_level shown in FIGS. 22 and 23.

In an embodiment of the disclosure, a Rice parameter may be determined based on levels of certain coefficients among coefficients encoded prior to encoding of a current coefficient. This will be described in detail with reference to FIG. 24 below.

FIG. 24 is a diagram for describing a method of determining a Rice parameter according to an embodiment of the disclosure.

According to an embodiment of the disclosure, a Rice parameter may be determined based on levels of one or more coefficients encoded prior to encoding of a current coefficient. For example, when the diagonal scan order is employed and a position of a current coefficient in a transform block is (i, j), a Rice parameter may be determined with reference to levels of n coefficients at positions (i+1, j−1), (i+2, j−2)), (i+3, j−3), . . . , (i+n, j−n).

According to an embodiment of the disclosure, a Rice parameter may be determined based on levels of coefficients encoded prior to a current coefficient and located adjacent to the current coefficient. For example, as illustrated in FIG. 24, when a reverse diagonal scan order starting from a bottom right corner is employed and a position 2410 of a current coefficient in a transform block is (i, j), a Rice parameter may be determined based on levels of coefficients 2420 at positions (i, j+1), (i, j+2), (i+1, j), (i+2, j), and (i+1, j+1).

The entropy encoder 7350 may determine Rice parameters in parallel by referring to neighboring coefficients instead of referring to coefficients encoded immediately before the current coefficient. Referring to neighboring coefficients as shown in FIG. 24, Rice parameters of coefficients 2430 in a diagonal direction may be derived in parallel even when coding of a previous coefficient is not completed. Therefore, values of successive syntax elements may be simultaneously encoded and thus the above-described method of referring to neighboring coefficients may be more suitable for hardware implementation.

In an embodiment of the disclosure, a Rice parameter may be determined with reference to a table set in advance according to statistics of levels of coefficients encoded before the current coefficient. In an embodiment of the disclosure, when the sum of absolute values of certain coefficients is sum, pseudo code for determining the Rice parameter cRiceParam may be expressed as follows:

cRiceParam=goRicePars[min(sum,31)]

In this case, goRicePars[i] represents a Rice parameter corresponding to an index i according to a preset table.

According to an embodiment of the disclosure, a Rice parameter may be determined based on relative levels of the coefficients. That is, the Rice parameter may be determined based on differences between absolute values of the coefficients and a base level of the current coefficient. As described above, actually, a level relative to a base level rather than entire absolute values of coefficients may be Golomb-Rice coded. Accordingly, in this case, coding performance may be improved by determining the Rice parameter in consideration of a relative level of a previously encoded or decoded coefficient. In an embodiment of the disclosure, when a current base level is baseLevel, the number of certain coefficients is n, and the sum of absolute values of the coefficients is sum, pseudo code for determining the Rice parameter cRiceParam may be expressed as follows:

cRiceParam=goRicePars[max(min(sum−n*baseLevel, 31),0]

According to an embodiment of the disclosure, the Rice parameter may be determined based on absolute values of available coefficients among certain coefficients located around a current coefficient. For example, when the current coefficient is close to a boundary of a current transform block, some of coefficients located around the current coefficient may be located outside the current transform block. In this case, only coefficients located within the current transform block may be determined as available coefficients. In an embodiment of the disclosure, when a current base level is baseLevel, the number of available coefficients located around the current coefficient is numValidProb, and the sum of absolute values of the available coefficients is sum, pseudo code for determining the Rice parameter cRiceParam may be expressed as follows:

$$cRiceParam=goRicePars[max(min(sum-numValidProb*baseLevel,31),0]$$

According to an embodiment of the disclosure, the Rice parameter may be determined based on whether par_flag is signaled. When a coefficient level is signaled using par_flag, a value of abs_remainder to be binarized into a Golomb-Rice code may be a value obtained by dividing a level relative to a base level in half. Therefore, coding performance may be improved by determining the Rice parameter in consideration of the above description. In an embodiment of the disclosure, when a current base level is baseLevel, the number of available coefficients located around the current coefficient is numValidProb, and the sum of absolute values of the available coefficients is sum, pseudo code for determining the Rice parameter cRiceParam may be expressed as follows:

$$cRiceParam=goRicePars[max(min((sum-numValidProb*baseLevel)>>shift,31),0]$$

where shift=baseLevel==0?0:1;

According to the pseudo code, when the reference level baseLevel is 0, it means that par_flag is not signaled and thus the differences between absolute values of referenced coefficients and the base level is directly used. In contrast, when the base level is 1, it means that par_flag is signaled and thus a value obtained by dividing the differences between the absolute values of the referenced coefficients and the base level in half through a shifting operation.

Figure 25:
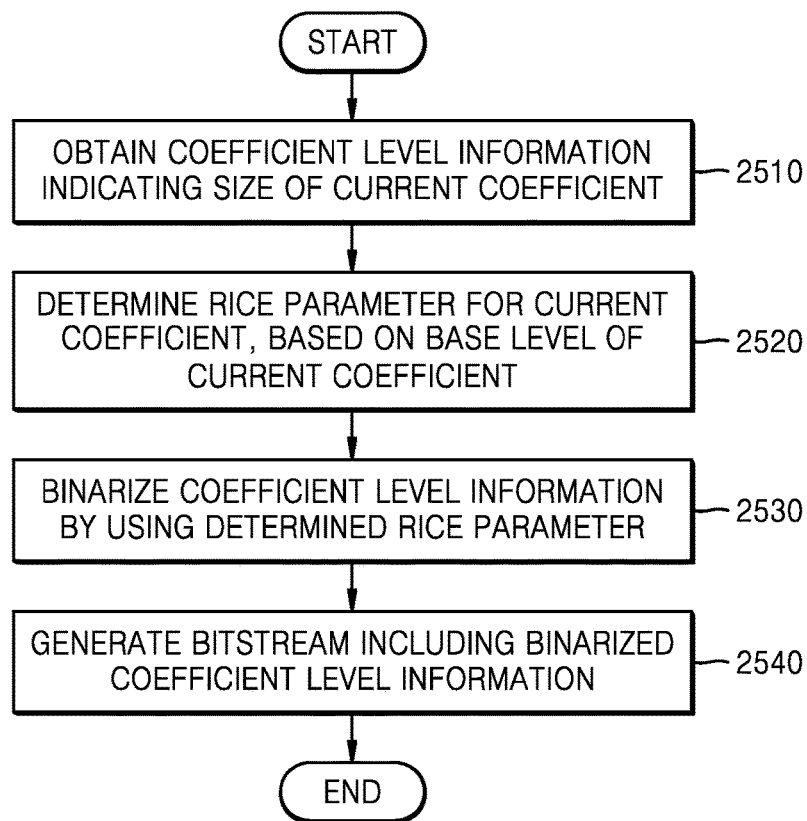
FIG. 25 is a flowchart of a method of entropy-encoding coefficient level information according to an embodiment of the disclosure.

FIG. 25 is a flowchart of a method of entropy-encoding coefficient level information according to an embodiment of the disclosure.

Referring to FIG. 25, in operation 2510, the entropy encoder 7350 may obtain coefficient level information indicating a size of a current coefficient. The coefficient level information may be a syntax element abs_level indicating an absolute value of the current coefficient. Alternatively, the coefficient level information may be a syntax element abs_remainder representing a remainder absolute value of the current coefficient, that is, the difference between the absolute value of the current coefficient and a base level. The coefficient level information may be obtained in units of coefficient groups including the current coefficient.

In operation 2520, the entropy encoder 7350 may determine a Rice parameter for the current coefficient, based on a base level of the current coefficient.

In an embodiment of the disclosure, the base level may be determined based on at least one piece of level map information indicating whether the absolute value of the current coefficient is greater than a certain value. The level map information may include at least one of a syntax element sig_flag indicating whether the absolute value of the current coefficient is greater than 0, a syntax element gt1_flag indicating whether the absolute value of the current coefficient is greater than 1, a syntax element par_flag indicating parity of the absolute value of the current coefficient, or a syntax element gtX_flag indicating whether the absolute value of the current coefficient is greater than a certain number X. In an embodiment of the disclosure, the base level may be determined based on values of the syntax elements determined for the current coefficient. In an embodiment of the disclosure, the base level may be determined based on whether the syntax elements are signaled for the current coefficient. In an embodiment of the disclosure, the base level may be determined according to coefficient level information to be encoded.

In an embodiment of the disclosure, the entropy encoder 7350 may determine the Rice parameter, based on absolute values of certain coefficients among coefficients encoded prior to encoding of the current coefficient. In an embodiment of the disclosure, the coefficients may be determined as coefficients encoded immediately before the current coefficient. In an embodiment of the disclosure, the coefficients may be determined as coefficients located around the current coefficient. In an embodiment of the disclosure, the coefficients may be determined as available coefficients among the coefficients located around the current coefficient.

In an embodiment of the disclosure, the entropy encoder 7350 may determine the Rice parameter with reference to a table set in advance according to statistics of absolute values of the coefficients. In an embodiment of the disclosure, the entropy encoder 7350 may determine the Rice parameter, based on the differences between the absolute values of the coefficients and the base level of the current coefficient.

In operation 2530, the entropy encoder 7350 may binarize the coefficient level information by using the determined Rice parameter. The coefficient level information may be Golomb-Rice binarized using the Rice parameter.

In operation 2540, the entropy encoder 7350 may generate a bitstream including the binarized coefficient level information. In an embodiment of the disclosure, the binarized coefficient level information, for example, the syntax elements abs_remainder and abs_level, may be bypass coded. In an embodiment of the disclosure, the level map information, for example, the syntax elements sig_flag, gt1_flag, par_flag, and gtX_flag, may be regularly coded based on context.

Figure 26:
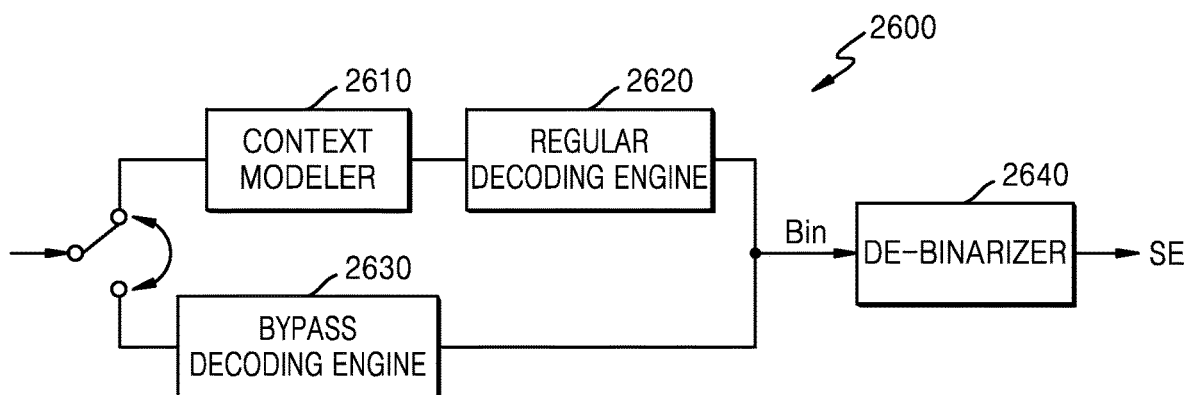
FIG. 26 is a block diagram illustrating a configuration of an entropy decoding apparatus according to an embodiment of the disclosure.

FIG. 26 is a block diagram illustrating a configuration of an entropy decoding apparatus according to an embodiment of the disclosure. An entropy decoding apparatus 6000 of FIG. 26 corresponds to the entropy decoder 6150 of the image decoder 6000 of FIG. 2B.

Referring to FIG. 26, the entropy decoding apparatus 2600 includes a context modeler 2610, a regular decoding engine 2620, a bypass decoding engine 2630, and a debinarizer 2640. The entropy decoding apparatus 2600 performs a reverse process of the entropy encoding process performed by the entropy encoding apparatus 1900 of FIG. 19.

Bins encoded by bypass coding are output to and decoded by the bypass decoding engine 2630, and bins encoded by regular coding are decoded by the regular decoding engine 2620. The regular decoding engine 2620 arithmetically decodes a current bin by using a probability of a binary value determined based on previous bins decoded before the current bin provided by the context modeler 2610.

The context modeler 2610 provides a probability model for bins to the regular decoding engine 2620. Specifically, the context modeler 2610 determines a probability of a certain binary value, based on a decoded previous bin, updates a probability of a binary value used to decode the previous bin, and output the updated probability to the regular decoding engine 2620.

The de-binarizer 2640 reconstructs bin strings, which are reconstructed by the regular decoding engine 2620 or the bypass decoding engine 2630, by mapping the bin strings to syntax elements.

The de-binarizer 2640 according to an embodiment of the disclosure may determine a Rice parameter for Golomb-Rice binarizing syntax elements abs_remainder and abs_level that represent levels, i.e., size information, of a coefficient. Similar to the binarizer 1910 of FIG. 19 described above, the de-binarizer 2640 may determine a Rice parameter for a current coefficient by the methods described above in various embodiments of the disclosure.

A process of parsing and Golomb-Rice binarizing a syntax element, e.g., the syntax element abs_remainder, by the binarizer 1910 when the Rice parameter is determined will be described below. The de-binarizer 2640 may determine the number of bits to be parsed from a bitstream, based on the determined Rice parameter. The de-binarizer 2640 divides a parsed bit string into a prefix bit string corresponding to a bit string obtained by binarizing a value corresponding to Min(cTrMax, abs_remainder) by the truncated unary binarization method and a suffix bit string corresponding to a bit string obtained by binarizing a value corresponding to (abs_remainder−cTrMax) by the $k^{th}$ exponential Golomb binarization method (k is cRiceParam+1). The syntax element abs_remainder is reconstructed by de-binarizing the prefix bit string by a truncated unary de-binarization method and de-binarizing the suffix bit string by a $k^{th}$ exponential Golomb de-binarization method. In an embodiment of the disclosure, the de-binarizer 2640 may parse and de-binarize a bit string, based on a table set in advance according to a Rice parameter cRiceParam (the look-up table method).

The entropy decoding apparatus 2500 arithmetically decodes syntax elements sig_flag, gt1_flag, par_flag, and gtX_flag that indicate levels of coefficients of a transform block and outputs a result of the decoding, in addition to the syntax elements abs_remainder and abs_level. When these syntax elements are reconstructed, data included in the transform block may be decoded through inverse quantization, inverse transformation, and a prediction decoding process, based on the reconstructed syntax elements.

Figure 27:
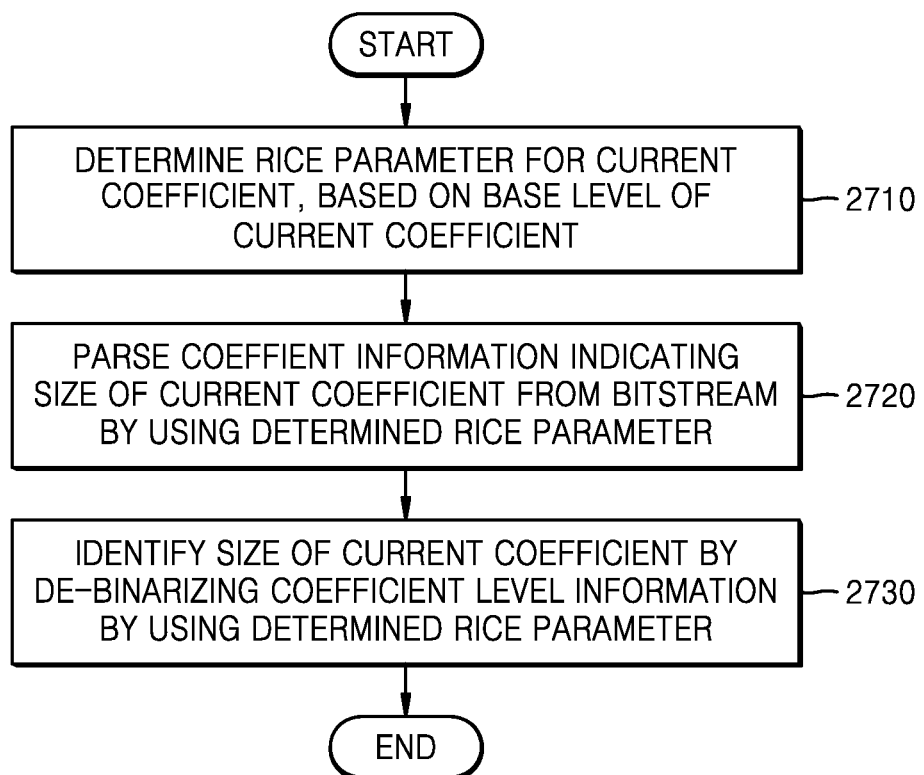
FIG. 27 is a flowchart of a method of entropy decoding coefficient level information according to an embodiment of the disclosure.

FIG. 27 is a flowchart of a method of entropy decoding coefficient level information according to an embodiment of the disclosure.

Referring to FIG. 27, in operation 2710, the entropy decoder 6150 may determine a Rice parameter for a current coefficient, based on a base level of the current coefficient.

In an embodiment of the disclosure, the base level may be determined based on at least one piece of level map information indicating whether an absolute value of the current coefficient is greater than a certain value. The level map information may include at least one of a syntax element sig_flag indicating whether the absolute value of the current coefficient is greater than 0, a syntax element gt1_flag indicating whether the absolute value of the current coefficient is greater than 1, a syntax element par_flag indicating parity of the absolute value of the current coefficient, or a syntax element gtX_flag indicating whether the absolute value of the current coefficient is greater than a certain number X. In an embodiment of the disclosure, the syntax element gtX_flag may be a syntax element gt3_flag indicating whether the absolute value of the current coefficient is greater than 3 when the syntax element par_flag is signaled, and may be a syntax element gt2_flag indicating whether the absolute value of the coefficient is greater than 2 when the syntax element par_flag is not signaled. In an embodiment of the disclosure, the base level may be determined based on values of the syntax elements determined for the current coefficient. In an embodiment of the disclosure, the base level may be determined based on whether the syntax elements are signaled for the current coefficient. In an embodiment of the disclosure, the base level may be determined according to coefficient level information to be encoded.

In an embodiment of the disclosure, the entropy decoder 6150 may determine the Rice parameter, based on absolute values of certain coefficients among coefficients decoded prior to decoding of the current coefficient. In an embodiment of the disclosure, the coefficients may be determined as coefficients decoded immediately before the current coefficient. In an embodiment of the disclosure, the coefficients may be determined as coefficients located around the current coefficient. In an embodiment of the disclosure, the coefficients may be determined as available coefficients among the coefficients located around the current coefficient.

In an embodiment of the disclosure, the entropy decoder 6150 may determine the Rice parameter, based on a table set in advance according to statistics of absolute values of the coefficients decoded prior to the current coefficient. In an embodiment of the disclosure, the entropy decoder 6150 may determine the Rice parameter, based on the differences between the absolute values of the coefficients and the base level of the current coefficient.

In operation 2720, the entropy decoder 6150 may parse coefficient level information indicating a size of the current coefficient from a bitstream by using the determined Rice parameter. The coefficient level information may be a syntax element abs_level indicating an absolute value of the current coefficient. Alternatively, the coefficient level information may be a syntax element abs_remainder representing a remainder absolute value of the current coefficient, that is, the difference between the absolute value of the current coefficient and the base level. The coefficient level information may be obtained in units of coefficient groups including the current coefficient.

In operation 2730, the entropy decoder 6150 may identify the size of the current coefficient by de-binarizing the parsed coefficient level information by using the determined Rice parameter. In an embodiment of the disclosure, the coefficient level information, for example, the syntax elements abs_remainder and abs_level, may be bypass decoded. The coefficient level information may be Golomb-Rice de-binarized using the Rice parameter.

Various embodiments of the disclosure have been described above. It will be understood by those of ordinary skill in the art that the disclosure may be embodied in many different forms without departing from essential features of the disclosure. Therefore, the embodiments of the disclosure set forth herein should be considered in a descriptive sense only and not for purposes of limitation. The scope of the disclosure is set forth in the claims rather than in the foregoing description, and all differences falling within a scope equivalent thereto should be construed as being included in the disclosure.

The above-described embodiments of the disclosure may be written as a computer executable program and implemented by a general-purpose digital computer which operates the program via a computer-readable recording medium. The computer-readable recording medium may include a storage medium such as a magnetic storage medium (e.g., a ROM, a floppy disk, a hard disk, etc.) and an optical recording medium (e.g., a CD-ROM, a DVD, etc.).

The invention claimed is:

1. A method of entropy decoding a coefficient included in video data, the method comprising:

obtaining absolute values of coefficients of predetermined locations from among coefficients entropy decoded prior to a current coefficient;

determining a sum of the absolute values of the coefficients of the predetermined locations;

determining a Rice parameter, based on a difference between the sum of the absolute values and a base level;

parsing, from a bitstream, coefficient level information regarding an absolute value of the current coefficient; and obtaining the absolute value of the current coefficient based on the coefficient level information and the determined Rice parameter, wherein the coefficients of the predetermined locations include at least one of a first coefficient adjacent to a right side of the current coefficient, a second coefficient adjacent to a right side of the first coefficient, a third coefficient adjacent to a lower side of the current coefficient, a fourth coefficient adjacent to a lower side of the third coefficient, or a fifth coefficient adjacent in the lower right diagonal direction of the current coefficient, wherein the base level is determined based on whether the coefficient level information is absolute remainder information or absolute level information.

2. An apparatus for entropy encoding a coefficient included in video data, the apparatus comprising:

at least one processor; and a memory, wherein the memory stores at least one instruction configured to be executable by the at least one processor, wherein the at least one instruction is configured to, when executed, cause the at least one processor to:

obtain coefficient level information regarding an absolute value of a current coefficient;

obtain absolute values of coefficients of predetermined locations from among coefficients entropy encoded prior to the current coefficient;

determining a sum of the absolute values of the coefficients of the predetermined locations;

determine a Rice parameter, based on a difference between the sum of the absolute values and a base level;

binarize the coefficient level information by using the determined Rice parameter; and generate a bitstream including the binarized coefficient level information, wherein the coefficients of the predetermined locations include at least one of a first coefficient adjacent to a right side of the current coefficient, a second coefficient adjacent to a right side of the first coefficient, a third coefficient adjacent to a lower side of the current coefficient, a fourth coefficient adjacent to a lower side of the third coefficient, or a fifth coefficient adjacent in the lower right diagonal direction of the current coefficient, wherein the base level is determined based on whether the coefficient level information is absolute remainder information or absolute level information.

* * * * *